(12) United States Patent
Tsai et al.

(10) Patent No.: US 12,022,715 B2
(45) Date of Patent: *Jun. 25, 2024

(54) DISPLAY DEVICE

(71) Applicant: Innolux Corporation, Miao-Li County (TW)

(72) Inventors: Tsung-Han Tsai, Miao-Li County (TW); Hsiao-Lang Lin, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/301,964

(22) Filed: Apr. 17, 2023

(65) Prior Publication Data

US 2023/0255086 A1    Aug. 10, 2023

Related U.S. Application Data

(63) Continuation of application No. 17/227,407, filed on Apr. 12, 2021, now Pat. No. 11,659,755.

(30) Foreign Application Priority Data

May 6, 2020  (CN) .......................... 202010371932.2

(51) Int. Cl.
*H10K 59/38* (2023.01)
*H01L 25/075* (2006.01)
(Continued)

(52) U.S. Cl.
CPC ......... *H10K 59/38* (2023.02); *H01L 25/0753* (2013.01); *H10K 50/854* (2023.02); *H01L 33/507* (2013.01); *H01L 2933/0091* (2013.01)

(58) Field of Classification Search
CPC ...... H10K 59/38; H10K 59/352; H10K 59/35; H10K 59/50; H10K 50/854; H10K 50/125;
(Continued)

(56) References Cited

U.S. PATENT DOCUMENTS 11,659,755 B2 * 5/2023 Tsai ..................... H01L 25/0753
                                                        257/40

FOREIGN PATENT DOCUMENTS

EP          3792978          3/2021

OTHER PUBLICATIONS

"Office Action of Europe Counterpart Application", issued on Mar. 15, 2024, p. 1-p. 5.

* cited by examiner

*Primary Examiner* — Anne M Hines
*Assistant Examiner* — Jose M Diaz
(74) *Attorney, Agent, or Firm* — JCIPRNET

(57) ABSTRACT

The disclosure provides a display device including red, green and blue pixel units. In the red pixel unit, a light emitting element emits a blue light that then passes through a light conversion element and a color filter and the blue light is converted into a red light while passing through the light conversion element. In the green pixel unit, a light emitting element emits a blue light that then passes through a light conversion element and a color filter and the blue light is converted into a green light while passing through the light conversion element. In the blue pixel, a light emitting element emits a blue light that then passes through a color filter. The red pixel unit has a lighting area greater than a lighting area of the blue pixel unit and less than a lighting area of the green pixel unit.

14 Claims, 32 Drawing Sheets

(51) Int. Cl.
*H01L 33/50* (2010.01)
*H10K 50/854* (2023.01)

(58) Field of Classification Search
CPC ... H01L 25/0753; H01L 33/507; H01L 33/50; H01L 33/504; H01L 2933/0091; H01L 27/156; G09F 9/33; G02B 5/20
See application file for complete search history.

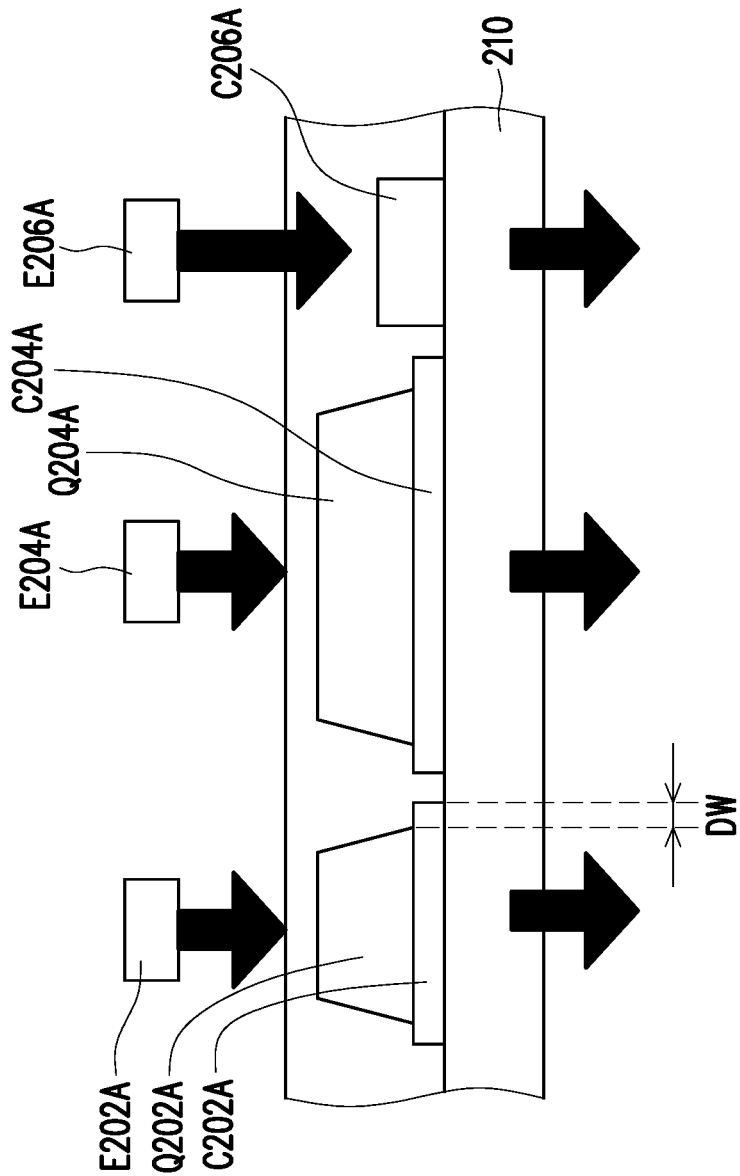

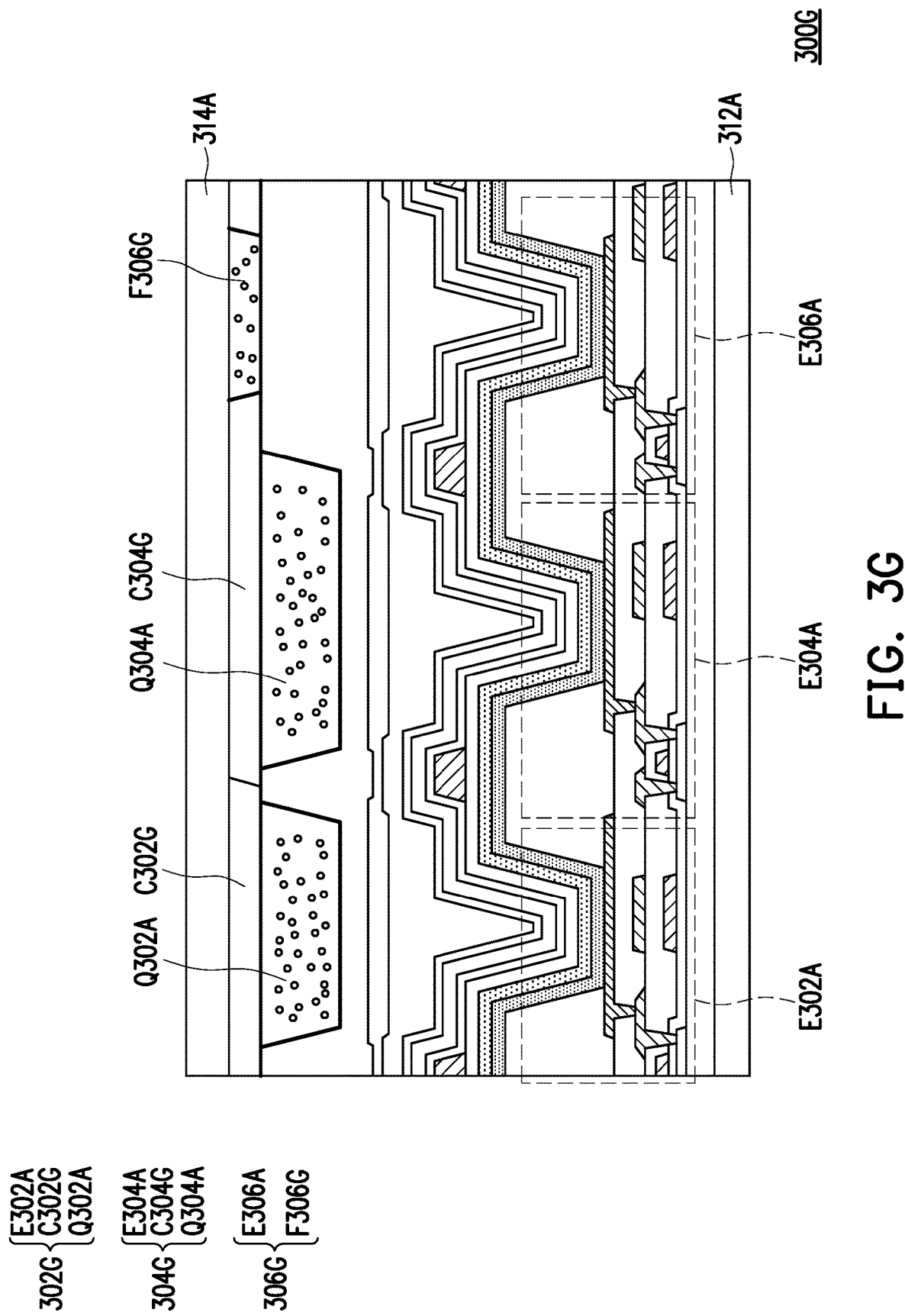

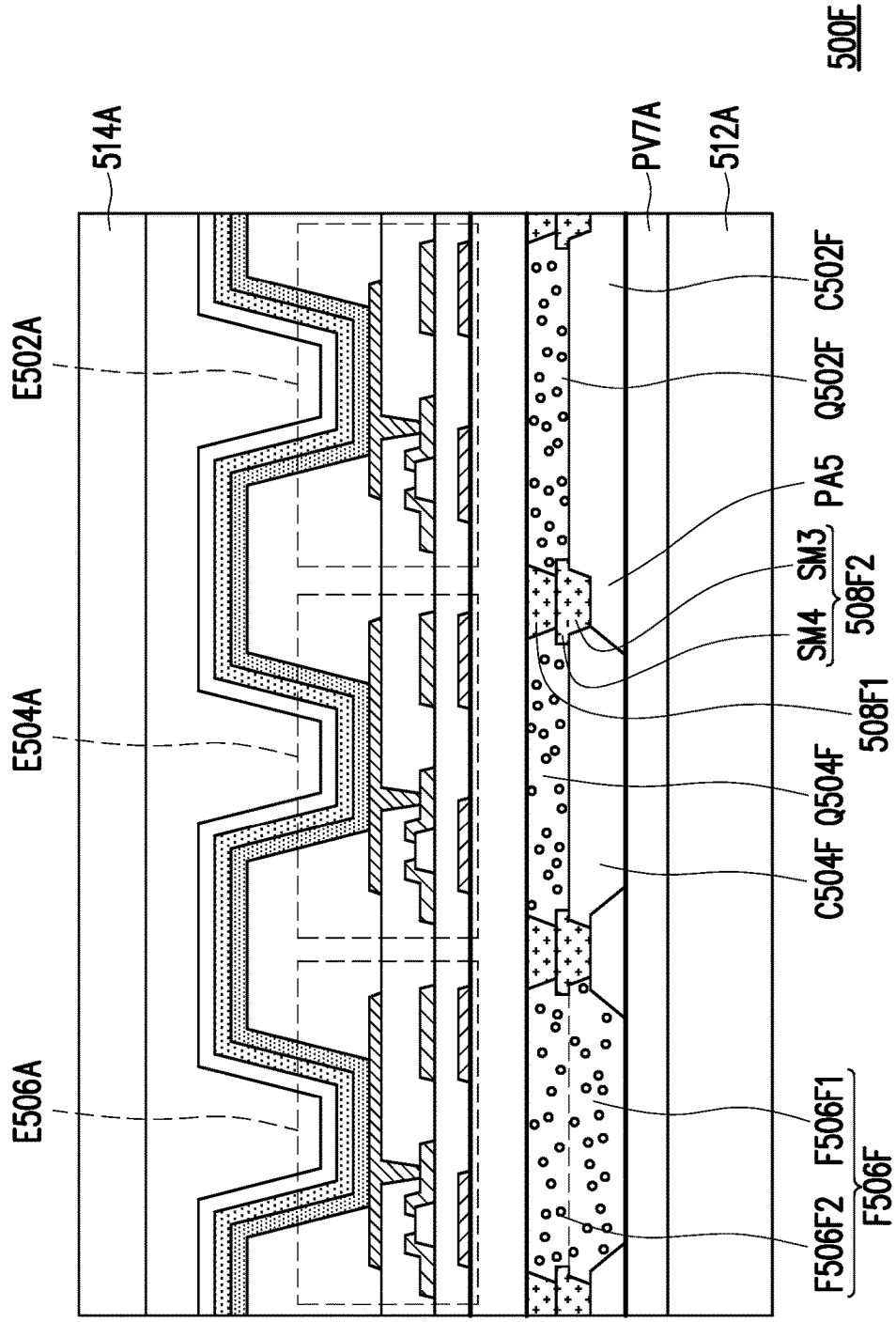

DISPLAY DEVICE

CROSS-REFERENCE TO RELATED APPLICATION

This is a continuation application of and claims the priority benefit of a prior application Ser. No. 17/227,407, filed on Apr. 12, 2021, which claims the priority benefit of China application no. 202010371932.2, filed on May 6, 2020. The entirety of each of the above-mentioned patent applications is hereby incorporated by reference herein and made a part of this specification.

TECHNICAL FIELD

The disclosure relates to a display device.

BACKGROUND

As the application of display devices continues to expand, the development of display technology is also changing with each passing day. With different application conditions, the display devices will also face different problems. Therefore, the research and development of display devices must be continuously updated and adjusted.

SUMMARY

The disclosure provides a display device having a preferable display quality.

According to an embodiment of the disclosure, the display device includes a red pixel unit, a green pixel unit and a blue pixel unit. The red pixel unit includes a light emitting element, a light conversion element and a color filter, wherein the light emitting element emits blue light that then passes through the light conversion element and the color filter and the blue light is converted into a red light while passing through the light conversion element. The green pixel unit includes a light emitting element, a light conversion element and a color filter, wherein the light emitting element emits a blue light that then passes through the light conversion element and the color filter and the blue light is converted into a green light while passing through the light conversion element. The blue pixel unit which includes a light emitting element and a color filter, wherein the light emitting element emits a blue light that then passes through the color filter. The red pixel unit has a lighting area greater than a lighting area of the blue pixel unit and less than a lighting area of the green pixel unit.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of the specification. The drawings illustrate embodiments of the disclosure and, together with the description, serve to explain the principles of the disclosure.

FIG. 2C is a partial cross-sectional view of a display device according to an embodiment.

FIG. 3A to FIG. 3G are partial cross-sectional views of a display device according to an embodiment of the disclosure.

FIG. 5A to FIG. 5J are cross-sectional views of a display device according to an embodiment of the disclosure.

DETAILED DESCRIPTION

Figure 1A:
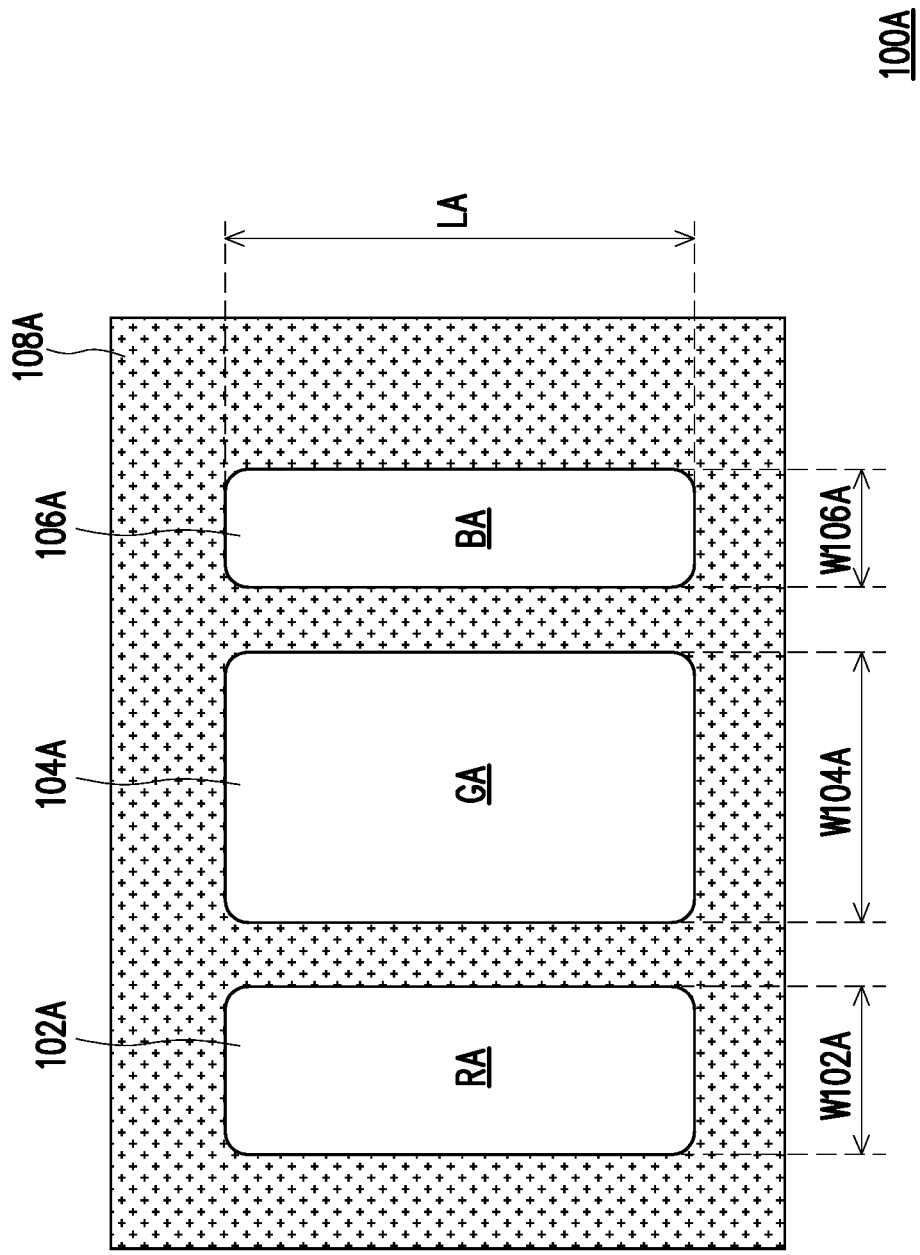
FIG. 1A is a partial view of a display device in lit state according to an embodiment of the disclosure.

The disclosure may be understood with reference to the following detailed description and the accompanying drawings. It should be noted that, for ease of understanding by readers and concise drawings, a plurality of drawings in the disclosure merely show a part of an electronic device, and specific elements in the drawings are not drawn to scale. In addition, the quantity and size of the elements in the drawings are merely exemplary, and are not intended to limit the scope of the disclosure.

Some words are used to refer to specific elements in the whole specification and the appended claims in the disclosure. A person skilled in the art should understand that an electronic device manufacturer may use different names to refer to the same elements. The specification is not intended to distinguish elements that have the same functions but different names. In the specification and the claims, words such as "include", "comprise", and "have" are open words, and should be interpreted as "including, but not limited to". Therefore, when terms "include", "comprise", and/or "have" are used in the description of the disclosure, the presence of corresponding features, regions, steps, operations and/or components is specified without excluding the presence of one or more other features, regions, steps, operations and/or components.

The directional terms mentioned herein, like "above", "below", "front", "back", "left", and "right", refer to the directions in the accompanying drawings. Therefore, the directional terms are used for illustration instead of limiting the disclosure. In the accompanying drawings, common features of a method, a structure and/or a material used in a specific embodiment are shown in the drawings. However, these drawings should not be construed as defining or limiting the scope or nature of these embodiments. For example, the relative sizes, thicknesses and positions of films, regions and/or structures may be reduced or enlarged for clarity.

When a corresponding component (e.g., a film or a region) is referred to as being "disposed or formed on another component", it may be directly on the another component, or there may be other components between the two components. In another aspect, when a component is referred to as being "directly disposed or formed on another component", there is no component between the two components. In addition, when a component is referred to as being "disposed or formed on another component", the two components have an up and down relationship in a top view. The component may be located above or below the another component, and the up and down relationship depends on the orientation of the device.

It should be understood that, when a component or a film is referred to as being "connected to" another component or film, it may be directly connected to the another component or film, or there are components or films inserted between the two components or films. When a component or a film is referred to as being "directly connected to" another component or film, there is no component or film inserted between the two components or films. In addition, when a component is referred to as being "coupled to another component (or a variant thereof)", it may be directly connected to the another component, or may be indirectly connected to (e.g., electrically connected to) the another component through one or more components.

The terms "approximately", "equal to", "identical to" or "the same as", or "substantially" or "generally" are generally interpreted as within 20% of the given value or range, or interpreted as within 10%, 5%, 3%, 2%, 1%, or 0.5% of the given value or range.

Ordinal numbers used in the specification and the claims, like "first" and "second", are used to modify the elements, and do not imply or represent that the (or these) element(s) has (or have) any ordinal number, and do not indicate any order between an element and another element, or an order in a manufacturing method. These ordinal numbers are merely used to clearly distinguish an element having a name with another element having the same name. Different terms may be used in the claims and the specification, so that a first component in the specification may be a second component in the claims.

It should be noted that in the following embodiments, features in a plurality of embodiments may be replaced, recombined, or mixed to complete other embodiments without departing from the spirit of the disclosure. The features of the embodiments may be used in any combination without departing from the spirit of the disclosure or conflicting with each other.

FIG. 1A is a partial view of a display device in lit state according to an embodiment of the disclosure. In FIG. 1A, a display device 100A includes a red pixel unit 102A, a green pixel unit 104A and a blue pixel unit 106A. When the display device 100A is lit, lit screens presented by the red pixel unit 102A, the green pixel unit 104A and the blue pixel unit 106A may be observed under an optical microscope. The outline of each lit screen observed under the microscope may define a lighting area RA of the red pixel unit 102A, a lighting area GA of the green pixel unit 104A and a lighting area BA of the blue pixel unit 106A. For example, an observer may take a photo of the lit screens of the display device 100A under microscope observation, and determine the outline of the lighting area for each color in the taken photo to define the lighting areas. In some embodiments, the lighting area RA, the lighting area GA, and the lighting area BA are different from each other. In addition, the display device 100A may be provided with a black matrix 108A to space apart the red pixel unit 102A, the green pixel unit 104A and the blue pixel unit 106A from each other, but not limited thereto. In some embodiments, the black matrix 108A may be omitted. In some embodiments, the lighting area RA, the lighting area GA and the lighting area BA may be different from actual lighting areas of the red pixel unit 102A, the green pixel unit 104A and the blue pixel unit 106A. For example, the lighting area RA may be greater than or less than an area of a region of the red pixel unit 102A not covered by the black matrix 108A; the lighting area GA may be greater than or less than an area of a region of the green pixel unit 104A not covered by the black matrix 108A; and/or the lighting area BA may be greater than or less than an area of a region of the blue pixel unit 106A not covered by the black matrix 108A. Nonetheless, in some other embodiments, the lighting area RA may be equal to the area of the region of the red pixel unit 102A not covered by the black matrix 108A; the lighting area GA may be equal to the area of the region of the green pixel unit 104A not covered by the black matrix 108A; and/or the lighting area BA may be equal to the area of the region of the blue pixel unit 106A not covered by the black matrix 108A.

In an embodiment, each of the lighting area RA of the red pixel unit 102A, the lighting area GA of the green pixel unit 104A and the lighting area BA of the blue pixel unit 106A may substantially present a rectangular outline when viewed under the optical microscope. The rectangular outline formed by each of the lighting area RA, the lighting area GA and the lighting area BA has, for example, approximately the same length LA. In addition, a width W102A of the rectangular outline formed by the lighting area RA may be greater than a width W106A of the rectangular outline formed by the lighting area BA and less than a width W104A of the rectangular outline formed by the lighting area GA. Accordingly, the red pixel unit 102A has the lighting area RA greater than the lighting area BA of the blue pixel unit 106A and less than the lighting area GA of the green pixel unit 104A, but not limited thereto. For brevity of description, in the following part of the description, the element symbols RA GA, and BA will be used to represent the lighting areas of the pixel units of different colors instead repeatedly describing them as the lighting area of the red pixel unit and the blue light emitting unit and the lighting area of the green pixel unit. That is to say, the lighting area RA is the lighting area of the red pixel unit; the lighting area GA is the lighting area of the green pixel unit; and the lighting area BA is the lighting area of the blue pixel unit.

In some embodiments, a ratio of the lighting area GA of the green pixel unit 104A to the lighting area RA of the red pixel unit 102A is, for example, ranged from 1.02 to 2.90 or ranged from 1.37 to 2.07. In some embodiments, a ratio of the lighting area GA of the green pixel unit 104A to the lighting area BA of the blue pixel unit 106A is, for example, ranged from 1.68 to 3.29 or ranged from 1.71 to 2.35. In some embodiments, a ratio of the lighting area RA of the red pixel unit 102A to the lighting area BA of the blue pixel unit 106A is, for example, ranged from 1.02 to 1.84 or ranged from 1.03 to 1.37.

Figure 1B:
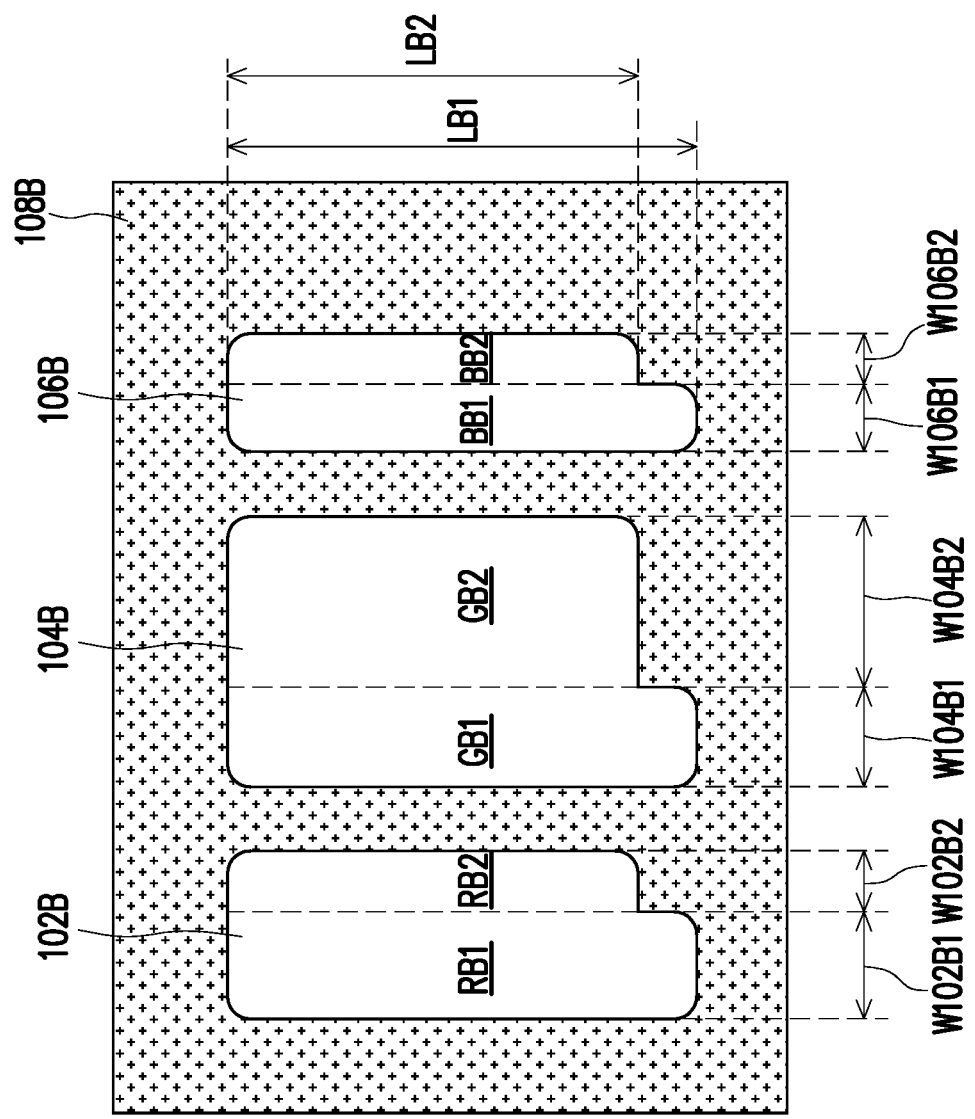
FIG. 1B is a partial view of a display device in lit state according to an embodiment of the disclosure.

FIG. 1B is a partial view of a display device in lit state according to an embodiment of the disclosure. In FIG. 1B, a display device 100B is similar to the display device 100A, and the difference between the two embodiments of FIG. 1A and FIG. 1B is mainly the outlines of the lighting areas when the pixel units are lit. In FIG. 1B, the display device 100B includes a red pixel unit 102B, a green pixel unit 104B, a blue pixel unit 106B and a black matrix 108B. Here, the black matrix 108B spaces apart the red pixel unit 102B, the green pixel unit 104B and the blue pixel unit 106B from each other. However, in some embodiments, the black matrix 108B may be omitted. When the display device 100B is lit, a lighting area RB of the red pixel unit 102B, a lighting area GB of the green pixel unit 104B and a lighting area BB of the blue pixel unit 106B may be observed under the optical microscope. In some embodiments, the lighting area RB, the lighting area GB and the lighting area BB are different from each other.

A ratio of the lighting area GB of the green pixel unit 104B to the lighting area RB of the red pixel unit 102B is, for example, ranged from 1.02 to 2.90 or ranged from 1.37 to 2.07. In some embodiments, a ratio of the lighting area GB of the green pixel unit 104B to the lighting area BB of the blue pixel unit 106B is, for example, ranged from 1.68 to 3.29 or ranged from 1.71 to 2.35. In some embodiments, a ratio of the lighting area RB of the red pixel unit 102B to the lighting area BB of the blue pixel unit 106B is, for example, ranged from 1.02 to 1.84 or ranged from 1.03 to 1.37.

In this embodiment, each of the outlines of the lighting area RB, the lighting area GB and the lighting area BB observed under the optical microscope forms an irregular geometric shape, such as a P-like shape. In order to explain a measurement example of the lighting areas, each of the outlines of the lighting area RB, the lighting area GB and the lighting area GB is substantially divided into a plurality of sub portions of approximately rectangular outlines. For instance, the outline formed by the lighting area RB is divided into a sub portion RB1 and a sub portion RB2; the outline formed by the lighting area GB is divided into a sub portion GB1 and a sub portion GB2; and the outline formed by the lighting area BB is divided into a sub portion BB1 and a sub portion BB2. The sub portion RB1, the sub portion GB1 and the sub portion BB1 have the same length LB1; the sub portion RB2, the sub portion GB2 and the sub portion BB2 have the same length LB2, but not limited thereto. The length LB1 of the sub portion RB1 is longer than the length LB2 of the sub portion RB2 to form the P-like shape. The length LB1 of the sub portion GB1 is longer than the length LB2 of the sub portion GB2 to form the P-like shape. The length LB1 of the sub portion BB1 is longer than the length LB2 of the sub portion BB2 to form the P-like shape. In addition, the sub portion RB1 has a width W102B1, and the sub portion RB2 has a width W102B2. The width W102B1 may be greater than the width W102B2, but not limited thereto. The sub portion GB1 has a width W104B1, and the sub portion GB2 has a width W104B2. The width W104B2 may be greater than the width W104B1, but not limited thereto. The sub portion BB1 has a width W106B1, and the sub portion BB2 has a width W106B2. The width W106B1 may be greater than the width W106B2, but not limited thereto. The relationship between the lengths and widths describe above is simply an exemplary embodiment illustrating the outlines of the lighting areas, but the disclosure is not limited thereto.

Figure 1C:
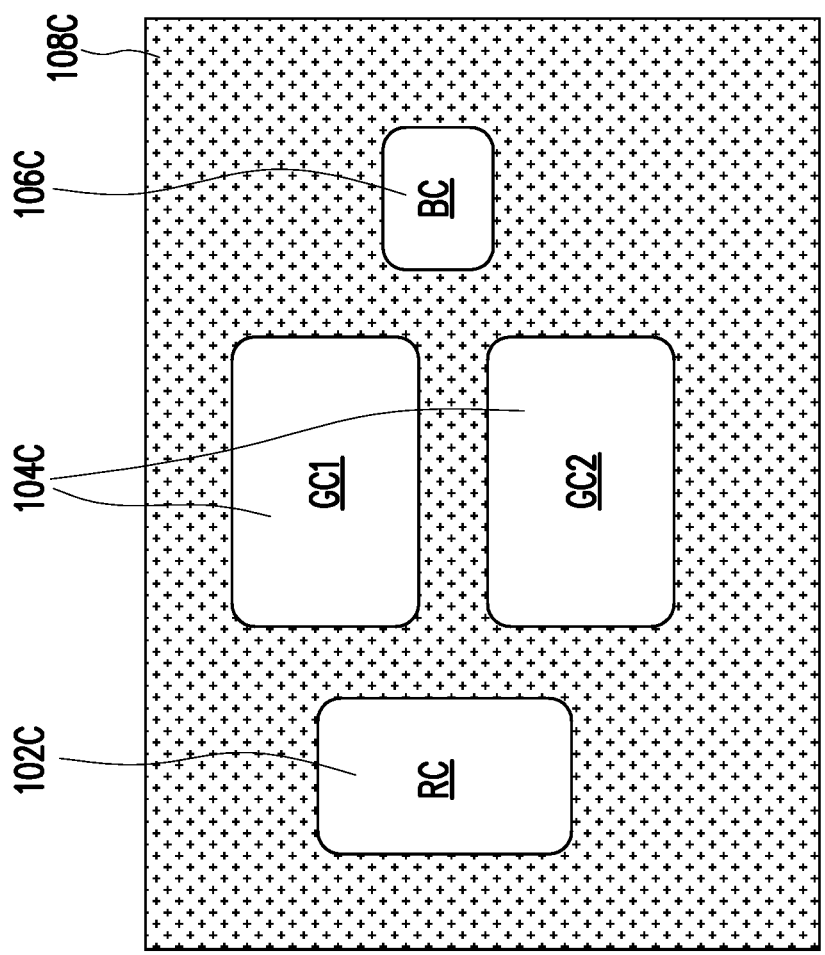
FIG. 1C is a partial view of a display device in lit state according to an embodiment of the disclosure.

FIG. 1C is a partial view of a display device in lit state according to an embodiment of the disclosure. In FIG. 1C, a display device 100C is similar to the display device 100A, and the difference between the two embodiments of FIG. 1A and FIG. 1C is mainly the outlines of the lighting areas when the pixel units are lit. In FIG. 1C, the display device 100C includes a red pixel unit 102C, a green pixel unit 104C, a blue pixel unit 106C and a black matrix 108C. Here, the red pixel unit 102C, the green pixel unit 104C and the blue pixel unit 106C are spaced apart from each other by the black matrix 108C. However, in some embodiments, the black matrix 108C may be omitted.

When the display device 100C is lit, it may be observed under the microscope that, the red pixel unit 102C includes a lighting area RC; the green pixel unit 104C includes a lighting area GC; and the blue pixel unit 106C includes a lighting area BC. As can be seen from FIG. 1C, the lighting area GC of the green pixel unit 104C may be divided into a sub lighting area GC1 and a sub lighting area GC2. In an embodiment, a size of the lighting area GC of the green pixel unit 104C may be a sum of the sub lighting area GC1 and the sub lighting area GC2. In some embodiments, the lighting area RC of the red pixel unit 102C may be less than the lighting area GC of the green pixel unit 104C. In addition, the lighting area RC of the red pixel unit 102C may be greater than the lighting area BC of the blue pixel unit 106C. In some embodiments, the ratios of the lighting area RC, the lighting area GC and the lighting area BC may refer to the description of the foregoing embodiments. For example, the ratio of the lighting area GB to the lighting area RB (the lighting area GB/the lighting area RB) may be, for example, ranged from 1.02 to 2.90 or ranged from 1.37 to 2.07. The ratio of the lighting area GB to the lighting area BB (the lighting area GB/the lighting area BB) may be, for example, ranged from 1.68 to 3.29 or ranged from 1.71 to 2.35. The ratio of the lighting area RB to the lighting area BB (the lighting area RB/the lighting area BB) may be, for example, ranged from 1.02 to 1.84 or ranged from 1.03 to 1.37, but not limited thereto.

Figure 2A:
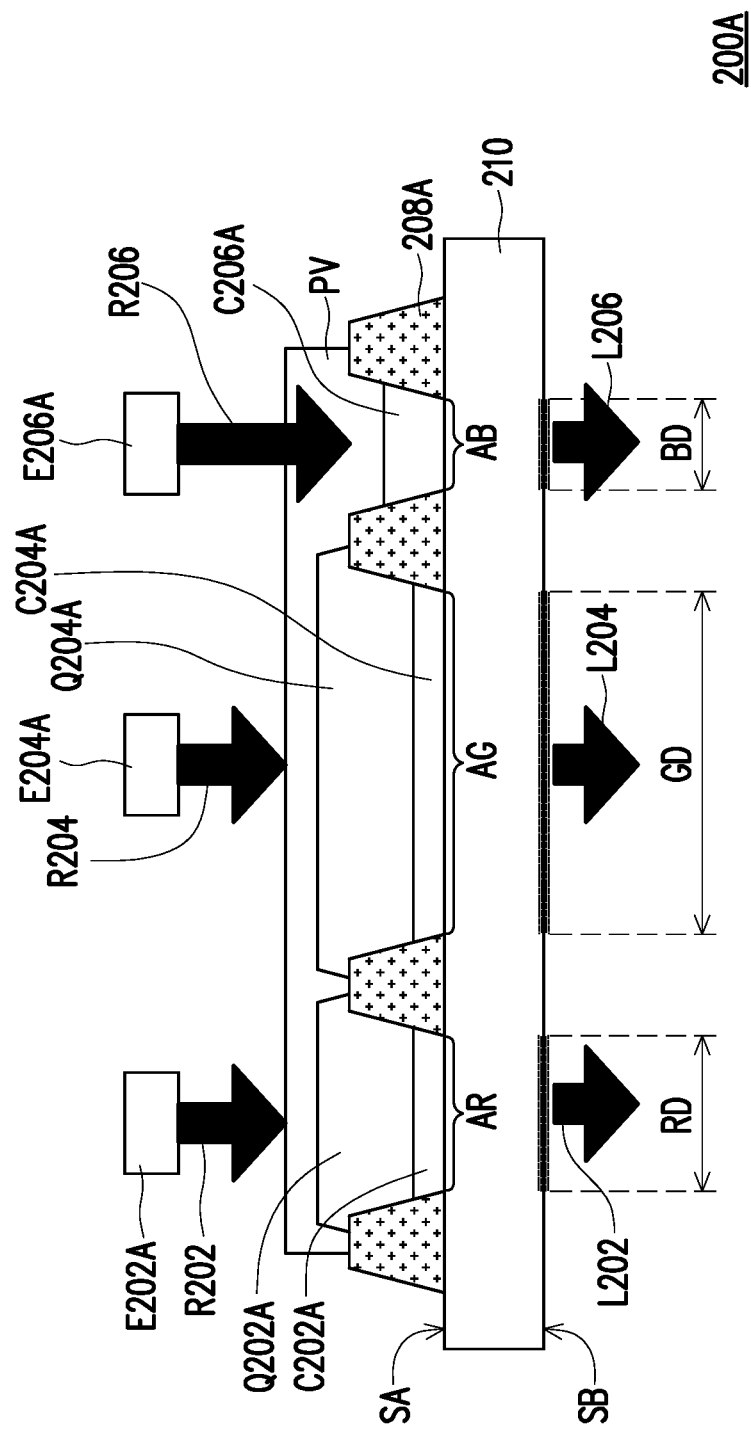
FIG. 2A is a partial cross-sectional view of a display device according to an embodiment.

FIG. 2A is a partial cross-sectional view of a display device according to an embodiment of the disclosure. A cross-sectional structure of FIG. 2A schematically shows some components of a display device. A display device 200A may include, for example, a red pixel unit 202A, a green pixel unit 204A, a blue pixel unit 206A, a black matrix 208A and a substrate 210. Further, the red pixel unit 202A, the green pixel unit 204A, the blue pixel unit 206A and the black matrix 208A are all disposed on a first side SA of the substrate 210.

The red pixel unit 202A of the display device 200A includes, for example, a light emitting element E202A, a light conversion element Q202A and a color filter C202A. The light emitting element E202A emits a light R202. After being emitted from the light emitting element E202A, the light R202 then passes through the light conversion element Q202A and the color filter C202A, and the light R202 is converted into a red light while passing through the light conversion element Q202A. In some embodiments, the light passed through the light conversion element Q202A may contain the blue light not converted by the light conversion element Q202A. In this case, the color filter C202A may filter or suppress the blue light not converted by the light conversion element Q202A. Therefore, a pixel light L202 emitted by the red pixel unit 202A is the red light or a red light containing a small amount of the blue light. That is to say, the pixel light L202 is a pure red light or a red light with a small amount of leaking blue light. The pure red light may be exemplified as conforming to the red in the color standard established by the International Telecommunication Union BT.2020 (ITU-R Recommendation BT.2020).

The green pixel unit 204A of the display device 200A includes, for example, a light emitting element E204A, a light conversion element Q204A and a color filter C204A. The light emitting element E204A emits a light R204. After being emitted from the light emitting element E204A, the light R204 then passes through the light conversion element Q204A and the color filter C204A, and the light R204 is converted into a green light while passing through the light conversion element Q204A. In some embodiments, the light passed through the light conversion element Q204A may contain the blue light not converted by the light conversion element Q204A. In this case, the color filter C204A may filter or suppress the blue light not converted by the light conversion element Q204A. Therefore, a pixel light L204 emitted by the green pixel unit 204A is the green light or a green light containing a small amount of blue light. That is to say, the pixel light L204 is a pure green light or a green light with a small amount of leaking blue light. The pure green light may be exemplified as conforming to the green in the color standard established by the International Telecommunication Union BT.2020 (ITU-R Recommendation BT.2020).

The blue pixel unit 206A includes a light emitting element E206A and a color filter C206A. The light emitting element E206A emits a light R206, and after being emitted from the light emitting element E206A, the light R206 then passes through the color filter C206A. In some embodiments, the color filter C206A may be a transparent filling element, or may be a filling element with scattering particles, but not limited thereto. Furthermore, the color filter C206A may be adjusted according to optical requirements and may completely fill, partially or partially fill an opening AB defined by the black matrix 208A. For example, in the opening AB of FIG. 2A, the color filter C206A does not fill the entire opening AB. In some embodiments, the light R206 passed through the color filter C206A may also be filtered or absorbed by the color filter C206A. In this way, a pixel light L206 emitted by the blue pixel unit 206A is a blue light.

The light emitting element E202A, the light emitting element E204A and the light emitting element E206A may be elements such as organic light emitting elements, micro light emitting elements or the like, but not limited thereto. The light conversion element Q202A of the red pixel unit 202A and the light conversion element Q204A of the green pixel unit 204A may convert, for example, short-wavelength light into long-wavelength light to achieve light conversion. The light conversion element Q202A and the light conversion element Q204A may comprise a matrix material and a light conversion material dispersed in the matrix material. Among them, the matrix material comprises an organic transparent material; the light conversion material includes a fluorescent material, a phosphorescent material, a quantum dot material, other suitable material or a combination of the foregoing materials, but not limited thereto. When the materials of the light conversion element Q202A and the light conversion element Q204A are the quantum dot material, the light conversion element Q202A and the light conversion element Q204A may emit a red light, a green light, a blue light or other color light based on the selection of the quantum dot material (e.g., an adjustment of particle size). For example, the quantum dot material may be used to convert short-wavelength light such as a blue light or an ultraviolet light into longer-wavelength light such as a red light, a yellow light and a green light. In some embodiments, the light R202 and the light R204 emitted by the light emitting element E202A and the light emitting element E204A may be the blue light or the ultraviolet light, and the light R206 emitted by the light emitting element E206A is, for example, the blue light.

The color filter C202A of the red pixel unit 202A is, for example, a red filter, and its material comprises a photoresist material or an ink material. The color filter C204A of the green pixel unit 204A is, for example, a green filter, and its material comprises a photoresist material or an ink material. The color filter C206A of the blue pixel unit 206A is, for example, a blue filter, and its material comprises a photoresist material or an ink material or a filling element with scattering particles, but not limited thereto. In some embodiments, the color filter C206A may comprise a transparent material, which allows the light R206 of the light emitting element E206A to pass through without providing color filtering. In an alternative embodiment, the color filter C206A may be doped with scattering particles to diverge the light R206 from the light emitting element E206A. In addition, the light conversion element Q202A and the light conversion element Q204A may also be doped with scattering particles. In some embodiments, a material of scattering particles may comprise $TiO_2$ or contain titanium (Ti), zirconium (Zr), aluminum (Al), indium (In), zinc (Zn), tin (Sn), antimony (Sb), silicon (Si), gold (Au), silver (Ag), copper (Cu), platinum (Pt), iron (Fe), cobalt (Co), nickel (Ni) and manganese (Mn).

In FIG. 2A, the light emitting element E202A, the light emitting element E204A and the light emitting element E206A are schematically represented by rectangular patterns. However, specific structures of the light emitting element E202A, the light emitting element E204A and the light emitting element E206A may vary according to different implementations. In addition, in order to present the lights R202, R204 and R206, FIG. 2A simply schematically shows arrangement positions of the light emitting element E202A, the light emitting element E204A and the light emitting element E206A relative to other components without directly showing their actual arrangements. In FIG. 2A, the black matrix 208A disposed on the first side SA of the substrate 210 forms openings AR, AG and AB. The color filter C202A and the light conversion element Q202A of the red pixel unit 202A are disposed in the opening AR, and the color filter C202A is disposed between the light conversion element Q202A and the substrate 210. In addition, the color filter C202A and the light conversion element Q202A of the red pixel unit 202A are both disposed between the light emitting element E202A and the substrate 210. The color filter C204A and the light conversion element Q204A of the green pixel unit 204A are disposed in the opening AG, and the color filter C204A is disposed between the light conversion element Q204A and the substrate 210. In addition, the color filter C204A and the light conversion element Q204A of the green pixel unit 204A are both disposed between the light emitting element E204A and the substrate 210. The color filter C206A of the blue pixel unit 206A is disposed in the opening AB, and the color filter C206A of the blue pixel unit 206A is disposed between the light emitting element E206A and the substrate 210. In addition, the display device 200A may include a passivation layer PV that covers the light conversion element Q202A, the light conversion element Q204A and the light conversion element C206A In some embodiments, the color filter C202A and the light conversion element Q202A are stacked together and an overall thickness of the two may be greater than a thickness of the black matrix 208A; and/or the color filter C204A and the light conversion element Q204A are stacked together and an overall thickness of the two may be greater than the thickness of the black matrix 208A, but not limited thereto. In some other embodiments, the overall thickness the color filter C202A and the light conversion element Q202A may be less than the thickness of the black matrix 208A; and/or the overall thickness the color filter C204A and the light conversion element Q204A may be less than the thickness of the black matrix 208A. In some embodiments, the thickness of the black matrix 208A may be determined based on the fabrication method of the black matrix 208A. The fabrication method of the black matrix 208A may include a photolithography process, an ink-ject printing process, a method combined the photolithography process and the ink-ject printing process, or other alternative methods.

In an embodiment, a lighting area RD of the red pixel unit 202A, a lighting area GD of the green pixel unit 204A and a lighting area BD of the blue pixel unit 206A may be understood as sizes of lighting regions observed from a second side SB of the substrate 210 when the red pixel unit 202A, the green pixel unit 204A and the blue pixel unit 206A are lit. As can be seen from FIG. 2A, the black matrix 208A surrounds the red pixel unit 202A; the green pixel unit 204A and the blue pixel unit 206A; and the black matrix 208A has the function of covering light, preventing from a light leakage, preventing from mixing of different colored light generated by different ones of the red, green, and blue pixel units, or a combination thereof. Accordingly, in other embodiments, the lighting area RD of the red pixel unit 202A, the lighting area GD of the green pixel unit 204A and the lighting area BD of the blue pixel unit 206A may also be respectively understood as a size of the opening AR of the black matrix 208A corresponding to the red pixel unit 202A on the first side SA of the substrate 210, a size of the opening AG of the black matrix 208A corresponding to the green pixel unit 204A on the first side SA of the substrate 210 and a size of the opening AB of the black matrix 208A corresponding to the blue pixel unit 206A on the first side SA of the substrate 210. The above two definitions of the lighting areas are included in the scope of the disclosure.

With different applications, a display effect of the display device 200A may be specified. In some embodiments, with a white point displayed by the display device 200A in the CIE1931 colorimeter system as an example, the X coordinate may be specified as 0.273±0.020 and the Y coordinate may be specified as 0.275±0.020. In some applications, a peak wavelength of red light may be set to 630±20 nanometers (nm); a peak wavelength of green light may be set to 532±20 nanometers (nm); and a peak wavelength of blue light may be set to 450±20 nanometers (nm), but not limited thereto. In addition, to achieve the white point with the X coordinate as 0.273±0.020 and the Y coordinate as 0.275±0.020 in the CIE1931 colorimeter system, a target radiation weight percentage (light intensity ratio) of the red light (e.g., the pixel light L202) is set to 20%, for example; a target radiation weight percentage of the green light (e.g., the pixel light L204) is set to 29%, for example; and a target radiation weight percentage of the blue light (e.g., the pixel light L206) is set to 51%, for example.

In this embodiment, the pixel light L202, the pixel light L204 and the pixel light L206 are originated from the light R202 of the light emitting element E202A, the light R204 of the light emitting element E204A and the light R206 of the light emitting element E206A, respectively. However, because the light emitting element E202A, the light emitting element E204A and the light emitting element E206A have substantially similar or even the same light emitting efficiency, the influence of the light R202, the light R204 and the light R206 on the radiation weight percentages of different color light may be ignored. Nonetheless, a radiation of the pixel light L202 may be affected by a conversion efficiency of the light conversion element Q202A and a transmittance of the color filter C202A; a radiation of the pixel light L204 may be affected by a conversion efficiency of the light conversion element Q204A and a transmittance of the color filter C204A; and a radiation of the pixel light L206 may be affected by a transmittance of the color filter C206A. Therefore, in order to achieve the target radiation weight percentages, the radiation weight percentage of each color light may be designed according to a formula below: (a design radiation weight percentage) proportional to (the target radiation weight percentage)/(the conversion efficiency of the light conversion element * the transmittance of the color filter).

In some embodiments, because the radiation of each color light is proportional to the lighting area of each color light, the design radiation weight percentage obtained by the above formula may be used as a parameter for designing the ratio of the lighting area of each color light. Here, for the pixel units having the color filter and the light conversion element stacked together, the transmittance of the color filter may be defined as a ratio of a light intensity of the light passed through the light conversion element to a light intensity of the light further passed through the color filter after being passed through the light conversion element. However, the transmittance may also be defined by other definitions known in the industry.

In some embodiments, a light conversion efficiency (External Quantum Efficiency, EQE) of the light conversion element Q202A in the red pixel unit 202A is approximately 24% to 39%, and a light conversion efficiency of the light conversion element Q204A in the green pixel unit 204A is approximately 20% to 35%. The transmittance of the color filter C202A in the red pixel unit 202A is approximately 90%, and the transmittance of the color filter C204A in the green pixel unit 204A is approximately 85%. Meanwhile, the transmittance of the color filter C206A in the blue pixel unit 206A is approximately 90% since the scattering particles in the color filter C206A, for example having a material of $TiO_2$ may absorb around 10% of the blue light emitted from the light emitting element E206A. By substituting the transmittance of the color filter and the light conversion efficiency of the light conversion element described above into the formula: (the design radiation weight percentage) proportional to (the target radiation weight percentage)/(the conversion efficiency of the light conversion element x the transmittance of the color filter), the design radiation weight percentage of each color pixel unit for achieving the target radiation weight percentages may be obtained and served as the parameters for designing and manufacturing. For instance, to achieve the target radiation weight percentages of the red light, the green light and the blue light which are at 20%, 29% and 51% and present the white point with the X coordinate as 0.273±0.020 and the Y coordinate as 0.275±0.020 in the CIE1931 colorimeter system, these values may be substituted in the formula to obtain the following results. The design radiation weight percentage of the red pixel unit 202A is approximately 58% to 94%. The design radiation weight percentage of the green pixel unit 204A is approximately 96% to 168%. The design radiation weight percentage of the blue pixel unit 206A is approximately 51% to 57%. Results obtained by dividing the design radiation weight percentages of different color pixel units may be used as the ratios of lighting areas of different color pixel units. Therefore, in order to achieve the radiation weight percentages of the red light, the green light and the blue light which are at 20%, 29% and 51%, and present the white point with the X coordinate as 0.273±0.020 and the Y coordinate as 0.275±0.020 in the CIE1931 colorimeter system, a ratio of the lighting area GD of the green pixel unit 204A to the lighting area RD of the red pixel unit 202A (the lighting area GD of the green pixel unit 204A/the lighting area RD of the red pixel unit 202A) is, for example, ranged from the 1.02 to 2.90; a ratio of the lighting area GD of the green pixel unit 204A to the lighting area BD of the blue pixel unit 206A (the lighting area GD of the green pixel unit 204A/the lighting area BD of the blue pixel unit 206A) is, for example, ranged from the 1.68 to 3.29; and/or a ratio of the lighting area RD of the green pixel unit 202A to the lighting area BD of the blue pixel unit 206A (the lighting area RD of the green pixel unit 202A/the lighting area BD of the blue pixel unit 206A) is, for example, ranged from the 1.02 to 1.84.

In some embodiments, a light conversion efficiency of the light conversion element Q202A in the red pixel unit 202A is approximately 32% to 39%, and a light conversion efficiency of the light conversion element Q204A in the green pixel unit 204A is approximately 28% to 35%. The transmittance of the color filter C202A in the red pixel unit 202A is approximately 90%, and the transmittance of the color filter C204A in the green pixel unit 204A is approximately 85%. Meanwhile, the transmittance of the color filter C206A (or the filling element) in the blue pixel unit 206A is approximately 92% since the scattering particles in the color filter C206A, for example having a material of $TiO_2$ may absorb around 8% of the blue light emitted from the light emitting element E206A. By substituting the transmittance of the color filter and the light conversion efficiency of the light conversion element described above into the formula: (the design radiation weight percentage) proportional to (the target radiation weight percentage)/(the conversion efficiency of the light conversion element * the transmittance of the color filter), when the target radiation weight percentages of the red light, the green light and the blue light are at 20%, 29% and 51%, the design radiation weight percentage of each color pixel unit may be calculated and served as the parameters for designing and manufacturing. For instance, in order to achieve the radiation weight percentages of the red light, the green light, and the blue light which are at 20%, 29% and 51% and to present the white point with the X coordinate as 0.273±0.020 and the Y coordinate as 0.275±0.020 in the CIE1931 colorimeter system, the design radiation weight percentage of the red pixel unit 202A is approximately 58% to 70%; the design radiation weight percentage of the green pixel unit 204A is approximately 96% to 120%; and the design radiation weight percentage of the blue pixel unit 206A is approximately 51% to 56%. Results obtained by dividing the design radiation weight percentages of different color pixel units may be used as the ratios of lighting areas of different color pixel units. Specifically, in order to achieve the radiation weight percentages of the red light, the green light and the blue light which are at 20%, 29% and 51% and to present the white point with the X coordinate as 0.273±0.020 and the Y coordinate as 0.275±0.020 in the CIE1931 colorimeter system, the ratio of the lighting area GD of the green pixel unit 204A to the lighting area RD of the red pixel unit 202A (the lighting area GD of the green pixel unit 204A/the lighting area RD of the red pixel unit 202A) is, for example, ranged from the 1.37 to 2.07; the ratio of the lighting area GD of the green pixel unit 204A to the lighting area BD of the blue pixel unit 206A (the lighting area GD of the green pixel unit 204A/the lighting area BD of the blue pixel unit 206A) is, for example, ranged from the 1.71 to 2.35; and/or the ratio of the lighting area RD of the green pixel unit 202A to the lighting area BD of the blue pixel unit 206A (the lighting area RD of the green pixel unit 204A/the lighting area BD of the blue pixel unit 206A) is, for example, ranged from the 1.03 to 1.37.

The values in the above ranges are for illustrative purposes, and this disclosure is not intended to exclude other specific embodiments for the ratio of the areas. In addition, the outlines of the lighting area RA, the lighting area GA and the lighting area BA are not limited to rectangles, but may have other arbitrary shapes.

Figure 2B:
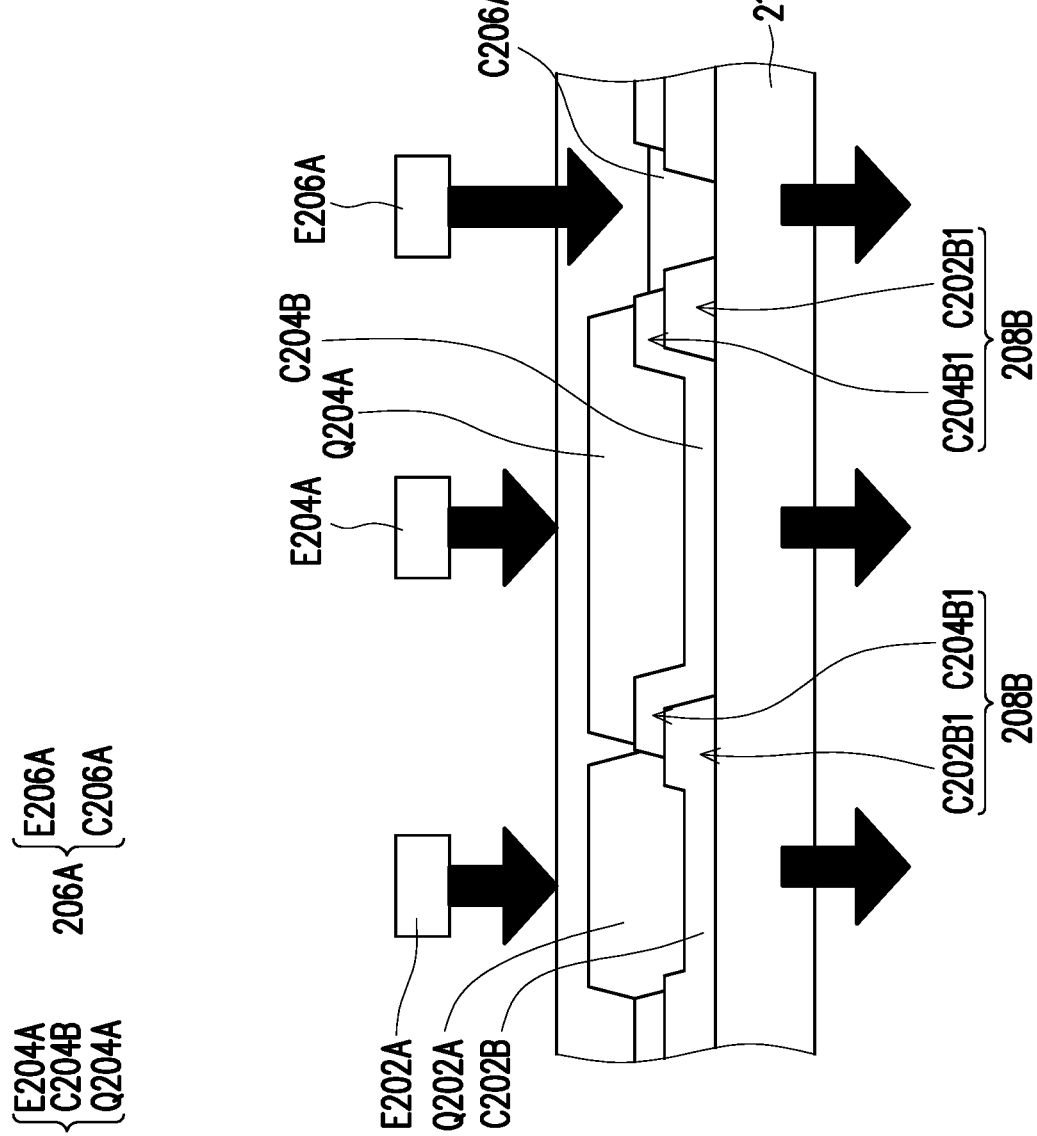
FIG. 2B is a partial cross-sectional view of a display device according to an embodiment.

FIG. 2B is a partial cross-sectional view of a display device. A cross-sectional structure of FIG. 2B schematically shows some components of a display device. Since a display device 200B is similar to the display device 200A, the same element symbol table i used in the two embodiments to refer to the same elements. Specifically, the display device 200B includes a red pixel unit 202B, a green pixel unit 204B, the blue pixel unit 206A, a black matrix 208B and the substrate 210. The red pixel unit 202B includes the light emitting element E202A, the light conversion element Q202A and a color filter C202B. The green pixel unit 204B includes the light emitting element E204A, the light conversion element Q204A and a color filter C204B. The blue pixel unit 206A includes the light emitting element E206A and the color filter C206A. The relationship between the sizes of the lighting areas of the red pixel unit 202B, the green pixel unit 204B and the blue pixel unit 206A may refer to the foregoing embodiments, which is not repeated hereinafter. In this embodiment, a peripheral portion C202B1 may be simultaneously fabricated on the substrate 210 when fabricating the color filter C202B, and a peripheral portion C204B1 may be simultaneously fabricated on the substrate 210 when fabricating the color filter C204B. The peripheral portion C202B1 may be disposed around the color filter C202B, and the peripheral portion C204B1 may be disposed around the color filter C204B. Meanwhile, the peripheral portion C204B1 may be stacked together with the peripheral portion C202B1 to form the black matrix 208B.

FIG. 2C is a partial cross-sectional view of a display device. A cross-sectional structure of FIG. 2C schematically shows some components of a display device. Since a display device 200C is similar to the display device 200A, the same element symbol table is used in the two embodiments to refer to the same elements. Specifically, the display device 200C includes the red pixel unit 202A, the green pixel unit 204A, the blue pixel unit 206A and the substrate 210. The main difference between the display device 200C and the display device 200A is that the display device 200C does not include the black matrix.

In this embodiment, a width of the color filter C202A of the red pixel unit 202A may be greater than a width of the light conversion element Q202A, and a width of the color filter C204A of the green pixel unit 204A may be greater than a width of the light conversion element Q204A. In some embodiments, a distance DW between an edge of the light conversion element Q202A and an edge of the color filter C202A may be approximately 1 μm to 5 μm. Similarly, a distance between an edge of the light conversion element Q204A and an edge of the color filter C204A may also be approximately 1 μm to 5 μm. In some embodiments, the light conversion element Q202A and the light conversion element Q204A may have inclined sidewalls, and an interior angle formed by the inclined sidewalls and a top surface of the color filter thereunder is an acute angle. Here, an angle of the inclined angle of the sidewalls may be approximately 40 degrees to 80 degrees or 60 degrees to 85 degrees. However, the above values are for illustrative purposes, and are not intended to limit the specific design of the display device 200C.

Figure 3A:
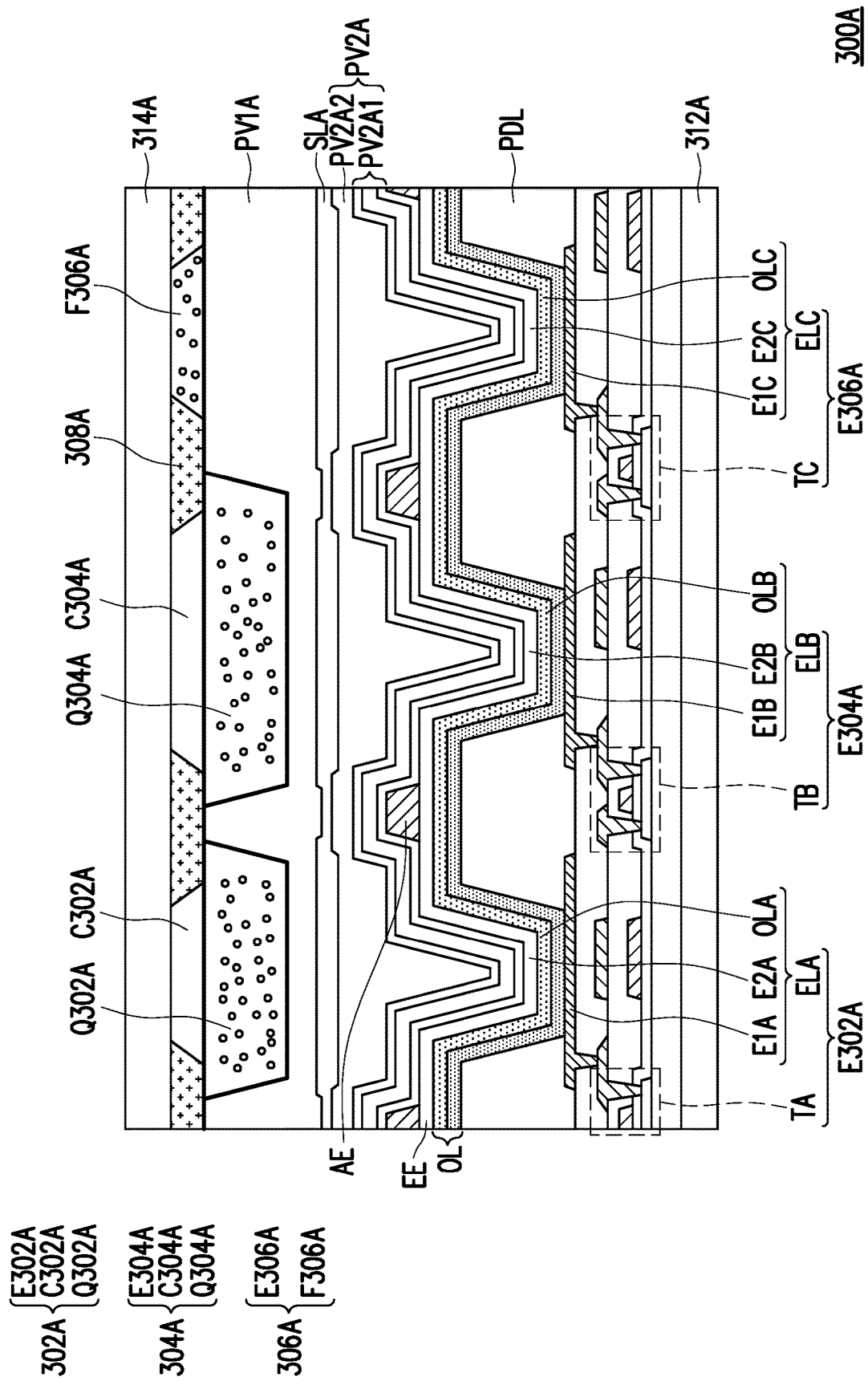

FIG. 3A is a partial cross-sectional view of a display device according to an embodiment of the disclosure. In FIG. 3A, a display device 300A includes a red pixel unit 302A, a green pixel unit 304A, a blue pixel unit 306A, a black matrix 308A, a substrate 312A and a substrate 314A. The red pixel unit 302A, the green pixel unit 304A, the blue pixel unit 306A and the black matrix 308A are all disposed between the substrate 312A and the substrate 314A. The red pixel unit 302A includes a light emitting element E302A, a light conversion element Q302A and a color filter C302A. The green pixel unit 304A includes a light emitting element E304A, a light conversion element Q304A and a color filter C304A. The blue pixel unit 306A includes a light emitting element E306A and a filling element F306A. In this embodiment, the light emitting element E302A, the light emitting element E304A and the light emitting element E306A are all disposed on the substrate 312A. Further, the black matrix 308A, the light conversion element Q302A, the color filter C302A, the light conversion element Q304A, the color filter C304A and the filling element F306A are all disposed on the substrate 314A. The substrate 314A is further disposed with a passivation layer PV1A to cover the light conversion element Q302A, the color filter C302A, the light conversion element Q304A, the color filter C304A and the filling element F306A. Here, the passivation layer PV1A may also be used to protect the light conversion elements from moisture and oxygen problems. The substrate 312A is further disposed with a passivation layer PV2A to cover the light emitting element E302A, the light emitting element E304A and the light emitting element E306A. In addition, the substrate 312A and the substrate 314A may be attached together through an adhesive layer SLA. The passivation layer PV1A and the passivation layer PV2A are in contact with opposite surfaces of the adhesive layer SLA. In some embodiments, the passivation layer PV2A may include a composite stacked layer PV2A1 and a cover layer PV2A2. Here, the composite stacked layer PV2A1 is a stacked layer sequentially formed by an organic insulation layer, an organic insulation layer and the like, and the cover layer PV2A2 covers the composite stacked layer PV2A1. In other embodiments, the passivation layer PV2A may be one single layer or may be formed by even more layers stacked together. Here, the passivation layer PV2A may also be used to protect the light conversion elements from moisture and oxygen problems.

The light emitting element E302A includes an active element TA and a light emitting unit ELA. Here, the light emitting unit ELA includes a light emitting layer OLA and two electrodes E1A and E2A, and the light emitting layer OLA is included between the electrode E1A and the electrode E2A. The light emitting element E304A includes an active element TB and a light emitting unit ELB. Here, the light emitting unit ELB includes a light emitting layer OLB and two electrodes E1B and E2B, and the light emitting layer OLB is included between the electrode E1B and the electrode E2B. The light emitting element E304A includes an active element TC and a light emitting unit ELC. Here, the light emitting unit ELC includes a light emitting layer OLC and two electrodes E1C and E2C, and the light emitting layer OLC is included between the electrode E1C and the electrode E2C. In this embodiment, the electrode E1A, the electrode E1B and the electrode E1C are respectively connected to the active element TA, the active element TB and the active element TC, and are not connected to each other. In other words, the electrode E1A, the electrode E1B and the electrode E1C may be an anode of the organic light emitting element or an anode or a cathode of the micro light emitting element, but not limited thereto. Lights emitted by the light emitting element E302A, the light emitting element E304A and the light emitting element E306A travel on optical paths away from the active element TA, the active element TB and the active element TC towards the substrate 314A, and a display light of the display device 300A is emitted to the outside from the substrate 314A. Therefore, the light emitting element E302A, the light emitting element E304A and the light emitting element E306A are light emitting elements of top emission type.

The substrate 312A is disposed with a pixel defining layer PDL, which surrounds the periphery of the electrode E1A, the electrode E1B and the electrode E1C to separate the electrode E1A, the electrode E1B and the electrode E1C from each other and ensure that the light emitting element E302A, the light emitting element E304A and the light emitting element E306A may emit light independently (i.e., to be formed as sub pixels independent from each other). In addition, the light emitting layer OLA, the light emitting layer OLB and the light emitting layer OLC may comprise a continuous light emitting material OL and are not limited to a single layer. That is to say, the light emitting material layer OL may comprise at least one functional layer. In terms of the connection relationship of the circuits, for example, two or more of the light emitting unit ELA, the light emitting unit ELB and the light emitting unit ELC may be connected in series, but not limited thereto. The purpose of such design is to allow the light emitting elements such as the light emitting unit ELA, the light emitting unit ELB, the light emitting unit ELC to provide a maximum brightness, but not limited thereto. Further, the electrode E2A, the electrode E2B and the electrode E2C may comprise, for example, a continuous electrode material layer EE. The electrode material layer EE may be disposed along the light emitting material layer OL, and the light emitting material layer OL may cover the pixel definition layer PDL. The electrode E2A, the electrode E2B and the electrode E2C may comprise transmissive electrode materials including but not limited to magnesium-silver alloy (MgAg), indium tin oxide (ITO), zinc oxide (ZnO) and other thin layers so that the lights may be emitted on the optical paths towards the substrate 314A. In this embodiment, a portion where the light emitting material layer OL contacts the electrode E1A may be regarded as the light emitting layer OLA; a portion where the light emitting material layer OL contacts the electrode E1B may be regarded as the light emitting layer OLB, and a portion where the light emitting material layer OL contacts the electrode E1C may be regarded as the light emitting layer OLC. A material of the light emitting material layer OL comprises an organic light emitting material. In some embodiments, the light emitting material layer OL may comprise multiple layers of materials, such as a hole injection layer, a hole transport layer, an active layer, a charge generation layer, an electron transport layer and an electron injection layer, but not limited thereto. In addition, the substrate 312A may be further disposed with an auxiliary electrode AE, which is disposed on the pixel defining layer PDL and electrically connected to the electrode material layer EE. In some embodiments, arrangement positions of the pixel definition layer PDL and the auxiliary electrode AE may overlap the black matrix 308A in a thickness direction of the display device 300A. The auxiliary electrode AE may improve IR (current-resistance) drop.

On the substrate 314A, the color filter C302A is disposed between the substrate 314A and the light conversion element Q302A, and the color filter C304A is disposed between the substrate 314A and the light conversion element Q304A. A filtering wavelength of the color filter C302A may correspond to a conversion wavelength of the light conversion element Q302A, and a filter wavelength of the color filter C304A may correspond to a conversion wavelength of the light conversion element Q304A. For example, if the light conversion element Q302A is adapted to convert the blue light or the ultraviolet light into the red light, the color filter C302A is a red filter layer. Further, if the light conversion element Q304A is adapted to convert the blue light or the ultraviolet light into the green light, the color filter C304A is a green filter layer. In this embodiment, a material of the color filter C302A and the color filter C304A comprises, for example, a photoresist material, and a material of the light conversion element Q302A and the light conversion element Q304A comprises: a photoresist material and a quantum dot material dispersed in the photoresist material: an ink material and a quantum dot material dispersed in the ink material;

or an inkjet material and a quantum dot material dispersed in the inkjet material, but not limited thereto. The photoresist material of the light conversion element Q302A and the light conversion element Q304A may comprise a transparent organic material. Accordingly, the color filter C302A, the color filter C304A, the light conversion element Q302A and the light conversion element Q304A may be fabricated by a photo lithography or fabricated by an inkjet printing. In addition, the filling element F306A may also be fabricated by the photo lithography or fabricated by the inkjet printing, but not limited thereto. In some embodiments, the filling element F306A may comprise a transparent material, which has good visible light transmittance to allow the light emitted by the light emitting element E306A to penetrate. In addition, scattering particles may be dispersed in the filling element F306A, the light conversion element Q302A and the light conversion element Q304A. Here, a material of scattering particles comprises $TiO_2$, but not limited thereto.

A layout of the red pixel unit 302A, the green pixel unit 304A and the blue pixel unit 306A may be similar to the description of the foregoing embodiment. In other words, when the display device 300A is lit, it may be observed under the optical microscope that, a lighting area RB of the red pixel unit 302A is smaller than a lighting area GB of the green pixel unit 304B and greater than a lighting area BB of the blue pixel unit 306A (referring to FIGS. 1A, 1B and 1C).

Figure 3B:
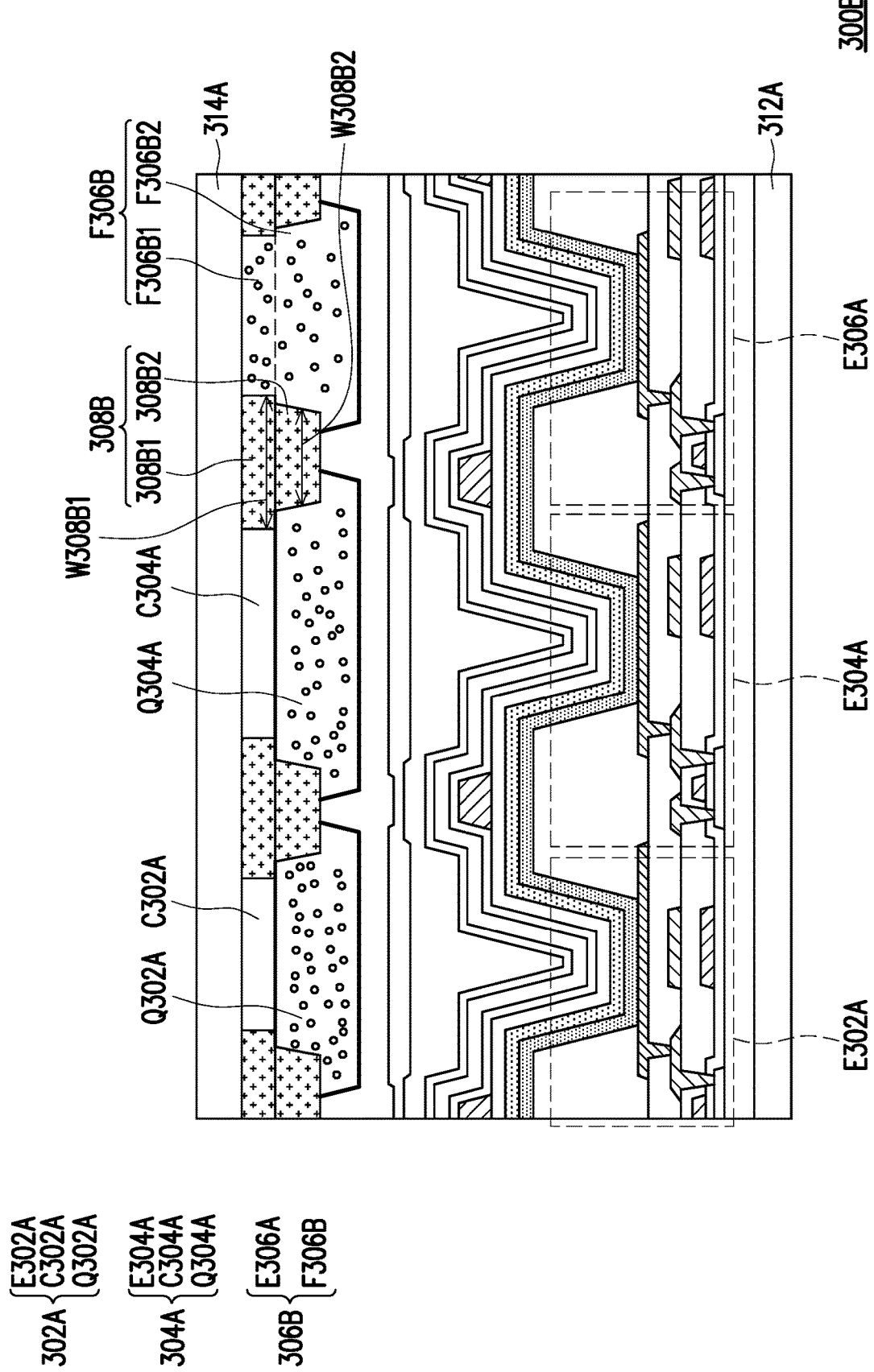

FIG. 3B is a cross-sectional view of a display device according to another embodiment of the disclosure. Because a display device 300B of FIG. 3B is substantially the same as the display device 300A of FIG. 3A, the differences between the two embodiments are mainly described below. The display device 300B includes the red pixel unit 302A, the green pixel unit 304A and a blue pixel unit 306B. The red pixel unit 302A includes the light emitting element E302A, the light conversion element Q302A and the color filter C302A. The green pixel unit 304A includes the light emitting element E304A, the light conversion element Q304A and the color filter C304A. The blue pixel unit 306B includes the light emitting element E306A and a filling element F306B. In this embodiment, the red pixel unit 302A and the green pixel unit 304A are the same as the corresponding elements of the display device 300A of FIG. 3A, and the light emitting element E306A of the blue pixel unit 306B is the same as the corresponding element of the display device 300A of FIG. 3A. Therefore, the same reference numerals are used for these elements in these embodiments. In addition, the black matrix 308B of the display device 300B includes a sub matrix 308B1 and a sub matrix 308B2 disposed on the substrate 314A, and the filling element F306B includes a first filling layer F306B1 and a second filling layer F306B2. The sub matrix 308B1 is used to separate the color filter C302A, the color filter C304A and the first filling layer F306B1, and the sub matrix 308B2 is used to separate the light conversion element Q302A, the light conversion element Q304A and the second filling layer F306B2. In this embodiment, the sub matrix 308B1 is located between the sub matrix 308B2 and the substrate 314A, and a width W308B1 of the sub matrix 308B1 is greater than a width W308B2 of the sub matrix 308B2. In addition, the sub matrix 308B2 may have a trapezoid shape, and the sub matrix 308B1 may have a substantially rectangular shape.

Figure 3C:
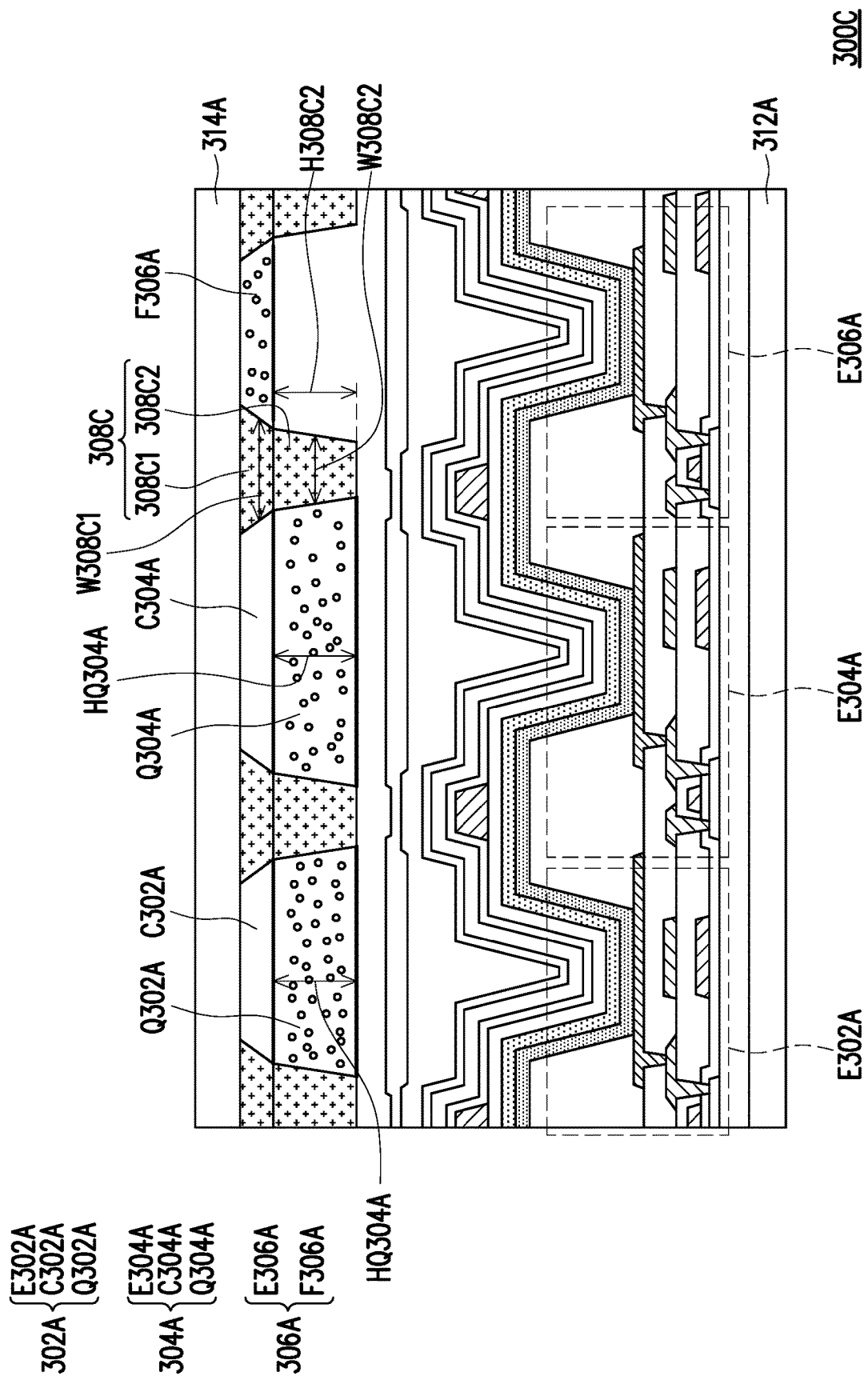

FIG. 3C is a cross-sectional view of a display device according to another embodiment of the disclosure. Because a display device 300C of FIG. 3C is substantially the same as the display device 300A of FIG. 3A, the differences between the two embodiments are mainly described below. The display device 300C includes the red pixel unit 302A, the green pixel unit 304A and the blue pixel unit 306A. The red pixel unit 302A includes the light emitting element E302A, the light conversion element Q302A and the color filter C302A. The green pixel unit 304A includes the light emitting element E304A, the light conversion element Q304A and the color filter C304A. The blue pixel unit 306A includes the light emitting element E306A and the filling element F306A. In this embodiment, the red pixel unit 302A, the green pixel unit 304A and the blue pixel unit 306A are the same as the corresponding elements of the display device 300A of FIG. 3A Therefore, the same reference numerals are used for these elements in these embodiments. In addition, a black matrix 308C of the display device 300C includes a sub matrix 308C1 and a sub matrix 308C2 disposed on the substrate 314A. The sub matrix 308C1 is used to separate the color filter C302A and the color filter C304A, and the sub matrix 308C2 is used to separate the light conversion element Q302A, the light conversion element Q304A and the filling element F306A. In this embodiment, the sub matrix 308C1 is located between the sub matrix 308C2 and the substrate 314A, and a width W308C1 of the sub matrix 308C1 is greater than a width W308C2 of the sub matrix 308C2. In addition, both the sub matrix 308C2 and the sub matrix 308C1 may have a trapezoid shape. Furthermore, a height (thickness) H308C2 of the sub matrix 308C2 may be aligned with or even greater than a height HQ302A (thickness) of the light conversion element Q302A and a height HQ304A (thickness) of the light conversion element Q304A. In some embodiments, an inkjet device may be used to drop a light conversion material into a groove defined by the sub matrix 308C2 on the substrate 314A, and then the light conversion material is cured to form the light conversion element Q302A and the light conversion element Q304A. Since the sub matrix 308C2 has a sufficient height, during the inkjet printing, the droplets of the light conversion material will not overflow and thus contamination between different light conversion materials may be reduced. In addition, in this embodiment, the color filter C302A, the color filter C304A and the filling element F306A may also be fabricated in an opening defined by the sub matrix 308C1 by the inkjet printing.

Figure 3D:
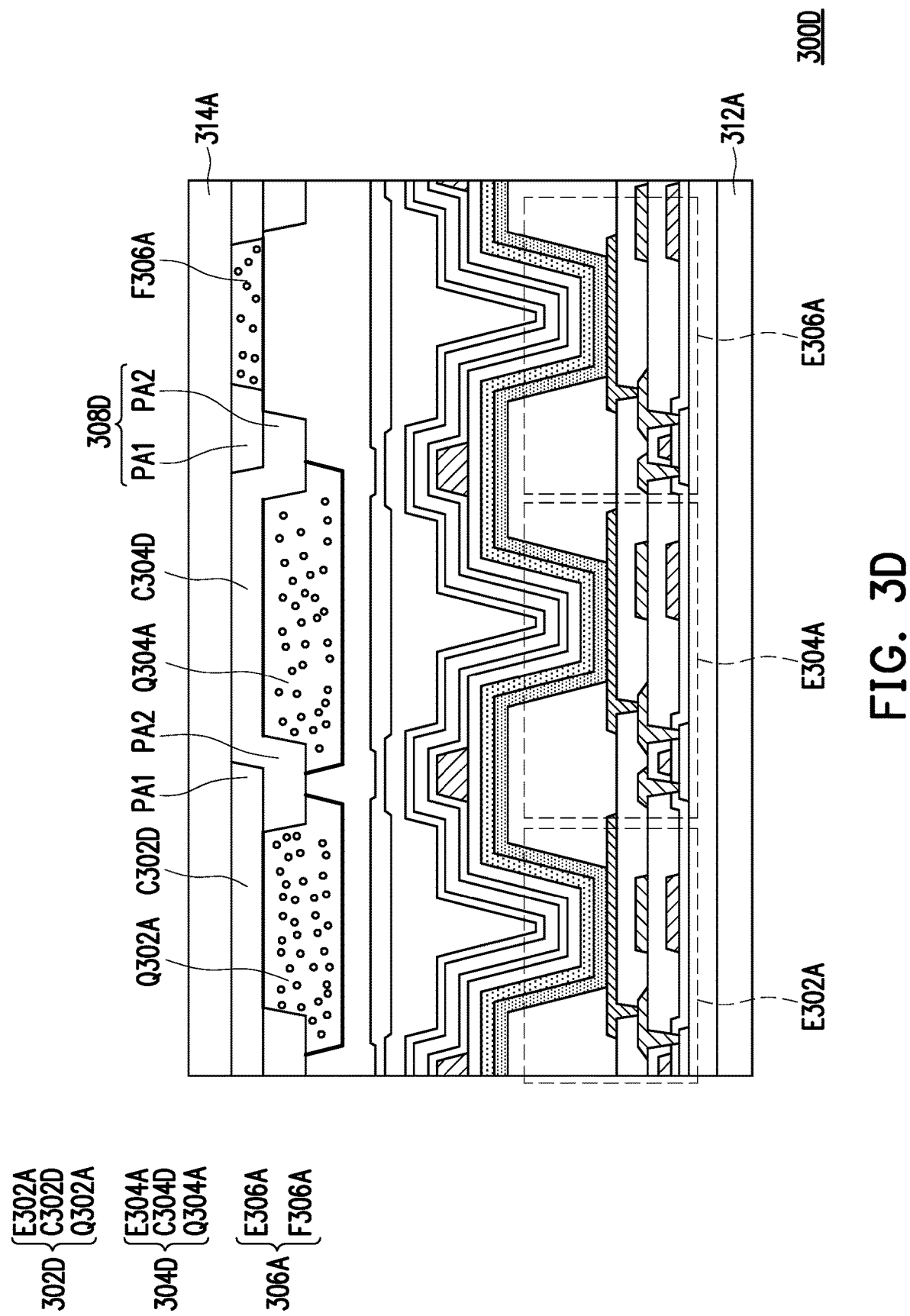

FIG. 3D is a cross-sectional view of a display device according to another embodiment of the disclosure. Because a display device 300D of FIG. 3D is substantially the same as the display device 300A of FIG. 3A, the differences between the two embodiments are mainly described below. The display device 300D includes a red pixel unit 302D, a green pixel unit 304D and the blue pixel unit 306A. The red pixel unit 302D includes the light emitting element E302A, the light conversion element Q302A and a color filter C302D. The green pixel unit 304D includes the light emitting element E304A, the light conversion element Q304A and a color filter C304D. The blue pixel unit 306A includes the light emitting element E306A and the filling element F306A. In this embodiment, the light emitting element E302A and the light conversion element Q302A of the red pixel unit 302D, the light emitting element E304A and the light conversion element Q304A of the green pixel unit 304D and the entire blue pixel unit 306A are all the same as the corresponding elements of the display device 300A of FIG. 3A Therefore, the same reference numbers are used. In addition, when fabricating the color filter C302D, a peripheral portion PA1 is fabricated using the same material; when fabricating the color filter C304D, a peripheral portion PA2 is fabricated using the same material. Here, a black matrix 308D of the display device 300D is formed by stacking the peripheral portion PA1 and the peripheral portion PA2 together. That is to say, a material of the black matrix 308D may be the same as those of the color filter C302D and the color filter C304D.

Figure 3E:
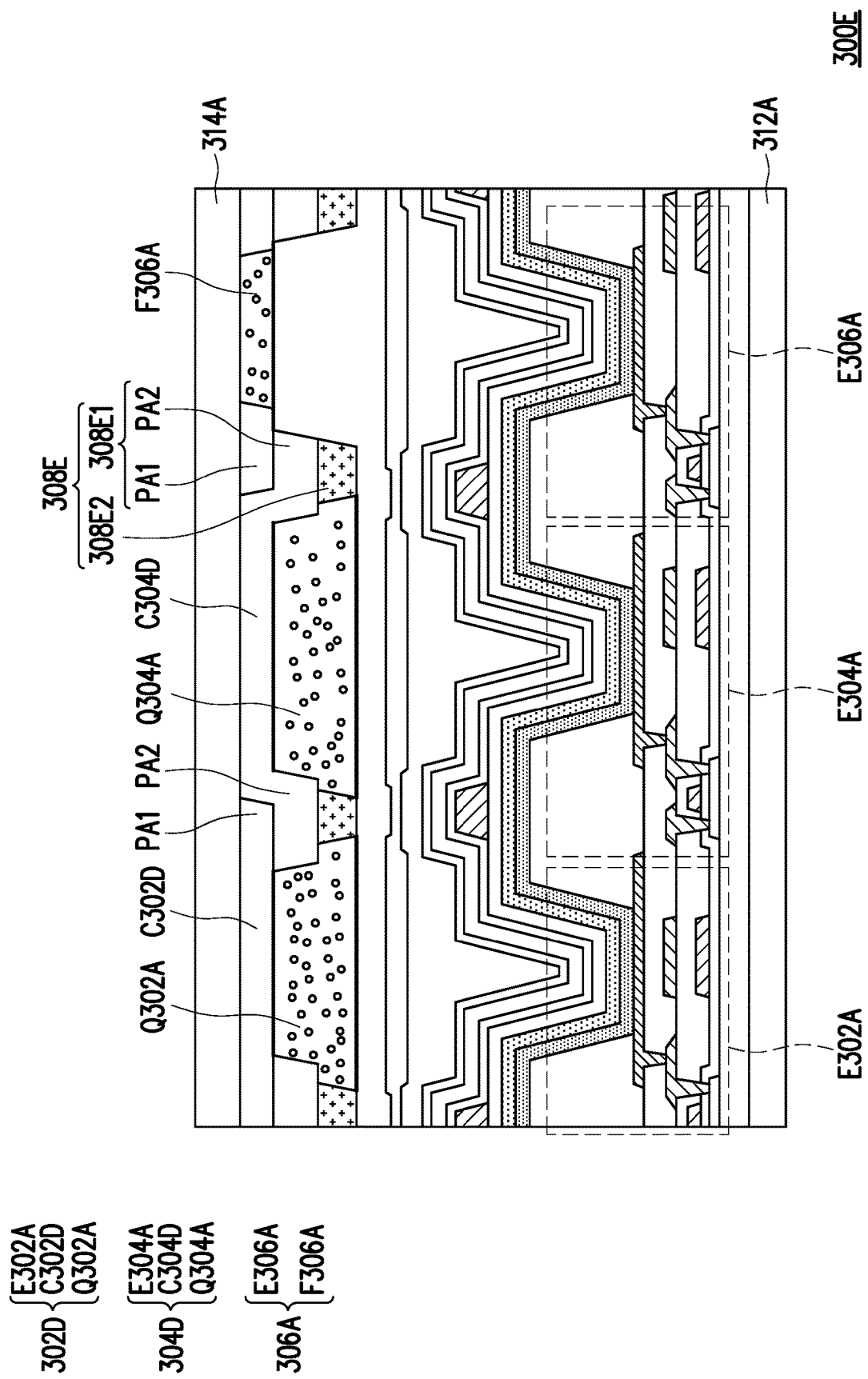

FIG. 3E is a cross-sectional view of a display device according to another embodiment of the disclosure. Because a display device 300E of FIG. 3E is substantially the same as the display device 300D of FIG. 3D, the differences between the two embodiments are mainly described below. The display device 300E includes the red pixel unit 302D, the green pixel unit 304D and the blue pixel unit 306A. The red pixel unit 302D includes the light emitting element E302A, the light conversion element Q302A and the color filter C302D. The green pixel unit 304D includes the light emitting element E304A, the light conversion element Q304A and the color filter C304D. The blue pixel unit 306A includes the light emitting element E306A and the filling element F306A. In this embodiment, the red pixel unit 302D and the green pixel unit 304D are the same as the corresponding elements of the display device 300D of FIG. 3D, and the blue pixel unit 306A is the same as the corresponding element of the display device 300A of FIG. 3A. Therefore, the same reference numerals are used for these elements in these embodiments. In addition, a black matrix 308E of the display device 300E includes a sub matrix 308E1 and a sub matrix 308E2 disposed on the substrate 314A. The sub matrix 308E1 is used to separate the color filter C302D and the color filter C304D, and the sub matrix 308E2 is used to separate the light conversion element Q302A and the light conversion element Q304A. In this embodiment, the sub matrix 308E1 is located between the sub matrix 308E2 and the substrate 314A. While fabricating the color filter C302D and the color filter C304D, the peripheral portion PA1 and the peripheral portion PA2 may also be fabricated, and the peripheral portion PA1 and the peripheral portion PA2 may be stacked together to form the sub matrix 308E1. That is to say, the sub matrix 308E1 is substantially the same as the stack of the black matrix 308D in FIG. 3D.

Figure 3F:
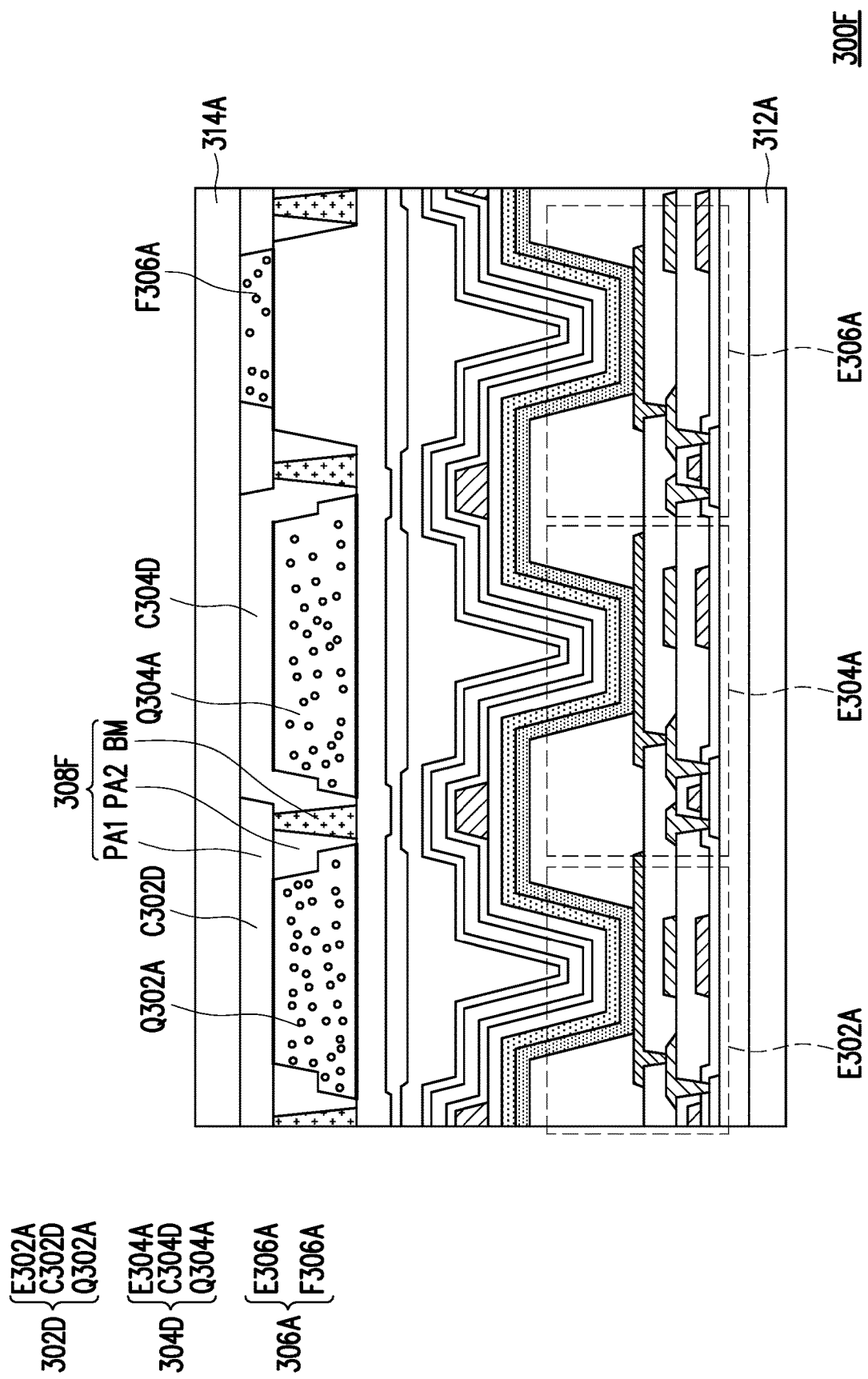

FIG. 3F is a cross-sectional view of a display device according to another embodiment of the disclosure. A display device 300F includes the red pixel unit 302D, the green pixel unit 304D and the blue pixel unit 306A. The red pixel unit 302D includes the light emitting element E302A, the light conversion element Q302A and the color filter C302D. The green pixel unit 304D includes the light emitting element E304A, the light conversion element Q304A and the color filter C304D. The blue pixel unit 306A includes the light emitting element E306A and the filling element F306A. In this embodiment, the red pixel unit 302D and the green pixel unit 304D are the same as the corresponding elements of the display device 300D of FIG. 3D, and the blue pixel unit 306A is the same as the corresponding element of the display device 300A of FIG. 3A. Therefore, the same reference numerals are used for these elements in these embodiments. In addition, a black matrix 308F includes the peripheral portion PA1, the peripheral portion PA2, and a light shielding material BM. When fabricating the color filter C302D and the color filter C304D of the display device 300F, the peripheral portion PA1 and the peripheral portion PA2 may be simultaneously fabricated. In addition, the light shielding material BM is located on the peripheral portion PA1 and penetrates the peripheral portion PA2, for example. In this embodiment, a height of the black matrix 308F is greater than a height of the light conversion element Q302A and a height of the light conversion element Q304A, for example. In addition, the light conversion element Q302A and the light conversion element Q304A may be fabricated by the inkjet printing, but not limited thereto. In some embodiments, the light conversion element Q302A and the light conversion element Q304A may be fabricated by the photo lithography.

FIG. 3G is a cross-sectional view of a display device according to another embodiment of the disclosure. Because a display device 300G of FIG. 3G is substantially the same as the display device 300A of FIG. 3A, the differences between the two embodiments are mainly described below. The display device 300G includes a red pixel unit 302G, a green pixel unit 304G and a blue pixel unit 306G. The red pixel unit 302G includes the light emitting element E302A, the light conversion element Q302A and a color filter C302G. The green pixel unit 304G includes the light emitting element E304A, the light conversion element Q304A and a color filter C304G. The blue pixel unit 306G includes the light emitting element E306A and a filling element F306G. In this embodiment, the light emitting element E302A and the light conversion element Q302A of the red pixel unit 302G, the light emitting element E304A and the light conversion element Q304A of the green pixel unit 304G and the light emitting element E306A of the blue pixel unit 306G are all the same as the corresponding elements of the display device 300A of FIG. 3A. Therefore, the same reference numerals are used for these elements in these embodiments. In addition, the black matrix is not provided on the substrate 314A of the display device 300G. The color filter C302G, the color filter C304G and the filling element F306G of the display device 300G are arranged side by side without overlapping one another. In addition, the light conversion element Q302A and the light conversion element Q304A may be fabricated by the photo lithography and independently disposed on the color filter C302G and the color filter C304G.

Figure 4A:
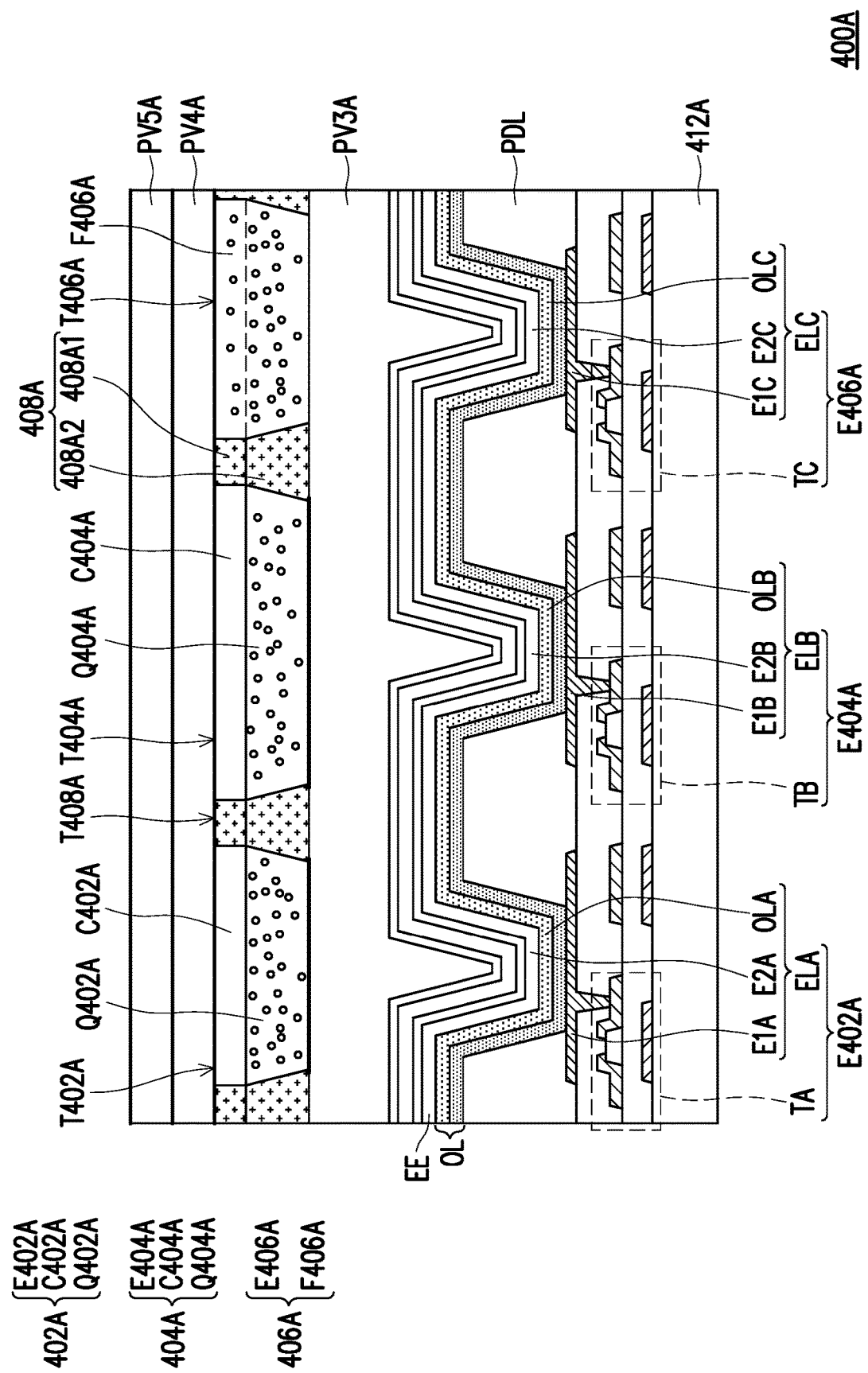
FIG. 4A to FIG. 4F are cross-sectional views of a display device according to an embodiment of the disclosure.

FIG. 4A is a partial cross-sectional view of a display device according to an embodiment of the disclosure. In FIG. 4A, a display device 400A includes a red pixel unit 402A, a green pixel unit 404A, a blue pixel unit 406A, a black matrix 408A and a substrate 412A. The red pixel unit 402A, the green pixel unit 404A, the blue pixel unit 406A and the black matrix 408A are all disposed on the substrate 412A. That is to say, the display device 400A may be a single substrate device. The red pixel unit 402A includes a light emitting element E402A, a light conversion element Q402A and a color filter C402A. The green pixel unit 404A includes a light emitting element E404A, a light conversion element Q404A and a color filter C404A. The blue pixel unit 406A includes a light emitting element E406A and a filling element F406A. The substrate 412A is further disposed with a passivation layer PV3 to cover the light emitting element E402, the light emitting element E404A and the light emitting element E406A. The substrate 412A is further disposed with a passivation layer PV4A and a passivation layer PV5A to cover the light conversion element Q402A, the color filter C402A, the light conversion element Q404A, the color filter C404A and the filling element F406A.

The light emitting element E402A includes the active element TA and the light emitting unit ELA. Here, the light emitting unit ELA includes the light emitting layer OLA and the two electrodes E1A and E2A, and the light emitting layer OLA is included between the electrode E1A and the electrode E2A. The light emitting element E404A includes the active element TB and the light emitting unit ELB. Here, the light emitting unit ELB includes the light emitting layer OLB and the two electrodes E1B and E2B, and the light emitting layer OLB is included between the electrode E1B and the electrode E2B. The light emitting element E406A includes the active element TC and the light emitting unit ELC. Here, the light emitting unit ELC includes the light emitting layer OLC and the two electrodes E1C and E2C, and the light emitting layer OLC is included between the electrode E1C and the electrode E2C. In this embodiment, the electrode E1A, the electrode E1B and the electrode E1C are respectively connected to the active element TA, the active element TB and the active element TC, and are not connected to each other. Lights emitted by each of the light emitting element E402A, the light emitting element E404A, and the light emitting element E406A are emitted away from the active element TA, the active element TB and the active element TC, and a display light of the display device 400A is emitted from the passivation layer PV5A. Therefore, the light emitting element E402A, the light emitting element E404A and the light emitting element E406A are light emitting elements of top emission type.

The substrate 412A is disposed with the pixel defining layer PDL, which surrounds the periphery of the electrode E1A, the electrode E1B and the electrode E1C to separate the electrode E1A, the electrode E1B and the electrode E1C from each other and ensure that the light emitting element E402A, the light emitting element E404A and the light emitting element E406A can operate (e.g., emit light) independently. In addition, the light emitting layer OLA, the light emitting layer OLB and the light emitting layer OLC may be formed by the continuous light emitting material OL, and the electrode E2A, the electrode E2B and the electrode E2C may be formed by, for example, the continuous electrode material layer EE. The electrode material layer EE may be disposed along the light emitting material layer OL, and the light emitting material layer OL may cover the pixel definition layer PDL. A material of the light emitting material layer OL comprises an organic light emitting material. In some embodiments, the light emitting material layer OL may comprise multiple layers of materials, such as the hole injection layer, the hole transport layer, the active layer, the electron transport layer and the electron injection layer, but not limited thereto. In some embodiments, an arrangement position of the pixel definition layer PDL may overlap the black matrix 408A in a thickness direction of the display device 400A.

The color filter C402A is disposed between the passivation layer PV4A and the light conversion element Q402A, and the color filter C404A is disposed between the passivation layer PV4A and the light conversion element Q404A. A filtering wavelength of the color filter C402A may correspond to a conversion wavelength of the light conversion element Q402A, and a filter wavelength of the color filter C404A may correspond to a conversion wavelength of the light conversion element Q404A. For example, if the light conversion element Q402A is adapted to convert the blue light or the ultraviolet light into the red light, the color filter C402A is a red filter layer that allows the red light to pass through. In addition, if the light conversion element Q404A is adapted to convert the blue light or the ultraviolet light into the green light, the color filter C404A is a green filter layer that allows the green light to pass through. A layout of the red pixel unit 402A, the green pixel unit 404A and the blue pixel unit 406A may be similar to the description of the foregoing embodiment. In other words, when the display device 400A is lit, it may be observed under the optical microscope that, a lighting area of the red pixel unit 402A is smaller than a lighting area of the green pixel unit 404A and greater than a lighting area of the blue pixel unit 406A.

The black matrix 408A of the display device 400A include a sub matrix 408A1 and a sub matrix 408A2 disposed on the substrate 412A, and the sub matrix 408A1 and the sub matrix 408A2 are stacked together. The sub matrix 408A1 is used to separate the color filter C402A and the color filter C404A, and the sub matrix 408A2 is used to separate the light conversion element Q402A and the light conversion element Q404A. In addition, the filling element F406A may directly contact both the sub matrix 408A1 and the sub matrix 408A2. In this embodiment, the sub matrix 408A1 is disposed between the sub matrix 408A2 and the passivation layer PV4A. In some embodiments, the sub matrix 408A2 may be fabricated on the substrate 412A, and the sub matrix 408A1 may be fabricated on the sub matrix 408A2. Further, a width of the sub matrix 408A2 may be greater than a width of the sub matrix 408A1, but not limited thereto. In addition, the sub matrix 408A2 may have a trapezoid shape which is gradually reduced away from the substrate 412A, and the sub matrix 408A1 may have a substantially rectangular shape. In some embodiments, a thickness of one of the sub matrix 408A1 and the sub matrix 408A2 may be greater than that of the light conversion element Q402A, the light conversion element Q404A and the filling element F406A, while the other one is not, but not limited thereto.

In some embodiments, a material of the color filter C402A and the color filter C404A comprises, for example, a photoresist material, and a material of the light conversion element Q402A and the light conversion element Q404A comprises a photoresist material and a quantum dot material dispersed in the photoresist material. Accordingly, the color filter C402A, the color filter C404A, the light conversion element Q402A and the light conversion element Q404A may be fabricated by the photo lithography. In addition, the filling element F406A may also be fabricated by the photo lithography or the inkjet, but not limited thereto. In some embodiments, the filling element F406A may comprise a transparent material, which has good visible light transmittance to allow the light emitted by the light emitting element E406A to penetrate. In an alternative embodiment, the filling element F406A may be a blue filter, but not limited thereto. In addition, the filling element F406A, the light conversion element Q402A and the light conversion element Q404A may be dispersed with scattering particles. Here, a material of scattering particles comprises $TiO_2$, but not limited thereto.

In some other embodiments, the light conversion element Q402A and the light conversion element Q404A may be fabricated by the inkjet printing. In some embodiments, after the sub matrix 408A2 is fabricated on the substrate 412A, an inkjet device may be used to drop a light conversion material into a groove defined by the sub matrix 408A2 on the substrate 412A, and then the light conversion material is cured to form the light conversion element Q402A and the light conversion element Q404A. The sub matrix 408A2 protrudes away from the substrate 412A by a surface of the passivation layer PV3A. Accordingly, during the inkjet printing, the droplets of the light conversion material will not overflow and thus mixing between different light conversion materials may be reduced. After the light conversion material is cured to form the light conversion element Q402A and the light conversion element Q404A, the sub matrix 408A1 may be fabricated on the sub matrix 408A2. Then, the inkjet device may be used to drop a color filter material into a groove defined by the sub matrix 408A1 on the substrate 412A, and drop a filling material into a groove defined by the sub matrix 408A1 and the sub matrix 408A2 on the substrate 412A. Then, after the color liter material and the filling material are cured, the color filter C402A, the color filter C404A and the filter element F406A may be formed. In some embodiments, a top surface T408A of the sub matrix 408A1 may be farther away from the substrate 412A than a top surface T402A of the color filter C402A, a top surface T404A of the color filter C404A and a top surface T406A of the filling element F406A. Alternatively, any two or a plurality or all of the top surface T408A of the sub matrix 408A1, the top surface T402A of the color filter C402A, the top surface T404A of the color filter C404A and the top surface T406A of the filling element F406A may be coplanar. In some embodiments, a top surface of the sub matrix 408A2 from the substrate 412A may be farther away from the substrate 412A than a top surface of the light conversion element Q402A from the substrate 412A, and may also be farther away from the substrate 412A than a top surface of the light conversion element Q404A from the substrate 412A. In addition, top surfaces of the light conversion element Q402A and the light conversion element Q404A may be at different distances away from the substrate 412A. Among the top surface of the light conversion element Q402A and the top surface of the light conversion element Q404A, the top surface farther from the substrate 412A may be closer to the substrate 412A than the top surface of the sub matrix 408A2 from the substrate 412A.

Figure 4B:
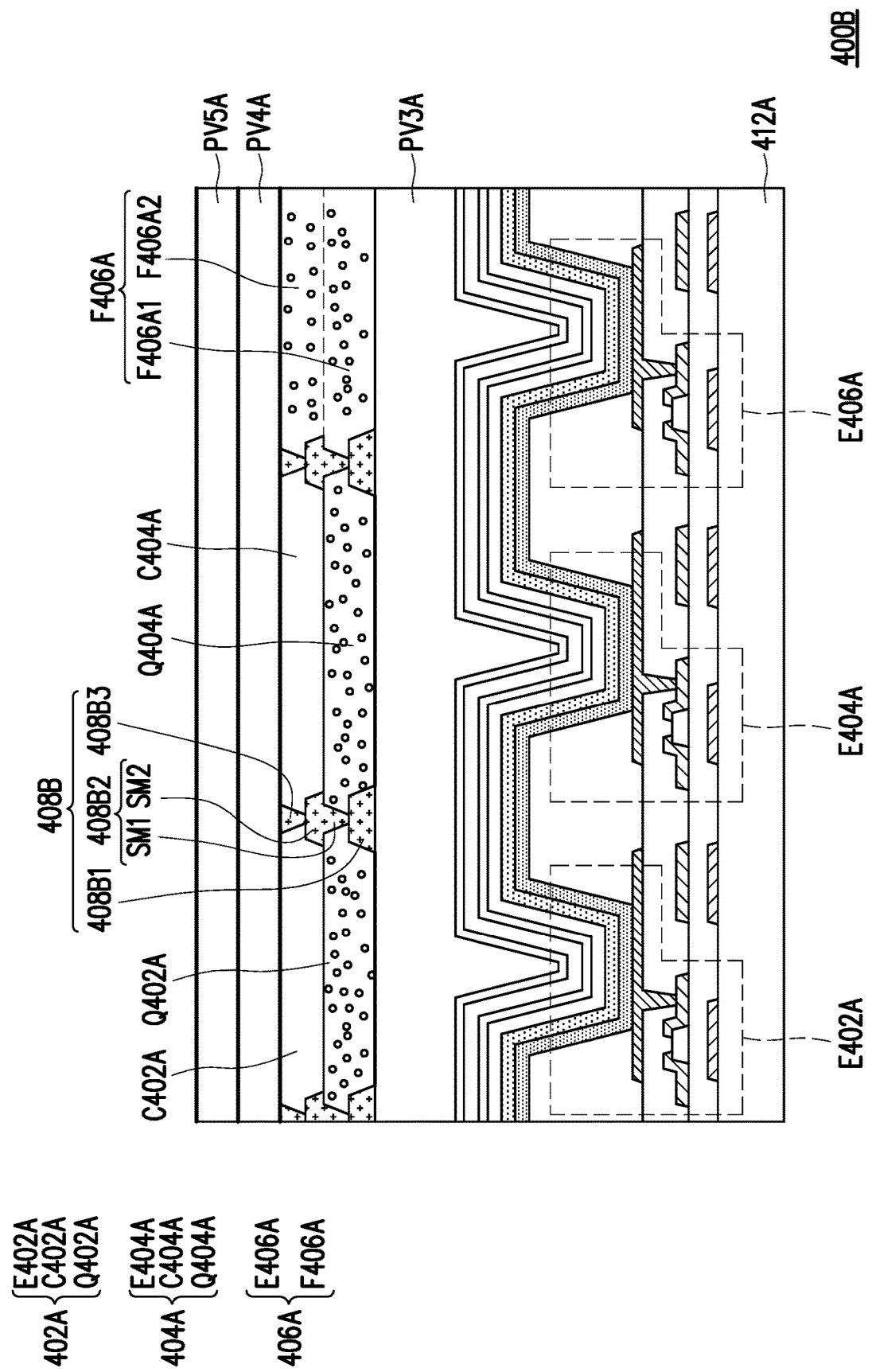

FIG. 4B is a cross-sectional view of a display device according to another embodiment of the disclosure. Because a display device 400B of FIG. 4B is substantially the same as the display device 400A of FIG. 4A, the differences between the two embodiments are mainly described below. In FIG. 4B, a display device 400B includes the red pixel unit 402A, the green pixel unit 404A and the blue pixel unit 406A. The red pixel unit 402A includes the light emitting element E402A, the light conversion element Q402A and the color filter C402A. The green pixel unit 404A includes the light emitting element E404A, the light conversion element Q404A and the color filter C404A. The blue pixel unit 406A includes the light emitting element E406A and the filling element F406A. In addition, a black matrix 408B of the display device 400B includes a sub matrix 408B1, a sub matrix 408B2 and a sub matrix 408B3 sequentially stacked on the substrate 412A. When fabricating the display device 400B, the sub matrix 408B1 may first be fabricated on the passivation layer PV3A by the photo lithography. Then, the light conversion element Q402A, the light conversion element Q404A and a first filling layer F406A1 of the filling element F406A may be fabricated in an opening defined by the sub matrix 408B1. Here, the light conversion element Q402A, the light conversion element Q404A and the first filling layer F406A1 are spaced apart from each other. In some embodiments, the light conversion element Q402A, the light conversion element Q404A and the first filling layer F406A1 may overlap each other at a position where the black matrix 408B is located. Then, the sub matrix 408B2 is fabricated on the sub matrix 408B1, and the sub matrix 408B2 includes a matrix portion SM1 and a matrix portion SM2 sequentially stacked on the sub matrix 408B1. The matrix portion SM1 of the sub matrix 408B2 is filled in a gap between the light conversion element Q402A, the light conversion element Q404A and the first filling layer F406A1. The matrix portion SM2 of the sub matrix 408B2 forms a structure that protrudes away from the substrate 412A relative to the light conversion element Q402A, the light conversion element Q404A and the first filling layer F406A1. Next, the color filter C402A, the color filter C404A and a second filling layer F406A2 of the filling element F406A are fabricated in an opening defined by the matrix portion SM2 of the sub matrix 408B2. Then, the sub matrix 408B3 is fabricated on the 408B2 so that the sub matrix 408B3 is filled between the color filter C402A, the color filter C404A and the second filling layer F406A2. However, in other embodiments, the second filling layer F406A2 may also be omitted. In some embodiments, the sub matrix 408B1 and the matrix portion SM2 may have a trapezoid shape narrower in direction farther away from the substrate 412A. The sub matrix 408B3 and the matrix portion SM1 may have a trapezoid shape wider in direction farther away from the substrate 412A, but not limited thereto. Further, in some embodiments, the sub matrix 408B1, the sub matrix 408B2 and the sub matrix 408B3 may be fabricated on the substrate 412A by the photo lithography.

Figure 4C:
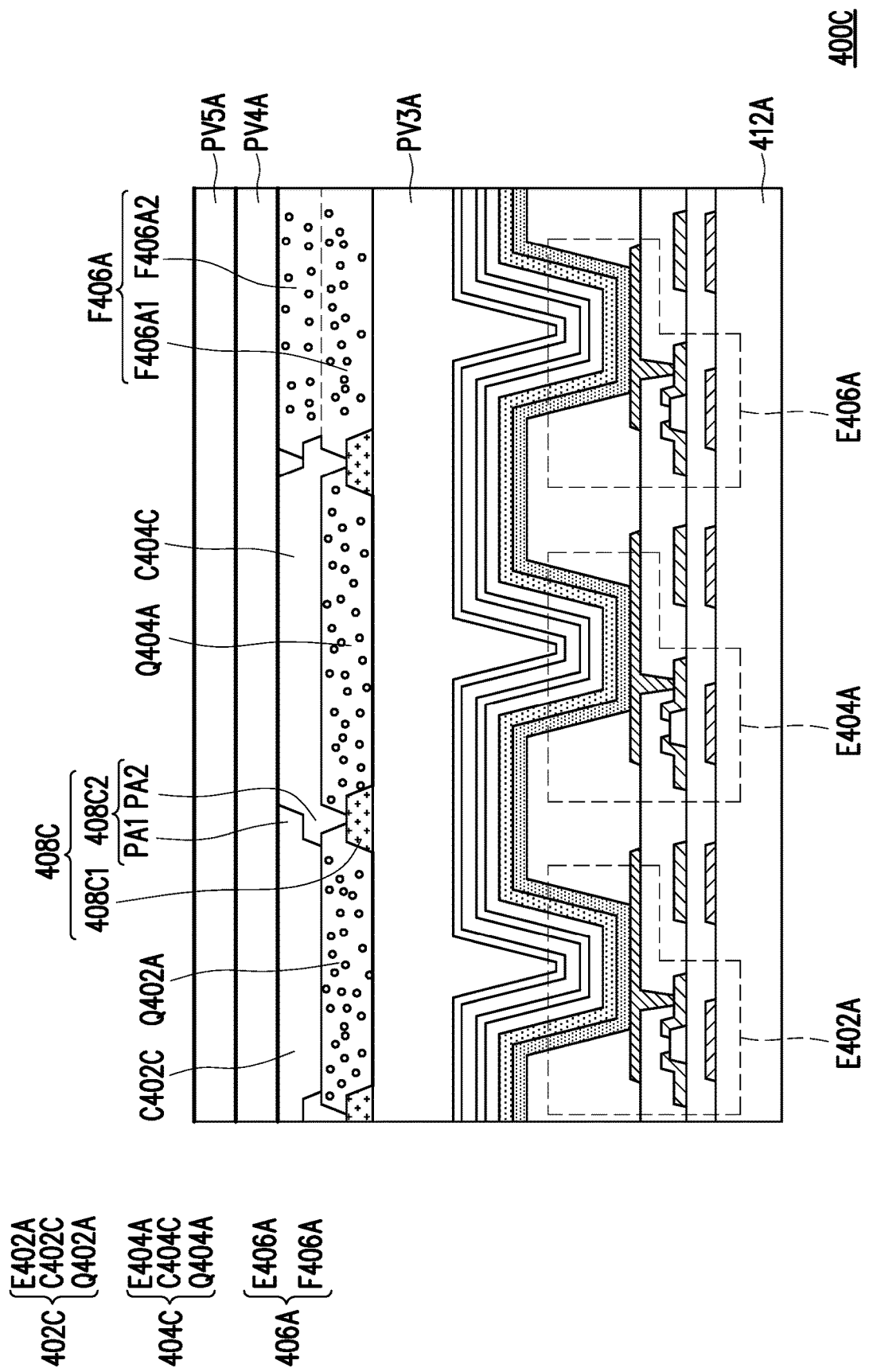

FIG. 4C is a cross-sectional view of a display device according to another embodiment of the disclosure. Because a display device 400C of FIG. 4C is substantially the same as the display device 400A of FIG. 4A, the differences between the two embodiments are mainly described below. The display device 400C of FIG. 4C includes a red pixel unit 402C, a green pixel unit 404C and the blue pixel unit 406A. The red pixel unit 402C includes the light emitting element E402A, the light conversion element Q402A and a color filter C402C. The green pixel unit 404C includes the light emitting element E404A, the light conversion element Q404A and a color filter C404C. The blue pixel unit 406A includes the light emitting element E406A and the filling element F406A. In addition, a black matrix 408C of the display device 400C includes the sub matrix 408C1 and a sub matrix 408C2. The sub matrix 408C1 is similar to the sub matrix 408B1 in FIG. 4B, which is disposed on the passivation layer PV3A and is located between the light conversion element Q402A, the light conversion element Q404A and the first filling layer F406A1 of the filling element F406A. In addition, when fabricating the color filter C402C, the peripheral portion PA1 is fabricated using the same material; and when fabricating the color filter C404C, the peripheral portion PA2 is fabricated using the same material. Here, the sub matrix 408C2 is formed by stacking the peripheral portion PA1 and the peripheral portion PA2 together. That is to say, a material of the 408C2 may be the same as those of the color filter C402C and the color filter C404C. In some embodiments, the peripheral portion PA2 may be filled in a gap between the light conversion element Q402A, the light conversion element Q404A and the first filling layer F406A1, but not limited thereto.

Figure 4D:
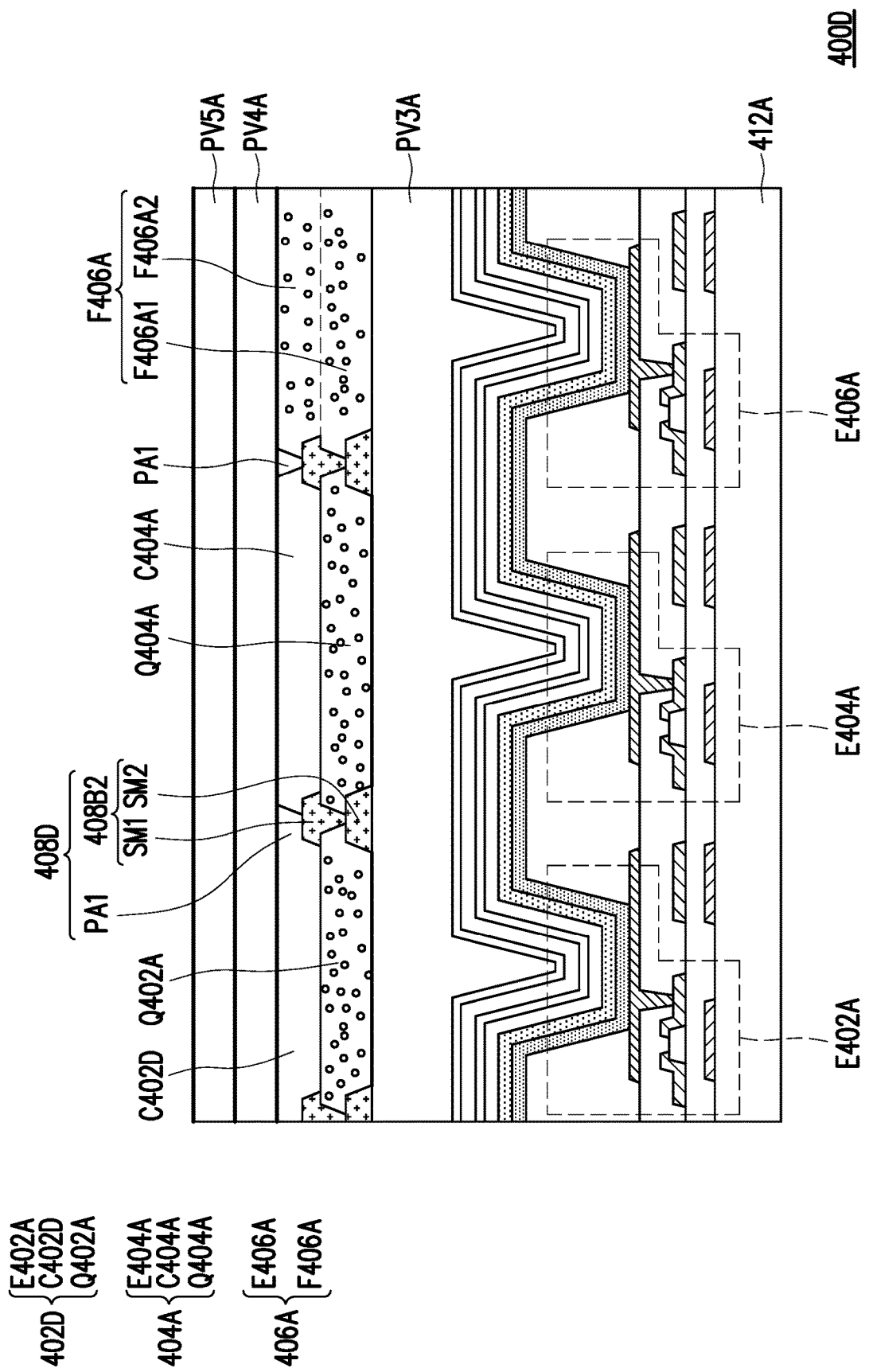

FIG. 4D is a cross-sectional view of a display device according to another embodiment of the disclosure. Because a display device 400D of FIG. 4D is substantially the same as the display device 400A of FIG. 4A, the differences between the two embodiments are mainly described below. The display device 400D of FIG. 4D includes a red pixel unit 402D, the green pixel unit 404A and the blue pixel unit 406A. The red pixel unit 402D includes the light emitting element E402A, the light conversion element Q402A and a color filter C402D. The green pixel unit 404A includes the light emitting element E404A, the light conversion element Q404A and the color filter C404A. The blue pixel unit 406A includes the light emitting element E406A and the filling element F406A. In addition, a black matrix 408D of the display device 400D includes the sub matrix 408B2, and the peripheral portion PAL. Here, the sub matrix 408B2 is substantially the same as the sub matrix 408B2 in FIG. 4B, and the peripheral portion PA1 is substantially the same as the peripheral portion PA1 in FIG. 4C. Specifically, the sub matrix 408B2 is disposed on the passivation layer PV3A; the peripheral portion PA1 is stacked on the sub matrix 408B2.

When fabricating the color filter C402D, the peripheral portion PA1 is fabricated using the same material, and the color filter C404A and the second filling layer F406A2 of the filling element F406A may directly contact the peripheral portion PAL. The sub matrix 408B2 includes the matrix portion SM1 and the matrix portion SM2. Here, the matrix portion SM1 is filled in the gap between the light conversion element Q402A, the light conversion element Q404A and the first filling layer F406A1. The matrix portion SM2 forms a structure that protrudes away from the substrate 412A relative to the light conversion element Q402A, the light conversion element Q404A and the first filling layer F406A1 of the filling element F406A.

Figure 4E:
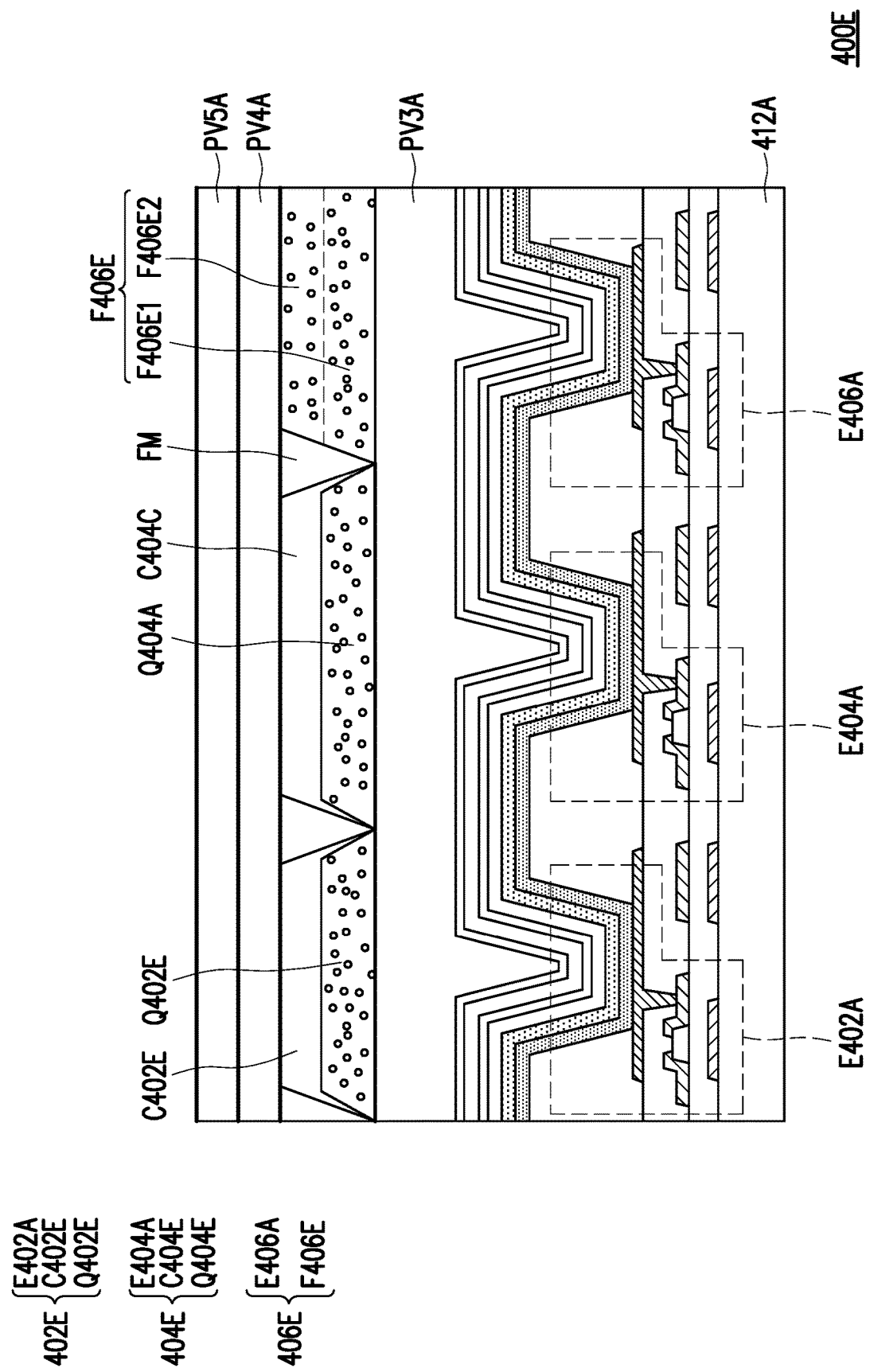

FIG. 4E is a cross-sectional view of a display device according to another embodiment of the disclosure. Because a display device 400E of FIG. 4E is substantially the same as the display device 400A of FIG. 4A, the differences between the two embodiments are mainly described below. The display device 400E of FIG. 4E includes a red pixel unit 402E, a green pixel unit 404E and a blue pixel unit 406E. The red pixel unit 402E includes the light emitting element E402A, a light conversion element Q402E and a color filter C402E. The green pixel unit 404E includes the light emitting element E404A, a light conversion element Q404E and a color filter C404E. The blue pixel unit 406E includes the light emitting element E406A and a filling element F406E. The specific structures and designs of the light emitting element E402A, the light emitting element E404A and the light emitting element E406A are substantially the same as those in the embodiment of FIG. 4A, which will not be repeated hereinafter. In this embodiment, because the display device 400E does not include the black matrix, the light conversion element Q402E, the light conversion element Q404E and a first filling layer F406E1 of the filling element F406E are disposed adjacent to each other. The color filter C402E is stacked on the light conversion element Q402E; the color filter C404E is stacked on the light conversion element Q404E; and a second filling layer F406E2 of the filling element F406E is stacked on the first filling layer F406E1. The color filter C402E, the light conversion element Q402E, the color filter C404E, the light conversion element Q404E and the filling element F406E may be fabricated by, for example, the photo lithography. Therefore, even though the display device 400E does not include the black matrix, the materials of the light conversion element Q402E and the light conversion element Q404E will not mix with each other, and the materials of the color filter C402E and the color filter C404E will not mix with each other either. In some embodiments, a space between the materials of the color filter C402E, the light conversion element Q402E, the color filter C404E and the light conversion element Q404E and the filling element F406E may be filled by a filler FM. In addition, the materials of the color filter C402E, the light conversion element Q402E, the color filter C404E and the light conversion element Q404E will not contaminate with the material of the filling element F406E.

Figure 4F:
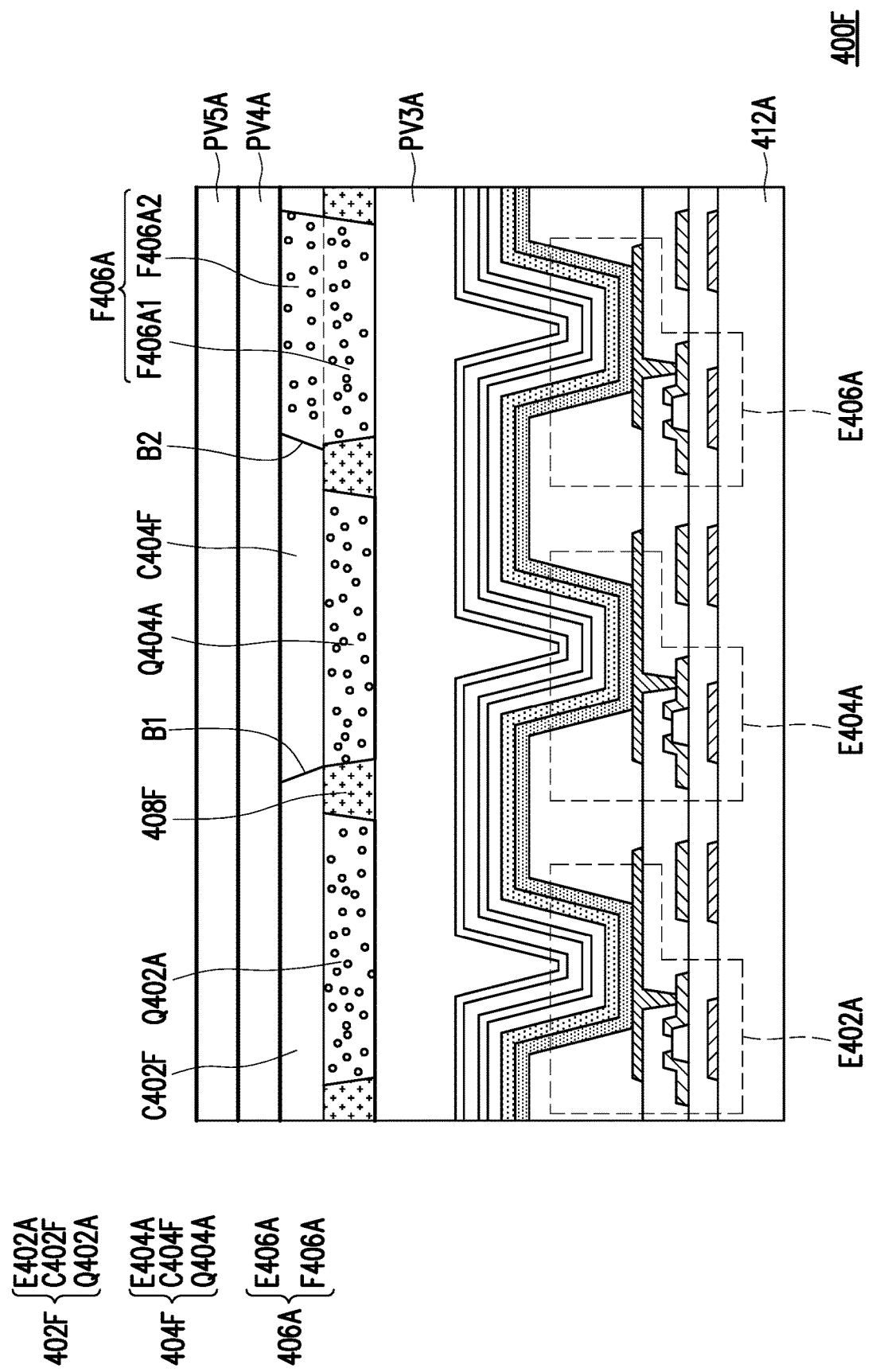

FIG. 4F is a cross-sectional view of a display device according to another embodiment of the disclosure. Because a display device 400F of FIG. 4F is substantially the same as the display device 400A of FIG. 4A, the differences between the two embodiments are mainly described below. The display device 400F of FIG. 4F includes a red pixel unit 402F, a green pixel unit 404F and the blue pixel unit 406A. The red pixel unit 402F includes the light emitting element E402A, the light conversion element Q402A and a color filter C402F. The green pixel unit 404F includes the light emitting element E404A, the light conversion element Q404A and a color filter C404F. The blue pixel unit 406A includes the light emitting element E406A and the filling element F406A. The specific structures and designs of the light conversion element Q402A, the light conversion element Q404A, the light emitting element E402A, the light emitting element E404A, the light emitting element E406A and the filling element F406A are substantially the same as those in the embodiment of FIG. 4A, which will not be repeated hereinafter. In addition, the display device 400F further includes a black matrix 408F, and the structural design of the black matrix 408F is substantially the same as the sub matrix 408A1 of FIG. 4A.

In this embodiment, the light conversion element Q402A, the light conversion element Q404A and the first filling layer F406A1 of the filling element F406A may be spaced apart by the black matrix 408F, and the color filter C402F, and the color filter C404F and the second filling layer F406A2 of the filling element F406A may be disposed adjacent to each other. That is to say, the color filter C402F, the color filter C404F and the second filling layer F406A2 of the filling element F406A are in contact with each other on sidewalls. In addition, boundaries between the color filter C402F, the color filter C404F and the second filling layer F406A2 of the filling element F406A are located on the black matrix 408F, for example. In some embodiments, the boundaries between the color filter C402F, the color filter C404F and the second filling layer F406A2 of the filling element F406A are oblique boundaries, which are inclined relative to a normal direction of the substrate 412A. In some embodiments, a boundary B1 between the color filter C402F and the color filter C404F inclined closer to a center of the color filter C402F in direction farther away from the substrate 412A, and a boundary B2 between the color filter C404F and the second filling layer F406A2 inclined closer to a center of the second filling layer F406A2 in direction farther away from the substrate 412A. Accordingly, the green pixel unit 404F and the color filter C404F have a trapezoid shape wider in direction farther away from the substrate 412A, but not limited thereto.

Figure 5A:
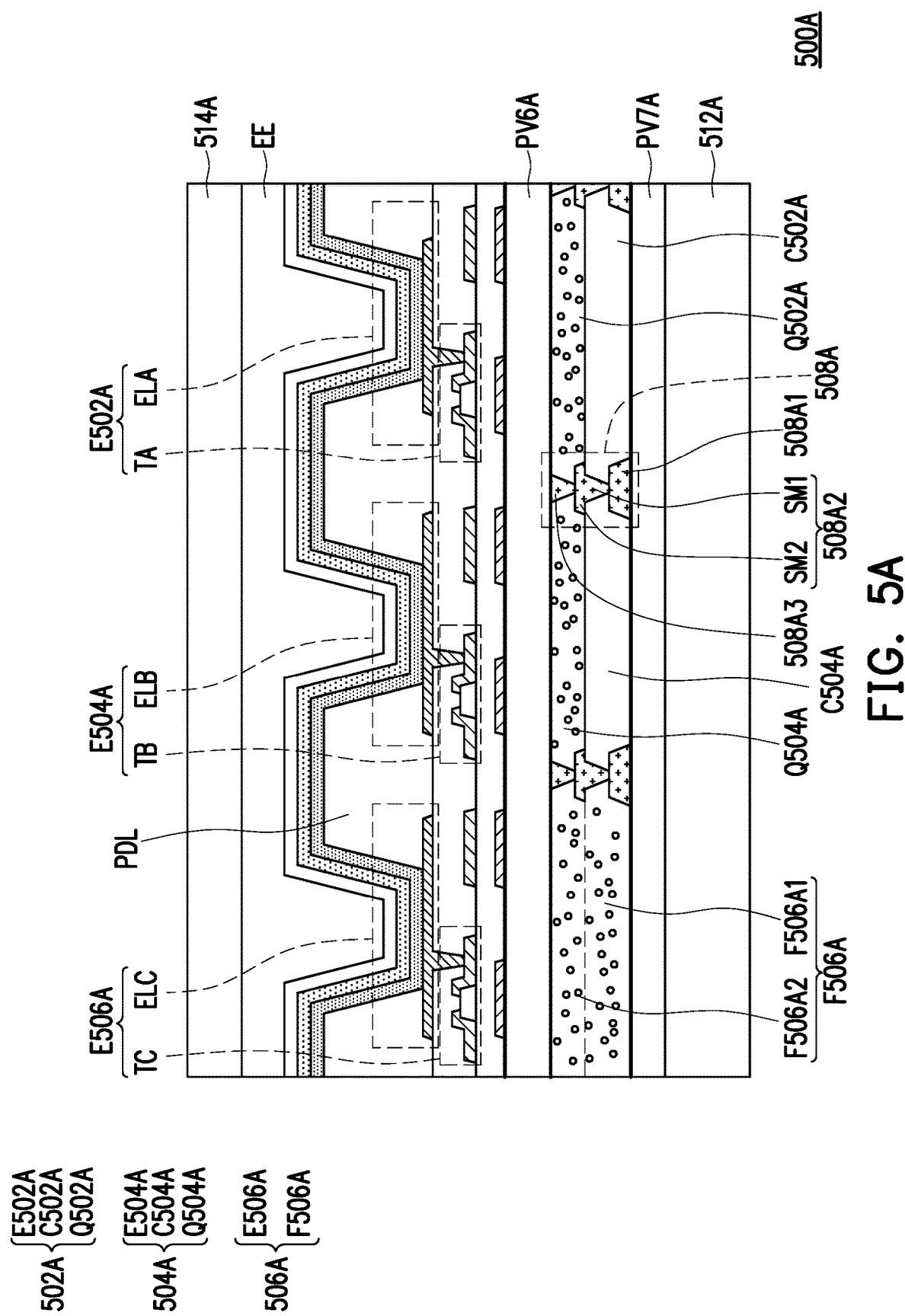

FIG. 5A is a partial cross-sectional view of a display device according to another embodiment of the disclosure. A display device 500A includes a red pixel unit 502A, a green pixel unit 504A, a blue pixel unit 506A and a black matrix 508A. The red pixel unit 502A, the green pixel unit 504A, the blue pixel unit 506A and the black matrix 508A are all disposed between a substrate 512A and a substrate 514A. The red pixel unit 502A includes a light emitting element E502A, a light conversion element Q502A and a color filter C502A. The light conversion element Q502A is disposed between the light emitting element E502A and the color filter C502A. The green pixel unit 504A includes a light emitting element E504A, a light conversion element Q504A and a color filter C504A. The light conversion element Q504A is disposed between the light emitting element E504A and the color filter C504A. The blue pixel unit 506A includes a light emitting element E506A and a filling element F506A. The filling element F506A is disposed between the light emitting element E502A and the substrate 512A. In FIG. 5A, the display device 500A may further include a passivation layer PV6A and a passivation layer PV7A. The light emitting element E502A, the light emitting element E504A and the light emitting element E506A are disposed between the passivation layer PV6A and the substrate 514A. The light conversion element Q502A, the light conversion element Q504A, the color filter C502A, the color filter C504A and the filling element F506A are disposed between the passivation layer PV7A and the passivation layer PV6A. In addition, the passivation layer PV7 may contact the substrate 512A, but not limited thereto.

The light emitting element E502A includes the active element TA and the light emitting unit ELA. The light emitting element E504A includes the active element TB and the light emitting unit ELB. The light emitting element E506A includes the active element TC and the light emitting unit ELC. The specific structures and designs of the active element TA, the active element TB, the active element TC, the light emitting unit ELA, the light emitting unit ELB and the light emitting unit ELC are substantially the same as those in the embodiment of FIG. 3A, which will not be repeated hereinafter. Similar to the embodiment of FIG. 3A described above, the light emitting unit ELA, the light emitting unit ELB and the light emitting unit ELC may be spaced apart by the pixel defining layer PDL.

In this embodiment, lights emitted by the light emitting element E502A, the light emitting element E504A and the light emitting element E506A are, for example, emitted away from the substrate 514A towards the active elements TA, TB and TC. In other words, a light displayed by the display device 500A is emitted from the substrate 512A. The light emitting element E502A, the light emitting element E504A and the light emitting element E506A are, for example, designed to be bottom emission type. In this embodiment, the electrode material layer EE of the light emitting element E502A, the light emitting element E504A, and the light emitting element E506A may be, for example, a metal layer, which may fill in an uneven structure formed by the pixel definition layer PDL, for example. In some embodiments, the electrode material layer EE may be a metal layer with a thickness thicker than those of the electrode E1A, the electrode E1B and the electrode E1C (marked in FIG. 3A), or a metal layer with a resistivity higher than those of the electrode E1A, the electrode E1B and the electrode E1C (marked in FIG. 3A). The electrode material layer EE may contact the substrate 514A. However, in other embodiments, a buffer layer may be further provided between the electrode material layer EE and the substrate 514A to improve an adhesion of the electrode material layer EE and the substrate 514A. In some embodiments, the electrode material layer EE may have a light reflection property and is suitable for reflecting the lights emitted by the light emitting element E502A, the light emitting element E504A and the light emitting element E506A to be towards the substrate 512A, but not limited thereto.

The black matrix 508A of the display device 500A includes a sub matrix 508A1, a sub matrix 508A2 and a sub matrix 508A3 sequentially stacked on the substrate 512A. When fabricating the display device 500A, the sub matrix 508A1 may first be fabricated by the photo lithography. Then, the color filter C502A, the color filter C504A and a first filling layer F506A1 of the filling element F506A may be fabricated in an opening defined by the sub matrix 508A1. Here, the sub matrix 508A1 spaces apart the color filter C502A, the color filter C504A and the first filling layer F506A from each other. Then, the sub matrix 508A2 is fabricated on the sub matrix 508A1, and the sub matrix 508A2 includes the matrix portion SM1 and the matrix portion SM2 sequentially stacked on the matrix 508A1. The matrix portion SM1 of the sub matrix 508A2 is filled in a gap between the color filter C502A, the color filter C504A and the first filling layer F506A. The matrix portion SM2 of the sub matrix 508A2 forms a structure that protrudes away from the substrate 512A relative to the color filter C502A, the light color filter C504A and the first filling layer F506A1.

Next, the light conversion element Q502A, the light conversion element Q504A and a second filling layer F506A2 of the filling element F506A are fabricated in an opening defined by the matrix portion SM2 of the sub matrix 508A2. Then, the sub matrix 508A3 is fabricated on the 508A2 so that the sub matrix 508A3 is filled between the light conversion element Q502A, the light conversion element Q504A and the second filling layer F506A2. In some embodiments, the sub matrix 508A1 and the matrix portion SM2 may have a trapezoid shape narrower in direction farther away from the substrate 512A. The sub matrix 508A3 and the matrix portion SM1 may have a trapezoid shape wider in direction farther away from the substrate 512A, but not limited thereto. Further, in some embodiments, the sub matrix 508A1, the sub matrix 508A2 and the sub matrix 508A3 may be fabricated on the substrate 512A by the photo lithography.

Figure 5B:
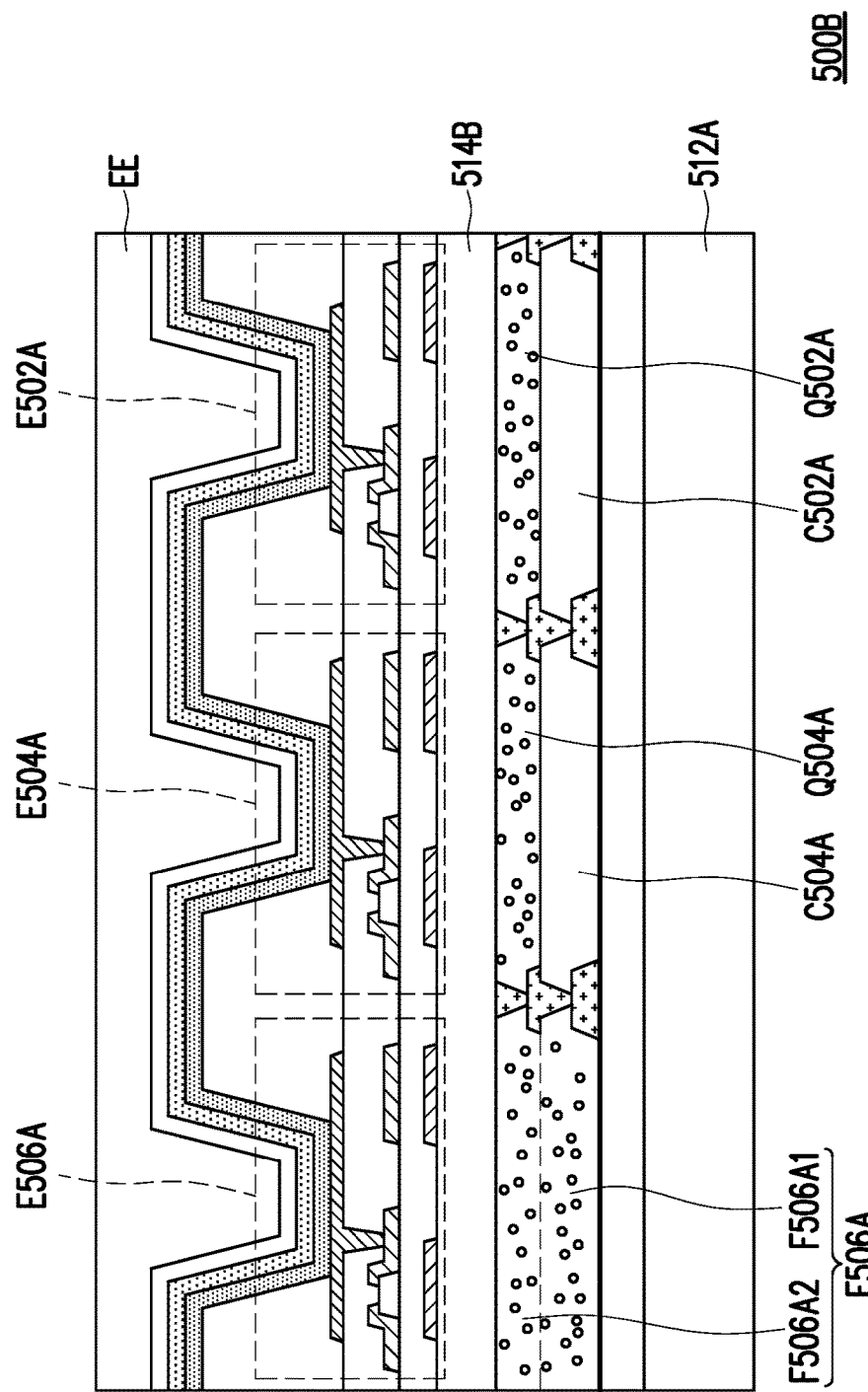

FIG. 5B is a partial cross-sectional view of a display device according to another embodiment of the disclosure. Because a display device 500B of FIG. 5B is substantially the same as the display device 500A of FIG. 5A, the difference between the two embodiments is mainly an arrangement position of a substrate 514B. The display device 500B includes the red pixel unit 502A, the green pixel unit 504A and a blue pixel unit 506A. The red pixel unit 502A includes the light emitting element E502A, the color filter C502A and the light conversion element Q502A. The green pixel unit 504A includes the light emitting element E504A, the color filter C504A and the light conversion element Q504A. The blue pixel unit 506A includes the light emitting element E506A and the filling element F506A. In the display device 500B, because the substrate 514B is used to replace the passivation layer PV6A in FIG. 5A, the display device 500B does not have the passivation layer PV6A.

The light emitting element E502A of the red pixel unit 502A, the light emitting element E504A of the green pixel unit 504A and the light emitting element E506A of the blue pixel unit 506A may be disposed on a first side of the substrate 514B. The light conversion element Q502A and the color filter C502A of the red pixel unit 502A, the light conversion element Q504A and the color filter C504A of the green pixel unit 504A and the light conversion element Q506A and the color filter C506A of the blue pixel unit 506A are disposed on a second side of the substrate 514B. The first side and the second side are opposite sides. In addition, the light emitting element E502A, the light emitting element E504A and the light emitting element E506A may share the electrode material layer EE, and the electrode material layer EE is provided as an outermost component of the display device 500B without being covered by the substrate. In some embodiments, the electrode material layer EE may be covered by another substrate, as shown by FIG. 5A.

Figure 5C:
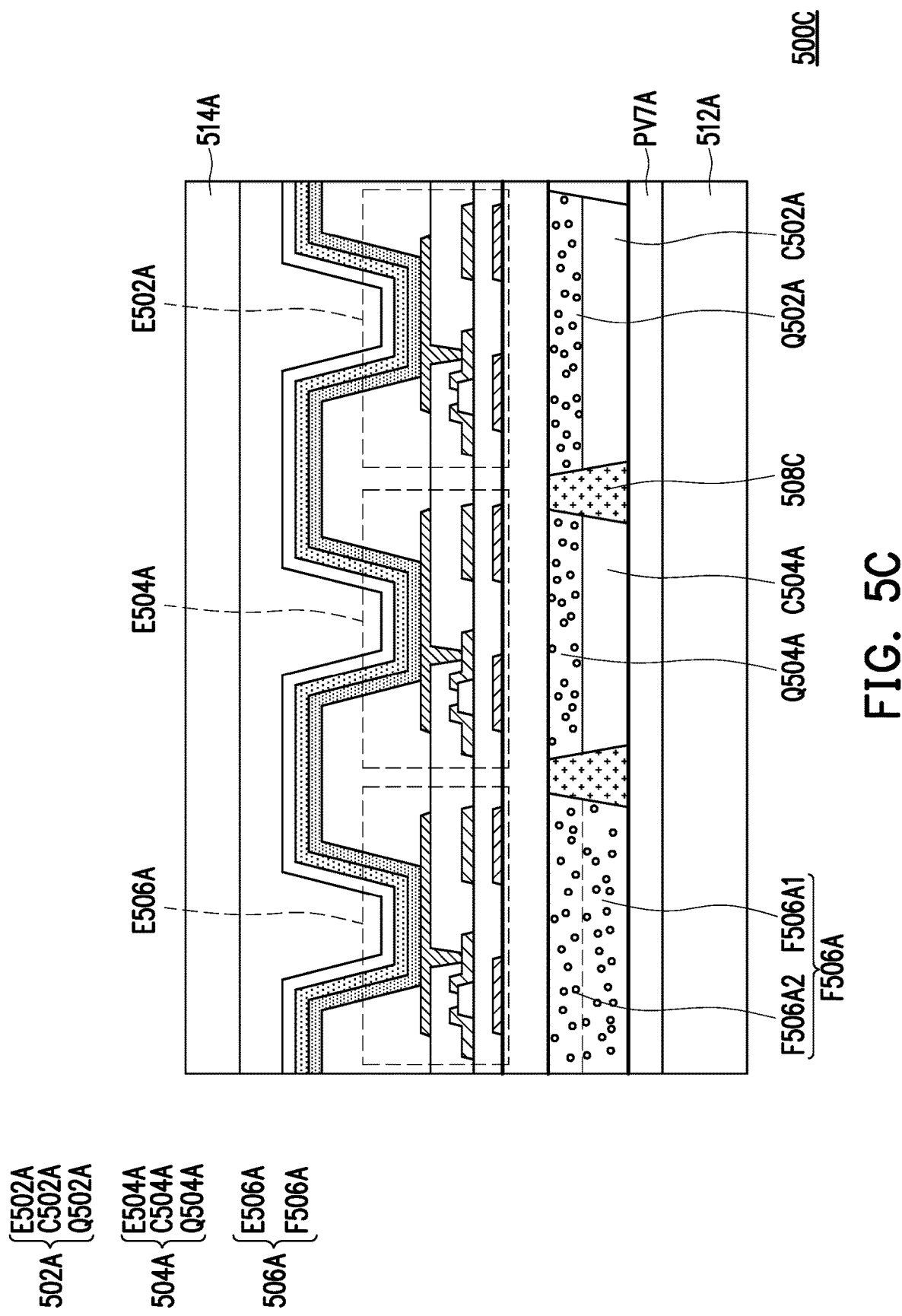

FIG. 5C is a cross-sectional view of a display device according to another embodiment of the disclosure. Because a display device 500C of FIG. 5C is substantially the same as the display device 500A of FIG. 5A, the differences between the two embodiments are mainly described below. The display device 500C includes the red pixel unit 502A, the green pixel unit 504A and the blue pixel unit 506A. The red pixel unit 502A includes the light emitting element E502A, the color filter C502A and the light conversion element Q502A. The green pixel unit 504A includes the light emitting element E504A, the color filter C504A and the light conversion element Q504A. The blue pixel unit 506A includes the light emitting element E506A and the filling element F506A. The red pixel unit 502A, the green pixel unit 504A and the blue pixel unit 506A are all disposed between the substrate 512A and the substrate 514A. Further, a height of a black matrix 508C protruding away from the substrate 512A by the passivation layer PV7 is greater so that the color filter C502A stacked with the light conversion element Q502A does not exceed the height of the black matrix 508C. Meanwhile, the color filter C504A stacked with the light conversion element Q504A does not exceed the height of the black matrix 508C, and the filling element F506 does not exceed the height of the black matrix 508C either.

In some embodiments, after the black matrix 508C is fabricated on the substrate 512A, a plurality of groove structures may be formed on the substrate 512A. The color filter C502A, the color filter C504A and the first filling layer F506A1 of the filling element F506A may be formed on the passivation layer PV7A by the inkjet printing. Because the height of the black matrix 508C is high, the droplets used during the inkjet printing are not prone to spill over and thus mixing between different materials may be prevented. After inkjet droplets are cured in the corresponding grooves to form the color filter C502A, the color filter C504A and the first filling layer F506A1 of the filling element F506A, the light conversion element Q502A, the light conversion element Q504 and the second filling layer F506A2 of the filling element F506A may be respectively formed on the color filter C502A, the color filter C504A and the first filling layer F506A1 of the filling element F506A by the inkjet printing. In other embodiments, the filling element F506A may be fabricated by using one single inkjet printing. Accordingly, the filling element F506A may be a single film layer without being divided into the first filling layer F506A1 and the second filling layer F506A2.

Figure 5D:
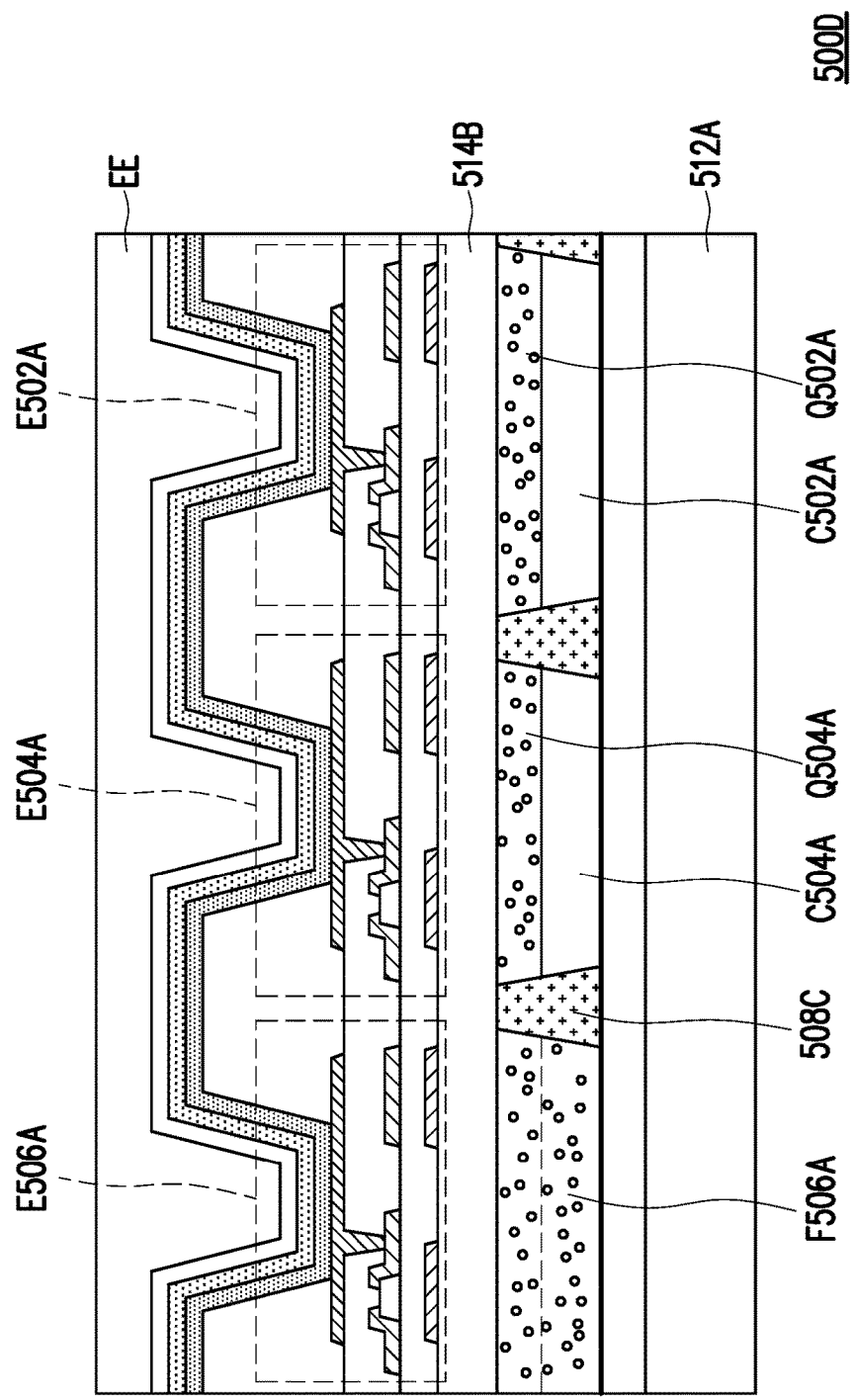

FIG. 5D is a cross-sectional view of a display device according to another embodiment of the disclosure. Because a display device 500D of FIG. 5D is substantially the same as the display device 500C of FIG. 5C, the differences between the two embodiments are mainly described below. A display device 500D includes the red pixel unit 502A, the green pixel unit 504A, the blue pixel unit 506A and the black matrix 508C. The red pixel unit 502A includes the light emitting element E502A, the color filter C502A and the light conversion element Q502A. The green pixel unit 504A includes the light emitting element E504A, the color filter C504A and the light conversion element Q504A. The blue pixel unit 506A includes the light emitting element E506A and the filling element F506A. The light emitting element E502A of the red pixel unit 502A, the light emitting element E504A of the green pixel unit 504A and the light emitting element E506A of the blue pixel unit 506A may be disposed on a first side of the substrate 514B. The light conversion element Q502A and the color filter C502A of the red pixel unit 502A, the light conversion element Q504A and the color filter C504A of the green pixel unit 504A and the light conversion element Q506A and the color filter C506A of the blue pixel unit 506A are disposed on a second side of the substrate 514A. The first side and the second side are opposite sides. The light emitting element E502A, the light emitting element E504A and the light emitting element E506A may share the electrode material layer EE, and the electrode material layer EE is provided as an outermost component of the display device 500D without being covered with the substrate. In addition, the substrate 514B may replace the passivation layer PV6A in the embodiment of FIG. 5A.

Figure 5E:
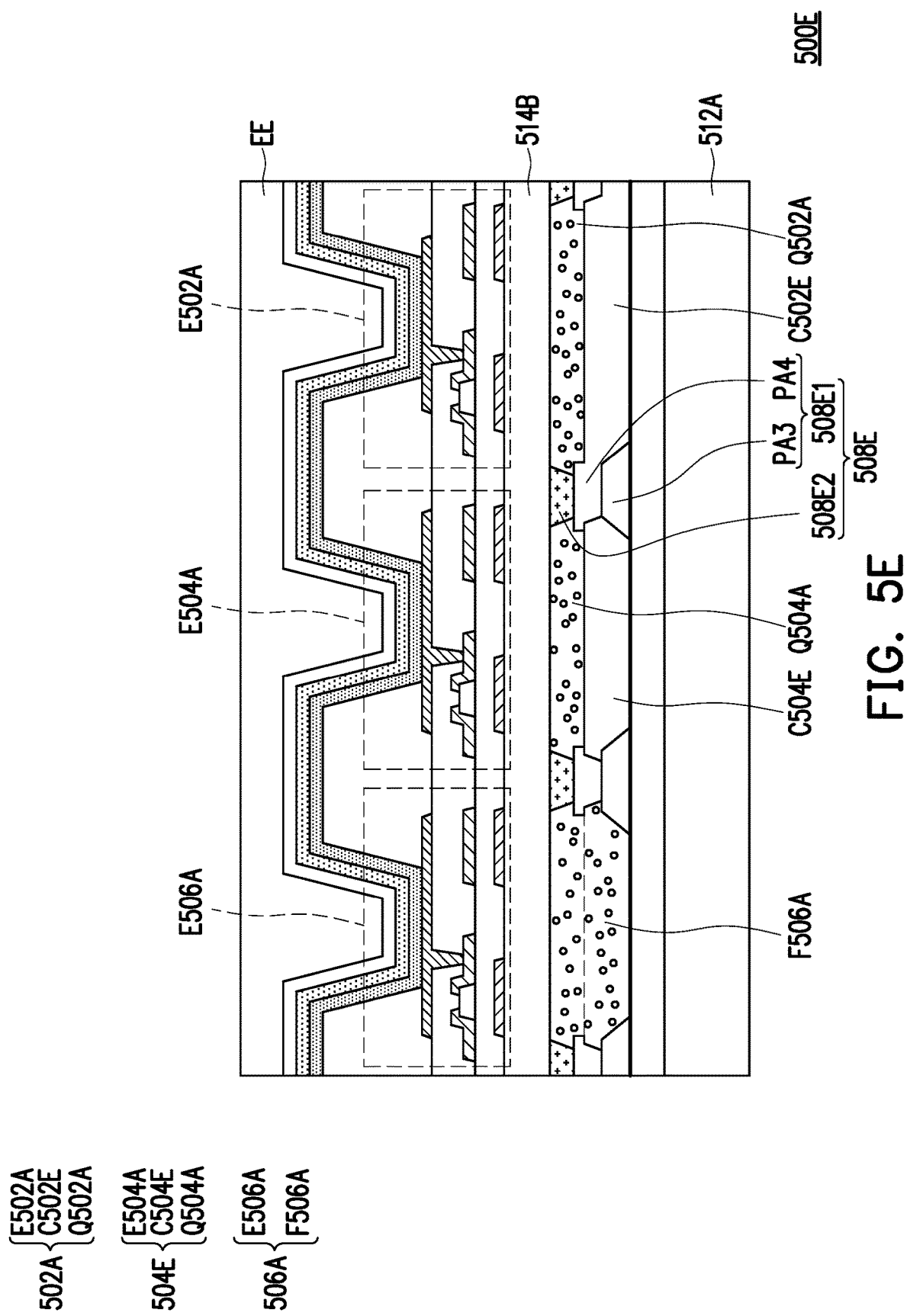

FIG. 5E is a cross-sectional view of a display device according to another embodiment of the disclosure. Because a display device 500E of FIG. 5E is substantially the same as the display device 500B of FIG. 5B, the differences between the two embodiments are mainly described below. The display device 300E includes a red pixel unit 502E, a green pixel unit 504E and the blue pixel unit 506A. The red pixel unit 502E includes the light emitting element E502A, a color filter C502E and the light conversion element Q502A. The green pixel unit 504E includes the light emitting element E504A, the color filter C504E and the light conversion element Q504A. The blue pixel unit 506A includes the light emitting element E506A and the filling element F506A. In addition, a black matrix 508E of the display device 500E includes a sub matrix 508E1 and a sub matrix 508E2. The sub matrix 508E1 may be formed by stacking a peripheral portion PA3 and a peripheral portion PA4.

In this embodiment, the peripheral portion PA3 and the color filter C504E are the same film layer, and the peripheral portion PA4 and the color filter C502E are the same film layer. For instance, the peripheral portion PA3 may be simultaneously fabricated on the substrate 512A when fabricating the color filter C504E. After the color filter C504E is fabricated, the color filter C502E and the peripheral portion PA4 may be fabricated. Since the color filter C504E is manufactured earlier than the color filter C502E, the peripheral portion PA4 may be stacked on the peripheral portion PA3. That is to say, the peripheral portion PA3 is located between the peripheral portion PA4 and the substrate 512A, but not limited thereto. In addition, the sub matrix 508E2 is disposed on the peripheral portion PA4. In an embodiment, the sub matrix 508E2 may have a trapezoid shape wider in direction farther away from the substrate 512A, but not limited thereto.

FIG. 5F is a cross-sectional view of a display device according to another embodiment of the disclosure. Because a display device 500F of FIG. 5F is substantially the same as the display device 500A of FIG. 5A, the differences between the two embodiments are mainly described below. The display device 500F includes a red pixel unit 502F, a green pixel unit 504F and a blue pixel unit 506F. The red pixel unit 502F, the green pixel unit 504F and the blue pixel unit 506F are all disposed between the substrate 512A and the substrate 514A. The red pixel unit 502F includes the light emitting element E502A, a color filter C502F and a light conversion element Q502F. The green pixel unit 504F includes the light emitting element E504A, a color filter C504F and a light conversion element Q504F. The blue pixel unit 506F includes the light emitting element E506A and a filling element F506F. In addition, a black matrix 508F of the display device 500F includes a sub matrix 508F1, a sub matrix 508F2 and a peripheral portion PA5.

Specifically, the peripheral portion PA5 is disposed on the passivation layer PV7A; the sub matrix 508F2 is disposed on the peripheral portion PA5; and the sub matrix 508F1 is stacked on the sub matrix 508F2. The peripheral portion PA5 and the color filter C502F may be the same film layer. That is to say, the peripheral portion PA5 may be simultaneously fabricated when fabricating the color filter C502F in this embodiment. The peripheral portion PA5 may be used to separate the color filter C502F, the color filter C504F and a first filling layer F506F1 of the filling element F506F. The sub matrix 508F2 includes a matrix portion SM3 and a matrix portion SM4 sequentially stacked on the peripheral portion PA5. Here, the matrix portion SM3 is filled in a gap between the color filter C502F, the color filter C504F and the first filling layer F506F1. The matrix portion SM4 forms a structure that protrudes away from the substrate 512A relative to the color filter C502F, the light color filter C504F and the first filling layer F506F1. The matrix portion SM4 separates the light conversion element Q502F, the light conversion element Q504F and a second filling layer F506F2 of the filling element F506F.

Figure 5G:
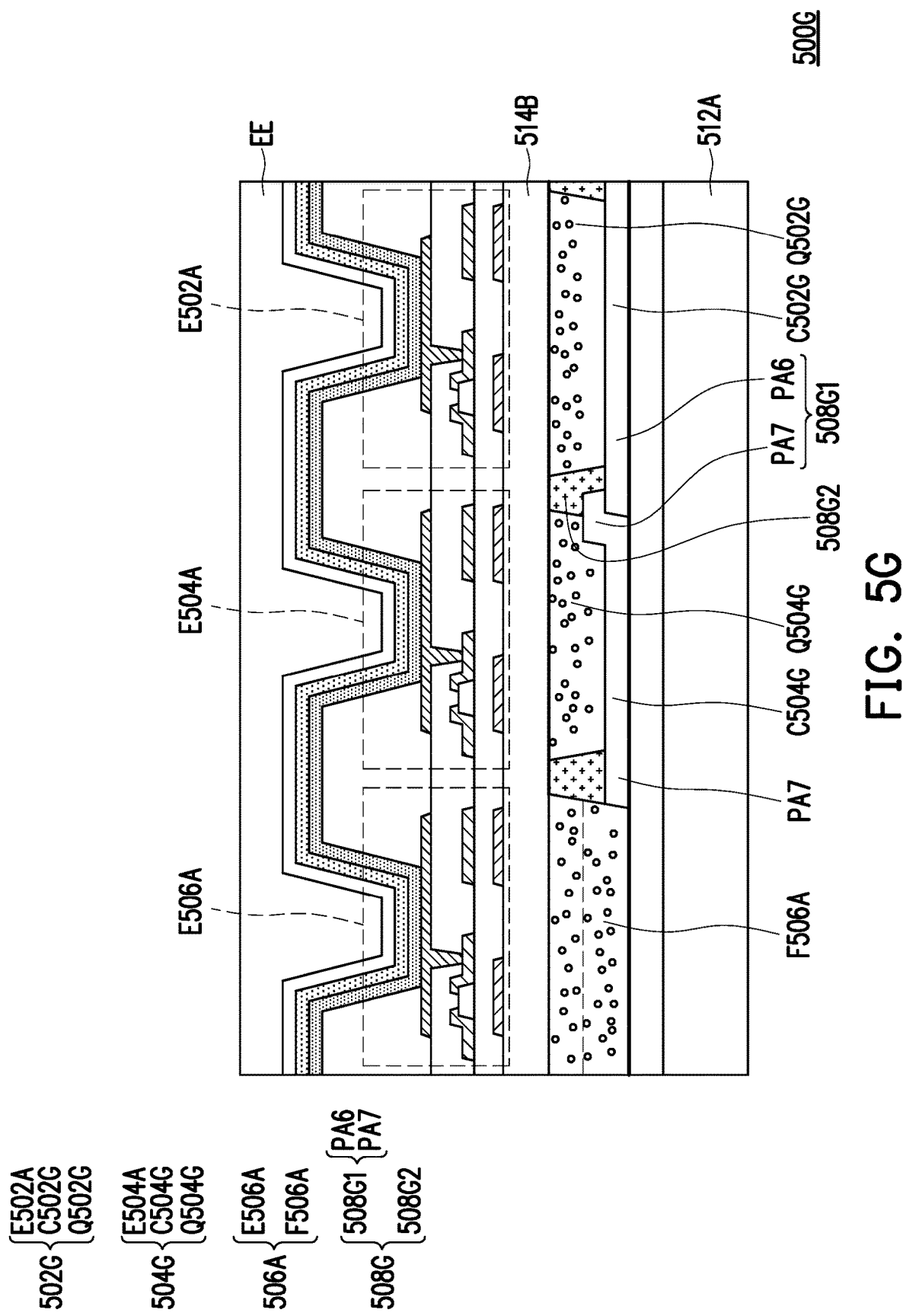

FIG. 5G is a cross-sectional view of a display device according to another embodiment of the disclosure. Because a display device 500G of FIG. 5G is substantially the same as the display device 500A of FIG. 5A, the differences between the two embodiments are mainly described below. The display device 500G includes a red pixel unit 502G, a green pixel unit 504G and the blue pixel unit 506A. The red pixel unit 502G includes the light emitting element E502A, a color filter C502G and a light conversion element Q502G. The green pixel unit 504G includes the light emitting element E504A, a color filter C504G and a light conversion element Q504G. The blue pixel unit 506A includes the light emitting element E506A and the filling element F506A. In addition, a black matrix 508G of the display device 500G includes a sub matrix 508G1 and a sub matrix 508G2. Here, the sub matrix 508G1 may include a peripheral portion PA6 and a peripheral portion PA7. The light emitting element E502A, the light emitting element E504A and the light emitting element E506A are disposed on the first side of the substrate 514B. The light conversion element Q502G and the color filter C502G of the red pixel unit 502G, the light conversion element Q504G and the color filter C504G of the green pixel unit 504G and the filling element F506A of the blue pixel unit 506G are disposed on the second side of the substrate 514A. The first side and the second side are opposite sides.

In an embodiment, the peripheral portion PA6 and the color filter C502G are the same film layer, and the peripheral portion PA7 and the color filter C504G are the same film layer. For instance, the peripheral portion PA6 may be simultaneously fabricated on the substrate 512A when fabricating the color filter C502G. After the color filter C502G is fabricated, the color filter C504G and the peripheral portion PA7 may be fabricated. Since the color filter C502G is manufactured earlier than the color filter C504G, the peripheral portion PA7 may be partially stacked on the peripheral portion PA6. However, the peripheral portion PA7 may also include a portion directly disposed on the passivation layer PV7A. In addition, the sub matrix 508G2 is disposed on the peripheral portion PA7. In some areas, the sub matrix 508G2 may partially contact the peripheral portion PA6 and partially contact the peripheral portion PA7.

In an embodiment, the sub matrix 508G2 may have a trapezoid shape narrower in direction farther away from the substrate 512A, but not limited thereto. In addition, the sub matrix 508G2 protrudes away from the substrate 512A relative to the color filter C502G and the color filter C504G. In some embodiments, the light conversion element Q502G, the light conversion element Q504G and the filling element F506A may also be fabricated in an opening defined by the sub matrix 508G2 by the inkjet. A height of the sub matrix 508G2 helps to prevent the droplets used during the inkjet printing from spilling over and thus mixing between different materials may be prevented.

Figure 5H:
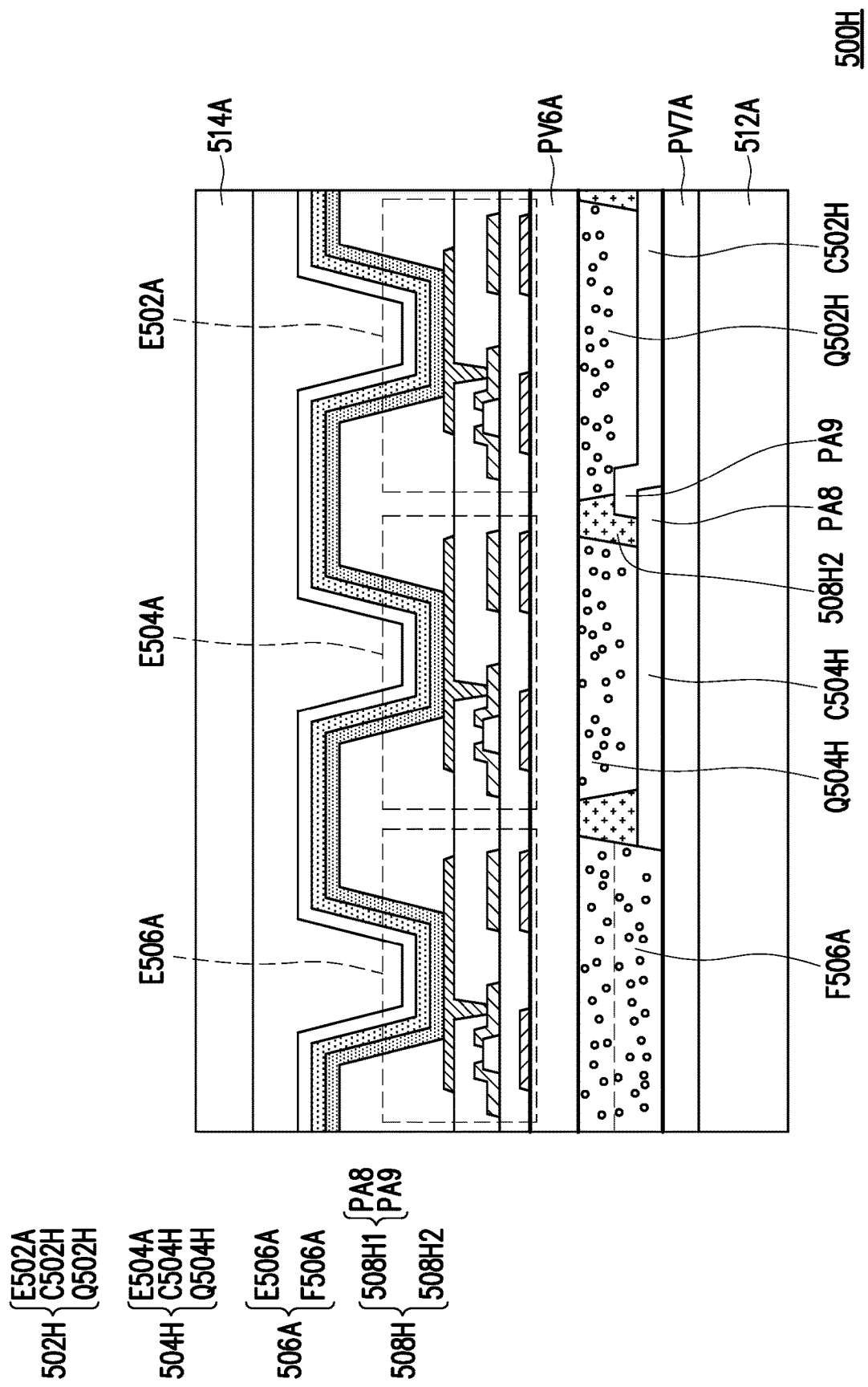

FIG. 5H is a cross-sectional view of a display device according to another embodiment of the disclosure. Because a display device 500H of FIG. 5H is substantially the same as the display device 500A of FIG. 5A, the differences between the two embodiments are mainly described below. The display device 500H includes a red pixel unit 502H, a green pixel unit 504H and the blue pixel unit 506A. The red pixel unit 502H, the green pixel unit 504H and the blue pixel unit 506A are all disposed between the substrate 512A and the substrate 514A. The red pixel unit 502H includes the light emitting element E502A, a color filter C502H and a light conversion element Q502H. The green pixel unit 504H includes the light emitting element E504A, a color filter C504H and a light conversion element Q504H. The blue pixel unit 506A includes the light emitting element E506A and the filling element F506A. In addition, a black matrix 508H of the display device 500H includes a sub matrix 508H1 and a sub matrix 508H2. Here, the sub matrix 508H1 may include a peripheral portion PA8 and a peripheral portion PA9.

The peripheral portion PA8 and the color filter C504H are the same film layer, and the peripheral portion PA9 and the color filter C502H are the same film layer. For instance, the peripheral portion PA8 may be simultaneously fabricated on the substrate 512A when fabricating the color filter C504H. After the color filter C504H is fabricated, the color filter C502H and the peripheral portion PA9 may be fabricated. Since the color filter C504H is manufactured earlier than the color filter C502H, the peripheral portion PA9 may be partially stacked on the peripheral portion PA8. However, the peripheral portion PA9 may also include a portion directly disposed on the passivation layer PV7A. In addition, the sub matrix 508H2 is disposed on the peripheral portion PA9. In some areas, the sub matrix 508H2 may partially contact the peripheral portion PA8 and partially contact the peripheral portion PA9. In addition, the sub matrix 508H2 may have a trapezoid shape narrower in direction farther away from the substrate 512A, but not limited thereto. In addition, the sub matrix 508H2 protrudes away from the substrate 512A relative to the color filter C502H and the color filter C504H. In some embodiments, the light conversion element Q502H, the light conversion element Q504H and the filling element F506A may also be fabricated in an opening defined by the sub matrix 508H2 by the inkjet printing. A height of the sub matrix 508H2 helps to prevent the droplets used during the inkjet printing from spilling over and thus mixing between different materials may be prevented. Here, the passivation layer PV6A may be disposed on a top surface of the sub matrix 508H2 and may contact top surfaces of the light conversion element Q502H, the light conversion element Q504H and the filling element F506A, but not limited thereto.

Figure 5I:
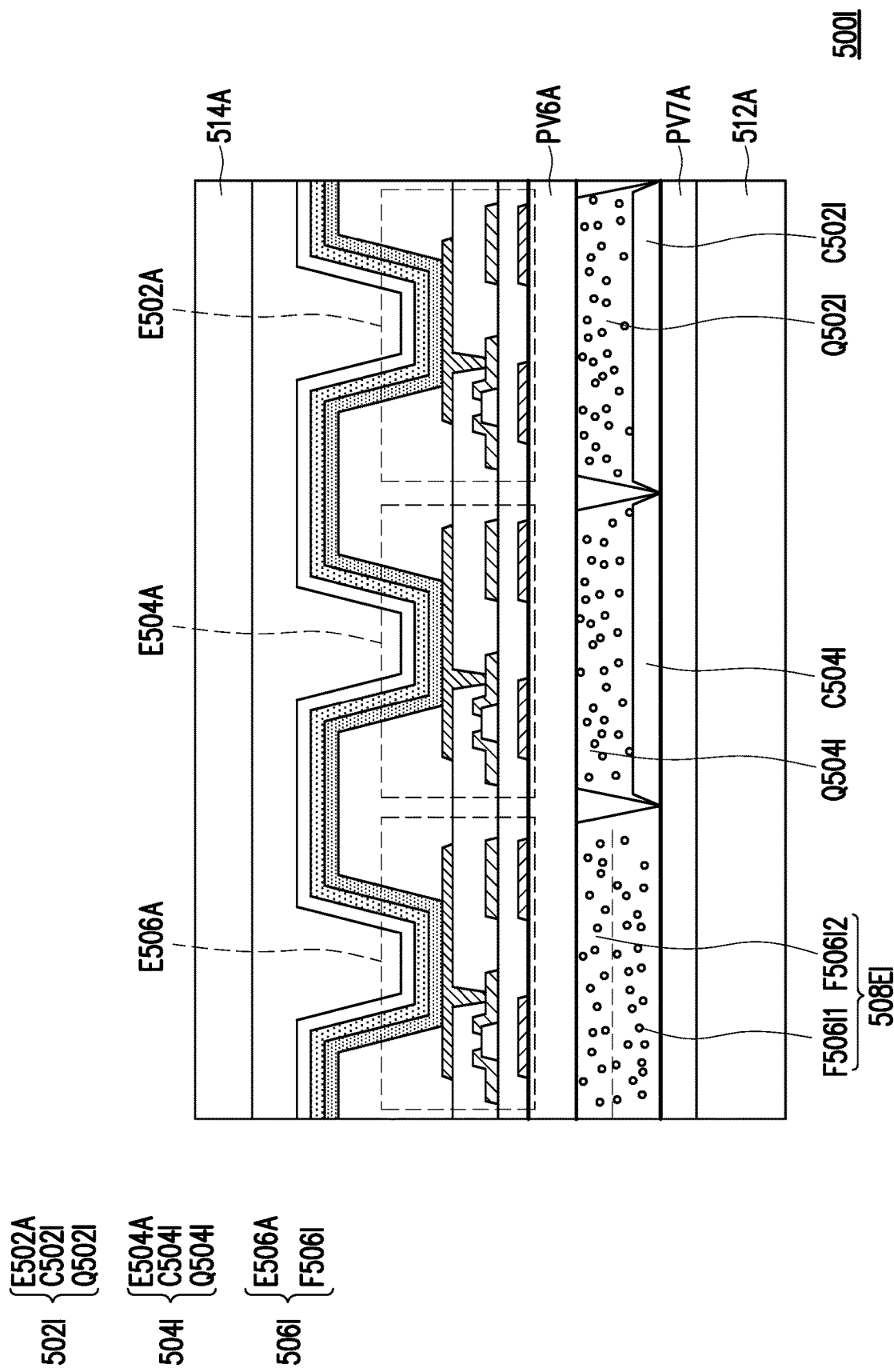

FIG. 5I is a cross-sectional view of a display device according to another embodiment of the disclosure. Because a display device 500I of FIG. 5I is substantially the same as the display device 500A of FIG. 5A, the differences between the two embodiments are mainly described below. The display device 500I of FIG. 5I includes a red pixel unit 502I, a green pixel unit 504I and a blue pixel unit 506I. The red pixel unit 502I, the green pixel unit 504I and the blue pixel unit 506I are all disposed between the substrate 512A and the substrate 514A. The red pixel unit 502I includes the light emitting element E502A, a light conversion element Q502I and a color filter C502I. The green pixel unit 504I includes the light emitting element E504A, a light conversion element Q504I and a color filter C504I. The blue pixel unit 506I includes the light emitting element E506A and a filling element F506I. The specific structures and designs of the light emitting element E502A, the light emitting element E504A and the light emitting element E506A are substantially the same as those in the embodiment of FIG. 5A, which will not be repeated hereinafter.

In this embodiment, because the display device 500I does not include the black matrix, the light conversion element Q502I, the light conversion element Q504I and a first filling layer F506I1 of the filling element F506I are disposed adjacent to each other. The light conversion element Q502I is stacked on the color filter C502I. The light conversion element Q504I is stacked on the color filter C504I. A second filling layer F506I2 of the filling element F506E is stacked on the first filling layer F506I1. The color filter C502I, the light conversion element Q502I, the color filter C504I, the light conversion element Q504I and the filling element F506I may be fabricated by, for example, the photo lithography. Therefore, even though the display device 500I does not include the black matrix, the materials of the light conversion element Q502I and the light conversion element Q504I will not mix with each other, and the materials of the color filter C502I and the color filter C504I will not mix with each other. In addition, the materials of the color filter C502I, the light conversion element Q502I, the color filter C504I and the light conversion element Q504I will not contaminate with the material of the filling element F506E either.

Figure 5J:
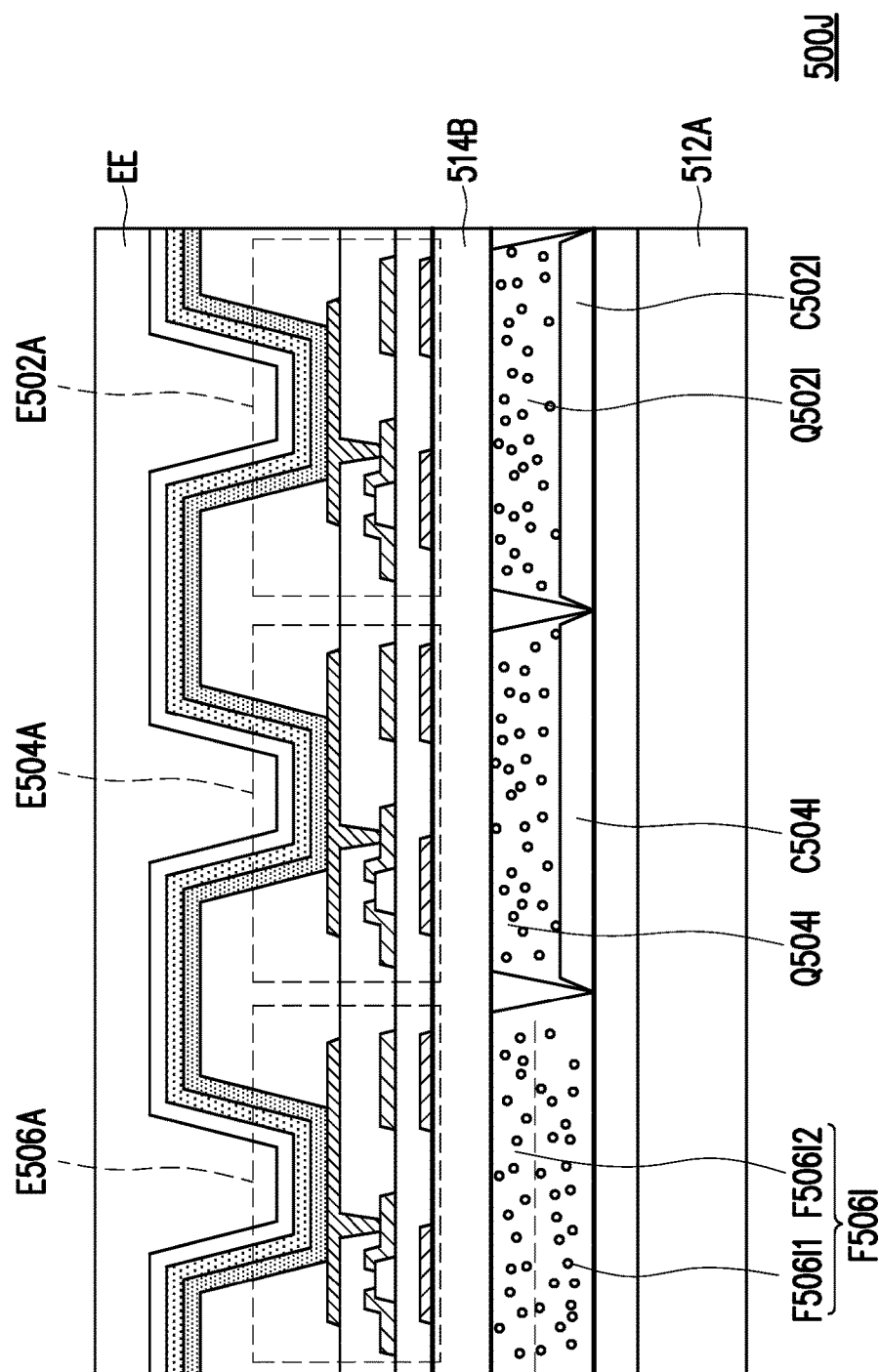

FIG. 5J is a partial cross-sectional view of a display device according to another embodiment of the disclosure. Because a display device 500J of FIG. 5J is substantially the same as the display device 500I of FIG. 5I, the difference between the two embodiments is mainly an arrangement position of the substrate 514B. The display device 500J includes the red pixel unit 502I, the green pixel unit 504I and the blue pixel unit 506I. The red pixel unit 502I includes the light emitting element E502A, the color filter C502I and the light conversion element Q502I. The green pixel unit 504I includes the light emitting element E504A, the color filter C504I and the light conversion element Q504I. The blue pixel unit 506I includes the light emitting element E506A and the filling element F506I. In the display device 500I, the light emitting element E502A of the red pixel unit 502I, the light emitting element E504A of the green pixel unit 504I and the light emitting element E506A of the blue pixel unit 506I may be disposed on the first side of the substrate 514B. The light conversion element Q502I and the color filter C502I of the red pixel unit 502I, the light conversion element Q504I and the color filter C504I of the green pixel unit 504I and the filling element F506I of the blue pixel unit 506I are disposed on the second side of the substrate 514B. The first side and the second side are opposite sides. In addition, the light emitting element E502I, the light emitting element E504I and the light emitting element E506I may share the electrode material layer EE, and the electrode material layer EE is provided as an outermost component of the display device 500I without being covered with the substrate. The foregoing embodiments of FIG. 5A to FIG. 5J include two substrates, but the disclosure is not limited thereto. For instance, the substrate 514A in FIG. 5A, FIG. 5C, FIG. 5F, FIG. 5H and FIG. 5I may be omitted so that a single substrate structure is provided.

Figure 6A:
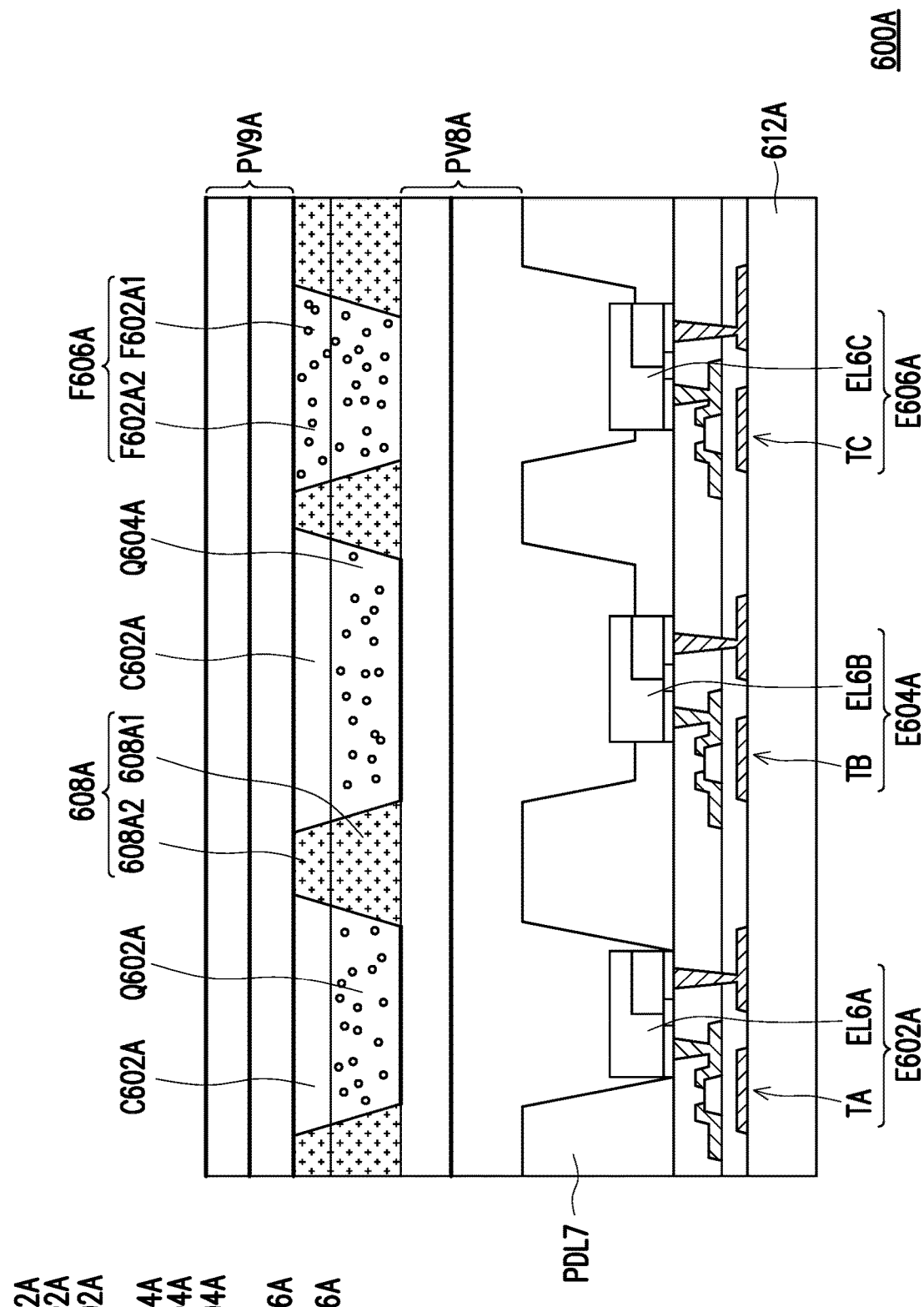
FIG. 6A to FIG. 6C are cross-sectional views of a display device according to an embodiment of the disclosure.

FIG. 6A is a partial cross-sectional view of a display device according to an embodiment of the disclosure. In FIG. 6A, a display device 600A includes a red pixel unit 602A, a green pixel unit 604A, a blue pixel unit 606A, a black matrix 608A and a substrate 612A. The red pixel unit 602A, the green pixel unit 604A, the blue pixel unit 606A and the black matrix 608A are all disposed on the substrate 612A. The red pixel unit 602A includes a light emitting element E602A, a light conversion element Q602A and a color filter C602A. The green pixel unit 604A includes a light emitting element E604A, a light conversion element Q604A and a color filter C604A. The blue pixel unit 606A includes a light emitting element E606A and a filling element F606A. In this embodiment, the light emitting element E602A, the light emitting element E604A and the light emitting element E606A are all disposed on the substrate 612A, and a passivation layer PV8A is disposed on the substrate 612A. The black matrix 608A, the light conversion element Q602A, the color filter C602A, the light conversion element Q604A, the color filter C604A and the filling element F606A are all disposed on the passivation layer PV8A. In addition, a passivation layer PV9A is further provided on the substrate 612A to cover the color filter C602A, the color filter C604A, the filling element F606A and the black matrix 608A.

The light emitting element E602A includes the active element TA and a light emitting unit EL6A. The light emitting element E604A includes the active element TB and a light emitting unit EL6B. The light emitting element E606A includes the active element TC and a light emitting unit EL6C. In this embodiment, the light emitting unit EL6A, the light emitting unit EL6B and the light emitting unit EL6C are respectively connected to the active element TA, the active element TB and the active element TC, and are not connected to each other. Each of the light emitting unit EL6A, the light emitting unit EL6B, and the light emitting unit EL6C is, for example, a light emitting diode die or a packaged light emitting diode package. Lights emitted by the light emitting element E602A, the light emitting element E604A and the light emitting element E606A are emitted away from the active element TA, the active element TB and the active element TC. A pixel definition layer PDL7 is provided on the substrate 612A, which surrounds peripheries of the light emitting unit EL6A, the light emitting unit EL6B and the light emitting unit EL6C to separate the light emitting unit EL6A, the light emitting unit EL6B and the light emitting unit EL6C from each other and ensure that each of the light emitting element E602A, the light emitting element E602B and the light emitting element E602C may emit light independently. In addition, the pixel definition layer PDL7 may be a white insulation layer or a black insulation layer. In some embodiments, the pixel definition layer PDL7 may be used to block lights emitted from the light emitting unit EL6A, the light emitting unit EL6B and the light emitting unit EL6C from a lateral side, and prevent the lights from the light emitting unit EL6A, the light emitting unit EL6B and the light emitting unit EL6C from mixing with each other.

The passivation layer PV8A may be, for example, filled in an uneven structure formed by the pixel definition layer PDL7. The passivation layer PV8A may be formed by stacking a plurality of layers together, but not limited thereto. On the passivation layer PV8A, the light conversion element Q602A is disposed between the passivation layer PV8A and the color filter C602A, and the light conversion element Q604A is disposed between the passivation layer PV8A and the color filter C604A. In this way, the light emitted by the light emitting element E602A will pass through the light conversion element Q602A before entering the color filter C602A. Similarly, the light emitted by the light emitting element E604A will pass through the light conversion element Q604A before entering the color filter C604A. A filtering wavelength of the color filter C602A may correspond to a conversion wavelength of the light conversion element Q602A, and a filter wavelength of the color filter C604A may correspond to a conversion wavelength of the light conversion element Q604A. For example, if the light conversion element Q602A is adapted to convert the blue light or the ultraviolet light into the red light, the color filter C602A is a red filter layer. If the light conversion element Q604A is adapted to convert the blue light or the ultraviolet light into the green light, the color filter C604A is a green filter layer. In this way, the lights emitted by the light emitting unit EL6A and the light emitting unit EL6B may be the blue light or the ultraviolet light. The filling element F606A may not provide a color filtering function or a wavelength conversion function, but allows the light emitted by the light emitting element E606A to pass directly. Therefore, the light emitted by the light emitting unit EL6C of the blue pixel unit 606A is, for example, the blue light. However, in other embodiments, the filling element F606A may be a blue filter layer. In some embodiments, scattering particles may be distributed in the light conversion element Q602A, the light conversion element Q604A and the filling element F606A to provide the function of scattering light. However, the disclosure is not limited in this regard.

In this embodiment, the filling element F606A may include a first filling layer F606A1 and a second filling layer F606A2, and the second filling layer F606A2 is located between the first filling layer F606A1 and the passivation layer PV8A. The black matrix 608A includes a sub matrix 608A1 and a sub matrix 608A2 disposed on the substrate 612A. Here, the sub matrix 608A1 and the sub matrix 608A2 are stacked together and the sub matrix 608A1 is located between the passivation layer PV8A and the sub matrix 608A2. The sub matrix 608A1 is configured to separate the light conversion element Q602A, the light conversion element Q604A and the first filling layer F606A1. The sub matrix 608A2 is configured to separate the color filter C602A, the color filter C604A and the second filling layer F606A2. In this embodiment, the sub matrix 608A1 is disposed between the sub matrix 608A2 and the passivation layer PV8A. In some embodiments, the sub matrix 608A1 may be fabricated on the passivation layer PV8A first, and then the sub matrix 608A2 may be fabricated on the sub matrix 608A1. A width of the sub matrix 608A1 may be greater than a width of the sub matrix 608A2. The sub matrix 608A1 and the sub matrix 608A2 may have a trapezoid shape which is gradually reduced away from the substrate 612A, but not limited thereto.

The light conversion element Q602A and the light conversion element Q604A may be fabricated by the inkjet printing. In some embodiments, after the sub matrix 608A1 is fabricated on the substrate 612A, a inkjet device may be used to drop a light conversion material into a groove defined by the sub matrix 608A1 on the substrate 612A, and then the light conversion material is cured to form the light conversion element Q602A and the light conversion element Q604A. A height of the sub matrix 608A1 protruding away from the substrate 612A by a surface of the passivation layer PV8A helps to ensure that the droplets of the light conversion material will not overflow and thus contamination between different light conversion materials may be reduced. After the light conversion material is cured to form the light conversion element Q602A and the light conversion element Q604A, the sub matrix 608A2 may be fabricated on the sub matrix 608A1. Then, the inkjet device may be used to drop a color filter material into a groove defined by the sub matrix 608A2 on the substrate 612A. In addition, a filling material may also be filled into a groove defined by the sub matrix 608A2 and the sub matrix 608A2 on the substrate 612A. Then, after the color liter material and the filling material are cured, the color filter C602A, the color filter C604A and the filter element F606A may be formed. In some embodiments, the first filling layer F606A1 of the filling element F606A may be fabricated before the sub matrix 608A2 is fabricated, and the second filling layer F606A2 of the filling element F606A may be fabricated after the sub matrix 608A2 is fabricated. In some other embodiments, the filling element F606A may be fabricated by using one single inkjet process without having it done layer by layer. In other words, the filling element F606A may be a single film layer.

A layout of the red pixel unit 602A, the green pixel unit 604A and the blue pixel unit 606A may be similar to the description of the foregoing embodiment. In other words, when the display device 600A is lit, it may be may be observed under the optical microscope that, a lighting area of the red pixel unit 602A is smaller than a lighting area of the green pixel unit 604A and greater than a lighting area of the blue pixel unit 606A. A ratio of the lighting area of the green pixel unit 604A to the lighting area of the red pixel unit 602A is, for example, ranged from 1.02 to 2.90 or ranged from 1.37 to 2.07. In some embodiments, a ratio of the lighting area of the green pixel unit 604A to the lighting area of the blue pixel unit 606A is, for example, ranged from 1.68 to 3.29 or ranged from 1.71 to 2.35. In some embodiments, a ratio of the lighting area of the red pixel unit 602A to the lighting area of the blue pixel unit 606A is, for example, ranged from 1.02 to 1.84 or ranged from 1.03 to 1.37.

Figure 6B:
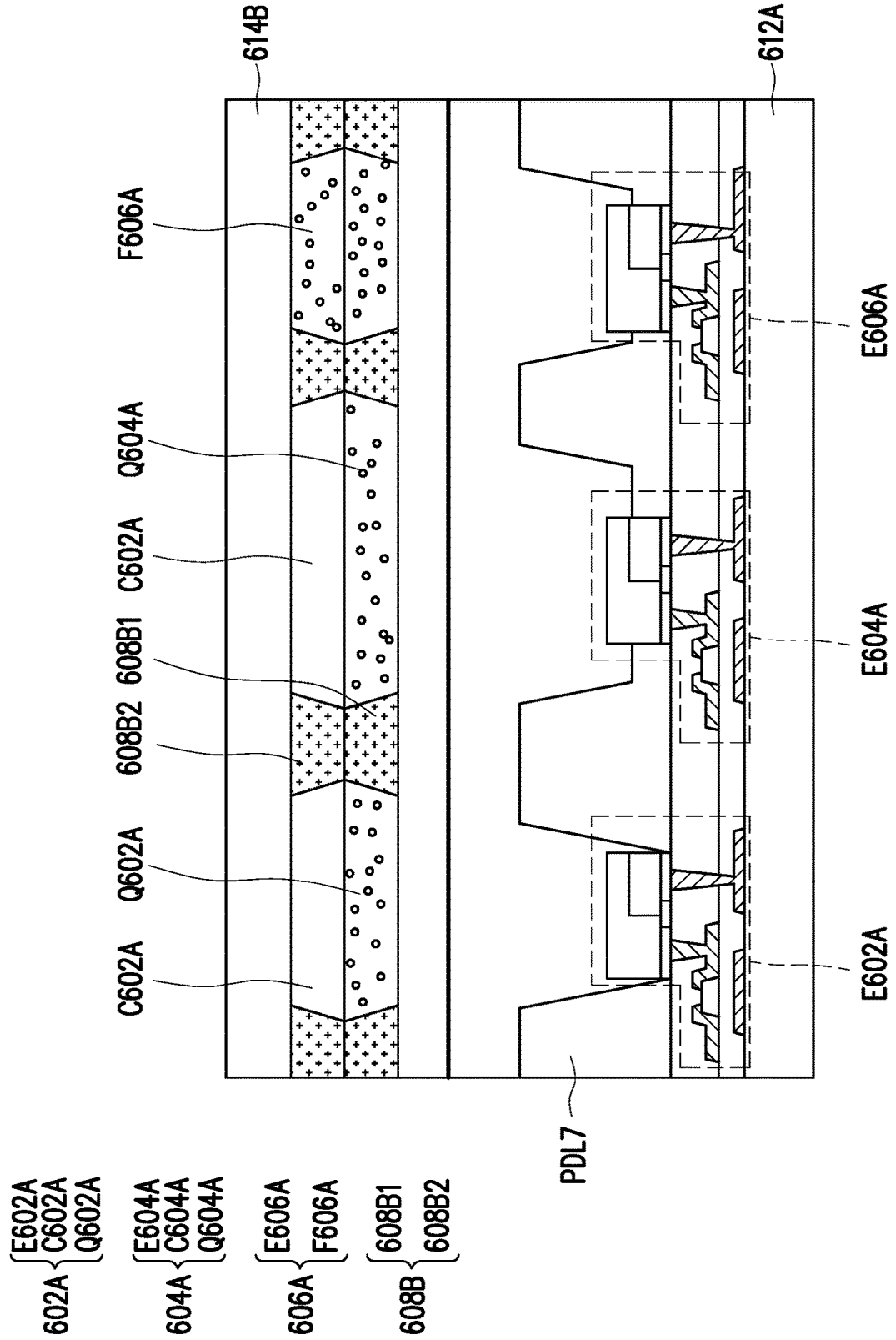

FIG. 6B is a cross-sectional view of a display device according to another embodiment of the disclosure. Because a display device 600B of FIG. 6B is substantially the same as the display device 600A of FIG. 6A, the differences between the two embodiments are mainly described below. In FIG. 6B, a display device 600B includes the substrate 612A and a substrate 614B, and the red pixel unit 602A, the green pixel unit 604A and the blue pixel unit 606A are disposed between the substrate 612A and the substrate 614B. Because the substrate 614B may be used to replace the passivation layer PV9A in FIG. 6A, the display device 600B does not have the passivation layer PV9A. The red pixel unit 602A includes the light emitting element E602A, the light conversion element Q602A and the color filter C602A. The green pixel unit 604A includes the light emitting element E604A, the light conversion element Q604A and the color filter C604A. The blue pixel unit 606A includes the light emitting element E606A and the filling element F606A. In addition, a black matrix 608B of the display device 600B includes a sub matrix 608B1 and a sub matrix 608B2 sequentially stacked on the substrate 612A. Here, the sub matrix 608B1 is configured to separate the light conversion element Q602, the light conversion element Q604A and the filling element F606A. The sub matrix 608B2 is configured to separate the color filter C602A, the color filter C604A and the filling element F606A.

In this embodiment, both the sub matrix 608B1 and the sub matrix 608B2 have a trapezoidal shape. In some embodiments, the sub matrix 608B1 may be fabricated on the substrate 614B first, and then the light conversion element Q602A, the light conversion element Q604A and the first filling layer F606A1 of the filling element F606A may be formed on the substrate 612B. The sub matrix 608B2 may be fabricated on the substrate 614B first, and then the color filter C602A, the color filter C604A and the second filling layer F606A2 of the filling element F606A may be fabricated on the substrate 614B and located in a groove defined by the sub matrix 608B2. Then, the substrate 612A and the substrate 614B are attached together so the sub matrix 608B1 and the sub matrix 608B2 are stacked together to form the black matrix 608B. In some embodiments, a material of the sub matrix 608B2 may comprise a black photoresist. Also, the sub matrix 608B1 and the sub matrix 608B2 may be fabricated by the same material, but not limited thereto. In an alternative embodiment, the material of one or both of the sub matrix 608B1 and the sub matrix 608B2 may comprise a color photoresist material, such as a red photoresist material, a green photoresist material, etc.

Figure 6C:
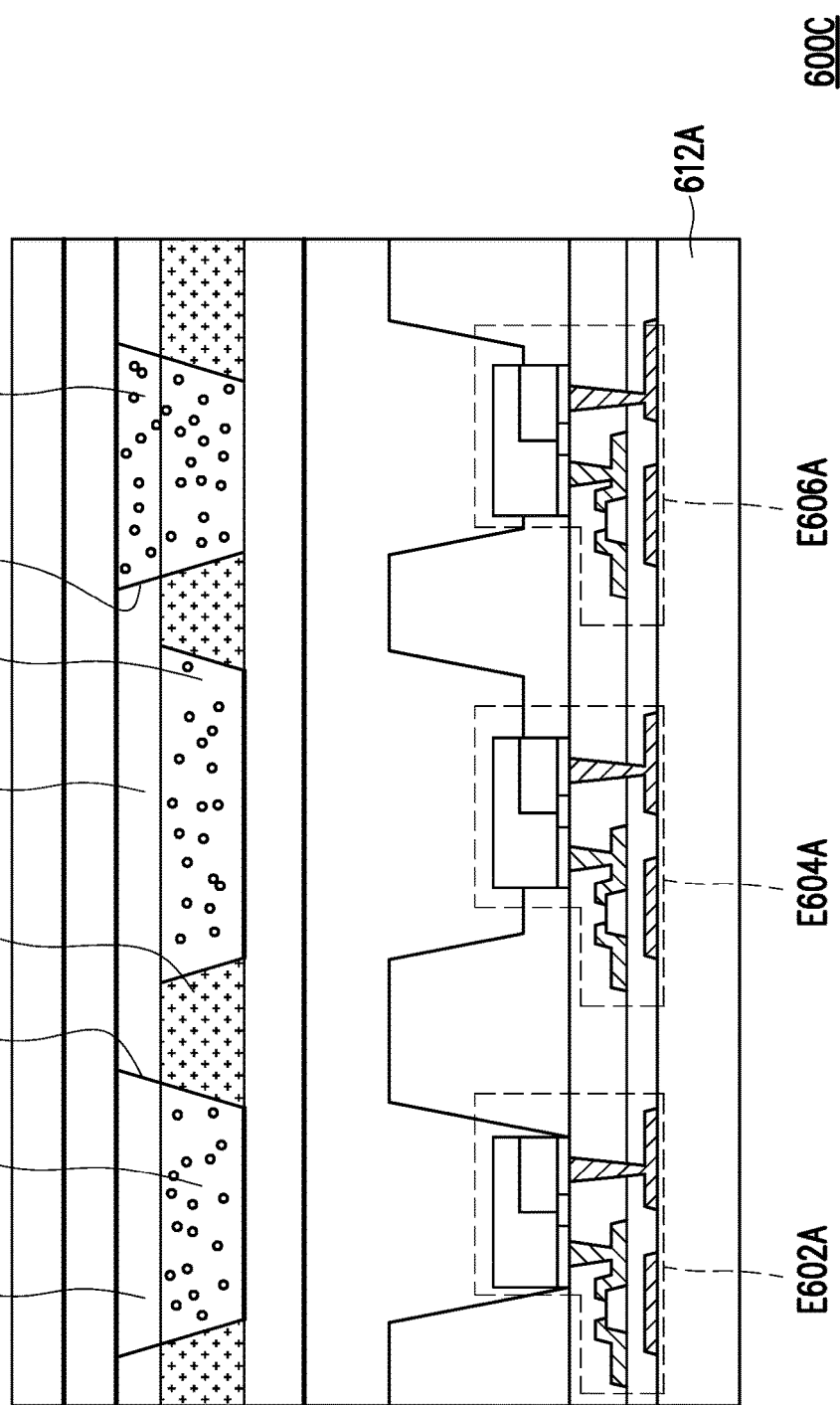

FIG. 6C is a cross-sectional view of a display device according to another embodiment of the disclosure. Because a display device 600C of FIG. 6C is substantially the same as the display device 600A of FIG. 6A, the differences between the two embodiments are mainly described below. The display device 600C of FIG. 6C includes a red pixel unit 602C, a green pixel unit 604C and the blue pixel unit 606A. The red pixel unit 602C includes the light emitting element E602A, the light conversion element Q602A and a color filter C602C. The green pixel unit 604C includes the light emitting element E604A, the light conversion element Q604A and a color filter C604C. The blue pixel unit 606A includes the light emitting element E606A and the filling element F606A. The specific structures and designs of the light conversion element Q602A, the light conversion element Q604A, the light emitting element E602A, the light emitting element E604A, the light emitting element E606A and the filling element F606A are substantially the same as those in the embodiment of FIG. 6A, which will not be repeated hereinafter. In addition, the display device 600C further includes a black matrix 608C, and the structural design of the black matrix 608C is substantially the same as the sub matrix 608A1 of FIG. 6A.

In this embodiment, the light conversion element Q602A, the light conversion element Q604A and the filling element F606A may be spaced apart by the black matrix 608C, and the color filter C602C, and the color filter C604C and the filling element F606A may be disposed adjacent to each other. That is to say, the color filter C602C, the color filter C604C and the filling element F606A are in contact with each other on the sidewalls. In addition, boundaries between the color filter C602C, the color filter C604C and the filling element F606A are located on the black matrix 608C, for example. In some embodiments, the boundaries between the color filter C602C, the color filter C604C and the filling element F606A are oblique boundaries, which are inclined relative to a normal direction of the substrate 612A. In some embodiments, a boundary B1 between the color filter C602C and the color filter C604C inclined closer to a center of the color filter C604C in direction farther away from the substrate 612A, and a boundary B2 between the color filter C604C and the filling element F606A inclined closer to a center of the color filter C604C in direction farther away from the substrate 612A. Accordingly, the green pixel unit 604C and the color filter C604C have a trapezoid shape narrower in direction farther away from the substrate 612A. The color filter C602 of the red pixel unit 602C and the filling element F606A of the blue pixel unit 606A have a trapezoid shape wider in direction farther away from the substrate 612A, but not limited thereto.

In summary, according to the display devices of the embodiments of the disclosure, the sizes of the lighting areas of the pixel units of different colors may be adjusted so that the display light of each color has a required ratio of light radiation. Therefore, the display devices in the embodiments of the disclosure may meet the needs of application products, for example, may display a required display effect. For instance, the red pixel unit may have the lighting area greater than the lighting area of the blue pixel unit and less than the lighting area of the green pixel unit to achieve the required ratio of light radiation. In this way, the white point presented when the display devices are lit may achieve the set goal.

Finally, it should be noted that the foregoing embodiments are merely used for describing the technical solutions of the disclosure, but are not intended to limit the disclosure. Although the disclosure is described in detail with reference to the foregoing embodiments, a person of ordinary skill in the art should understand that, modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

What is claimed is:

1. A display device, comprising:
   a first pixel unit, comprising a light emitting element, a light conversion element and a color filter, wherein the light emitting element emits a light that then passes through the light conversion element and the color filter; and
   a second pixel unit, comprising a light emitting element and a color filter, wherein the light emitting element emits a light that then passes through the color filter;
   wherein the first pixel unit and the second pixel unit have different lighting areas and different colors,
   wherein the color filter of the first pixel unit is partially overlapped with the color filter of the second pixel unit in a normal direction of the display device
   wherein a ratio of the lighting area of the second pixel unit to the lighting area of the first pixel unit is ranged from 1.02 to 2.90.

2. The display device of claim 1, wherein the first pixel unit is a red pixel unit and the second pixel unit is a green pixel unit.

3. The display device of claim 2, wherein the second pixel unit further comprises a light conversion element, and the light emitted from the light emitting element of the second pixel unit passes through the light conversion element of the second pixel unit.

4. The display device of claim 1, wherein the ratio is further from 1.37 to 2.07.

5. The display device of claim 1, wherein the first pixel unit is a red pixel unit and the second pixel unit is a blue pixel unit.

6. The display device of claim 5, wherein the second pixel unit further comprises a light conversion element, and the light emitted from the light emitting element of the second pixel unit passes through the light conversion element of the second pixel unit.

7. The display device of claim 5, wherein a ratio of the lighting area of the first pixel unit to the lighting area of the second pixel unit is ranged from 1.02 to 1.84.

8. The display device of claim 7, wherein the ratio is further ranged from 1.03 to 1.37.

9. The display device of claim 1, wherein the light emitting element of the first pixel unit emits a blue light.

10. The display device of claim 9, wherein the light conversion element of the first pixel unit comprises a matrix material and a light conversion material dispersed in the matrix material.

11. The display device of claim 1, wherein the light conversion material of the first pixel unit comprises a quantum dot material.

12. The display device of claim 1, wherein the light emitting element of the first pixel unit and the light emitting element of the second pixel unit respectively comprises an organic light emitting element or a micro light emitting element.

13. The display device of claim 1, wherein the color filter of the first pixel unit and the color filter of the second pixel unit respectively comprises a photoresist material or an ink material.

14. The display device of claim 1, wherein the second pixel unit is a blue pixel unit and the color filter of the second pixel unit comprises a transparent filling element or a filling element with scattering particles.

* * * * *